(12) United States Patent  
Fischer et al.

(10) Patent No.: US 8,782,577 B2  
(45) Date of Patent: Jul. 15, 2014

(54) METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS

(75) Inventors: Ed Fischer, Salem, OR (US); David White, San Jose, CA (US); Michael McSherry, Portland, OR (US); Bruce Yanagida, Snohomish, WA (US); Vance Kenzle, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 12/982,822

(22) Filed: Dec. 30, 2010

(65) Prior Publication Data

US 2012/0023471 A1    Jan. 26, 2012

Related U.S. Application Data

(63) Continuation-in-part of application No. 12/982,628, filed on Dec. 30, 2010.

(60) Provisional application No. 61/367,398, filed on Jul. 24, 2010, provisional application No. 61/367,412, filed on Jul. 24, 2010, provisional application No. 61/367,404, filed on Jul. 24, 2010, provisional application No. 61/367,406, filed on Jul. 24, 2010, provisional application No. 61/367,407, filed on Jul. 24, 2010, provisional application No. 61/367,410, filed on Jul. 24, 2010.

(51) Int. Cl.
G06F 17/50        (2006.01)

(52) U.S. Cl.
USPC ........... 716/100; 716/110; 716/111; 716/112; 716/136; 716/139

(58) Field of Classification Search
USPC ......................... 716/100, 110–112, 136, 139
See application file for complete search history.

(56) References Cited

U.S. PATENT DOCUMENTS 4,817,012 A * 3/1989 Cali' ............................. 716/115
5,469,366 A 11/1995 Yang et al.
(Continued)

OTHER PUBLICATIONS

Non-Final Office Action dated Sep. 21, 2012 for U.S. Appl. No. 12/982,721.

(Continued)

Primary Examiner — Stacy Whitmore
(74) Attorney, Agent, or Firm — Vista IP Law Group, LLP

(57) ABSTRACT

Disclosed are a method, system, and computer program product for providing customizable information in designing electronic circuits with electrical awareness. The method or the system displays a portion of a physical design of an electronic circuit in a first display area. The method or the system receives or identifies a user's or a system's manipulation of the portion of the physical design of the electronic circuit. The method or the system then determines and displays an in situ response to the manipulation in the first display area. The method or the system may further display, in the first display area or in another display area, result(s) relating to the physical data of a component, electrical parasitic(s) associated with the physical data, electrical characteristic(s) associated with the physical data or the electrical characteristic(s), or other element(s) of the physical design that is impacted by the manipulation.

43 Claims, 61 Drawing Sheets

(56) References Cited

U.S. PATENT DOCUMENTS

| | | | |
|---|---|---|---|
| 5,553,002 A | 9/1996 | Dangelo et al. | |
| 5,629,857 A * | 5/1997 | Brennan | 716/139 |
| 5,801,958 A | 9/1998 | Dangelo et al. | |
| 5,872,952 A | 2/1999 | Tuan et al. | |
| 5,999,726 A * | 12/1999 | Ho | 716/112 |
| 6,072,945 A | 6/2000 | Aji et al. | |
| 6,131,182 A | 10/2000 | Beakes et al. | |
| 6,378,110 B1 * | 4/2002 | Ho | 716/112 |
| 6,438,729 B1 | 8/2002 | Ho | |
| 6,449,578 B1 | 9/2002 | McBride | |
| 6,470,482 B1 | 10/2002 | Rostoker et al. | |
| 6,507,932 B1 | 1/2003 | Landry et al. | |
| 6,523,150 B1 | 2/2003 | Buffet et al. | |
| 6,539,533 B1 * | 3/2003 | Brown et al. | 716/112 |
| 6,553,554 B1 * | 4/2003 | Dahl et al. | 716/119 |
| 6,584,606 B1 | 6/2003 | Chiu et al. | |
| 6,643,836 B2 * | 11/2003 | Wheeler et al. | 716/102 |
| 6,665,845 B1 | 12/2003 | Aingaran et al. | |
| 6,701,508 B1 * | 3/2004 | Bartz et al. | 716/139 |
| 6,842,714 B1 | 1/2005 | Acar et al. | |
| 6,877,418 B2 | 4/2005 | Hassibi et al. | |
| 6,910,200 B1 * | 6/2005 | Aubel et al. | 716/102 |
| 6,954,915 B2 | 10/2005 | Batchelor | |
| 6,971,074 B2 * | 11/2005 | Hasegawa et al. | 716/120 |
| 6,981,238 B1 | 12/2005 | Churchill | |
| 7,016,794 B2 | 3/2006 | Schultz | |
| 7,020,853 B2 * | 3/2006 | Skoll et al. | 716/111 |
| 7,069,526 B2 * | 6/2006 | Schubert et al. | 716/102 |
| 7,076,410 B1 * | 7/2006 | Kerzman et al. | 703/6 |
| 7,089,129 B2 * | 8/2006 | Habitz | 702/65 |
| 7,152,215 B2 * | 12/2006 | Smith et al. | 716/52 |
| 7,159,202 B2 | 1/2007 | Lee et al. | |
| 7,178,118 B2 | 2/2007 | Ramachandran et al. | |
| 7,181,383 B1 | 2/2007 | McGaughy et al. | |
| 7,206,731 B2 | 4/2007 | Sercu et al. | |
| 7,228,514 B2 | 6/2007 | Chan et al. | |
| 7,243,317 B2 | 7/2007 | Wang et al. | |
| 7,251,800 B2 | 7/2007 | McElvain et al. | |
| 7,278,120 B2 | 10/2007 | Rahmat et al. | |
| 7,331,029 B2 | 2/2008 | Amit et al. | |
| 7,347,621 B2 * | 3/2008 | Sri-Jayantha et al. | 374/166 |
| 7,356,784 B1 | 4/2008 | Dengi et al. | |
| 7,383,521 B2 | 6/2008 | Smith et al. | |
| 7,395,519 B2 * | 7/2008 | Kawata | 716/112 |
| 7,559,045 B2 * | 7/2009 | Chen et al. | 716/106 |
| 7,567,894 B2 * | 7/2009 | Durand et al. | 703/28 |
| 7,574,682 B2 * | 8/2009 | Riviere-Cazaux | 716/136 |
| 7,596,771 B2 | 9/2009 | Cohen et al. | |
| 7,640,527 B1 | 12/2009 | Doraira et al. | |
| 7,797,646 B2 * | 9/2010 | Chung et al. | 716/113 |
| 7,802,222 B2 * | 9/2010 | Arsintescu | 716/122 |
| 7,805,698 B1 * | 9/2010 | Ferguson et al. | 716/103 |
| 7,810,063 B1 * | 10/2010 | Sharma et al. | 716/139 |
| 7,818,697 B2 * | 10/2010 | Cho | 716/136 |
| 7,904,852 B1 * | 3/2011 | Cadouri et al. | 716/100 |
| 7,941,768 B1 * | 5/2011 | Wei | 716/54 |
| 7,966,588 B1 | 6/2011 | Perry et al. | |
| 8,141,013 B2 | 3/2012 | Woods et al. | |
| 8,150,638 B1 | 4/2012 | Wu et al. | |
| 8,185,856 B2 | 5/2012 | Izuha | |
| 8,224,636 B2 * | 7/2012 | Kundert | 703/14 |
| 8,261,228 B1 | 9/2012 | Gopalakrishnan et al. | |
| 2002/0166102 A1 * | 11/2002 | Du et al. | 716/11 |
| 2003/0131323 A1 * | 7/2003 | McConaghy | 716/2 |
| 2004/0049747 A1 | 3/2004 | Yamasaki et al. | |
| 2004/0078767 A1 | 4/2004 | Burks et al. | |
| 2004/0117748 A1 * | 6/2004 | Tester | 716/11 |
| 2004/0117750 A1 * | 6/2004 | Skoll et al. | 716/11 |
| 2004/0128368 A1 | 7/2004 | Sakai | |
| 2004/0128638 A1 * | 7/2004 | Kerzman et al. | 716/11 |
| 2004/0143809 A1 | 7/2004 | Cowan et al. | |
| 2004/0243949 A1 | 12/2004 | Wang et al. | |
| 2005/0010922 A1 | 1/2005 | Czajkowski et al. | |
| 2005/0114818 A1 * | 5/2005 | Khakzadi et al. | 716/11 |
| 2005/0216873 A1 | 9/2005 | Singh et al. | |
| 2005/0268258 A1 * | 12/2005 | Decker | 716/4 |
| 2005/0268269 A1 * | 12/2005 | Coiley | 716/11 |
| 2005/0273732 A1 | 12/2005 | Xu et al. | |
| 2005/0278665 A1 | 12/2005 | Gentry et al. | |
| 2006/0095884 A1 * | 5/2006 | Skoll et al. | 716/11 |
| 2006/0095889 A1 | 5/2006 | Cote et al. | |
| 2006/0101368 A1 * | 5/2006 | Kesarwani et al. | 716/11 |
| 2006/0123364 A1 * | 6/2006 | Cook et al. | 716/4 |
| 2007/0094622 A1 | 4/2007 | Lee et al. | |
| 2007/0106969 A1 | 5/2007 | Birch et al. | |
| 2007/0118827 A1 * | 5/2007 | Rahman | 716/11 |
| 2007/0234266 A1 | 10/2007 | Chen et al. | |
| 2007/0245274 A1 | 10/2007 | Kimura | |
| 2007/0299647 A1 | 12/2007 | Bolcato et al. | |
| 2008/0022251 A1 * | 1/2008 | McConaghy et al. | 716/11 |
| 2008/0133201 A1 | 6/2008 | Guedon | |
| 2008/0148195 A1 | 6/2008 | Chan et al. | |
| 2008/0209365 A1 * | 8/2008 | Riviere-Cazaux | 716/4 |
| 2008/0244497 A1 * | 10/2008 | Zhao et al. | 716/14 |
| 2008/0244498 A1 * | 10/2008 | Gupta et al. | 716/15 |
| 2009/0019411 A1 | 1/2009 | Chandra et al. | |
| 2009/0031261 A1 * | 1/2009 | Smith et al. | 716/2 |
| 2009/0089733 A1 * | 4/2009 | Chang et al. | 716/11 |
| 2009/0144042 A1 | 6/2009 | Lorenz et al. | |
| 2009/0150842 A1 | 6/2009 | Kemerer et al. | |
| 2009/0254874 A1 | 10/2009 | Bose | |
| 2009/0265672 A1 | 10/2009 | St. John et al. | |
| 2010/0083200 A1 | 4/2010 | Song et al. | |
| 2010/0217577 A1 | 8/2010 | Korobkov et al. | |
| 2011/0107293 A1 | 5/2011 | Ganzhorn et al. | |
| 2011/0197170 A1 | 8/2011 | Chandramohan et al. | |
| 2011/0314437 A1 * | 12/2011 | McLirath | 716/139 |
| 2012/0022846 A1 | 1/2012 | White et al. | |
| 2012/0023465 A1 | 1/2012 | Gopalakrishnan et al. | |
| 2012/0023467 A1 | 1/2012 | McSherry et al. | |
| 2012/0117530 A1 | 5/2012 | Green | |

OTHER PUBLICATIONS

Non-Final Office Action dated Sep. 14, 2012 for U.S. Appl. No. 13/189,274.
Notice of Allowance dated Jan. 7, 2013 for U.S. Appl. No. 13/189,274.
Non-Final Office Action dated Jan. 18, 2013 for U.S. Appl. No. 12/982,790.
Non-Final Office Action dated Jun. 12, 2012 for U.S. Appl. No. 12/982,628.
Notice of Allowance dated Nov. 14, 2012 for U.S. Appl. No. 12/982,628.
Non-Final Office Action dated Oct. 3, 2012 for U.S. Appl. No. 12/982,732.
T. Quarles, "SPICE3 Version 3f3 User's Manual", May 1993.
Non-Final Office Action dated Jun. 24, 2013 for U.S. Appl. No. 12/982,762.
Non-Final Office Action dated Aug. 6, 2013 for U.S. Appl. No. 12/982,732.
Non-Final Office Action dated Aug. 20, 2013 for U.S. Appl. No. 13/189,274.
Final Office Action dated Apr. 4, 2013 for U.S. Appl. No. 12/982,721.
Final Office Action dated May 2, 2013 for U.S. Appl. No. 12/982,790.
Final Office Action dated Feb. 19, 2013 for U.S. Appl. No. 12/982,732.
Notice of Allowance dated Oct. 30, 2013 for U.S. Appl. No. 12/982,721.
Final Office Action dated Dec. 17, 2013 for U.S. Appl. No. 12/982,762.
Notice of Allowance dated Dec. 4, 2013 for U.S. Appl. No. 13/189,274.
Notice of Allowance dated Nov. 12, 2013 for U.S. Appl. No. 12/982,790.
Notice of Allowance dated Dec. 9, 2013 for U.S. Appl. No. 12/982,732.
International Search Report and Written Opinion dated Sep. 16, 2011 for PCT App. No. PCT/US11/45119.
International Search Report and Written Opinion dated Sep. 16, 2011 for PCT App. No. PCT/US11/45110.

(56) References Cited

OTHER PUBLICATIONS

International Search Report and Written Opinion dated Sep. 22, 2011 for PCT App. No. PCT/US11/45126.
International Search Report and Written Opinion dated Sep. 22, 2011 for PCT App. No. PCT/US11/45123.
International Search Report and Written Opinion dated Dec. 9, 2011 for PCT App. No. PCT/US11/45104.
International Search Report and Written Opinion dated Dec. 7, 2011 for PCT App. No. PCT/US11/45091.

* cited by examiner

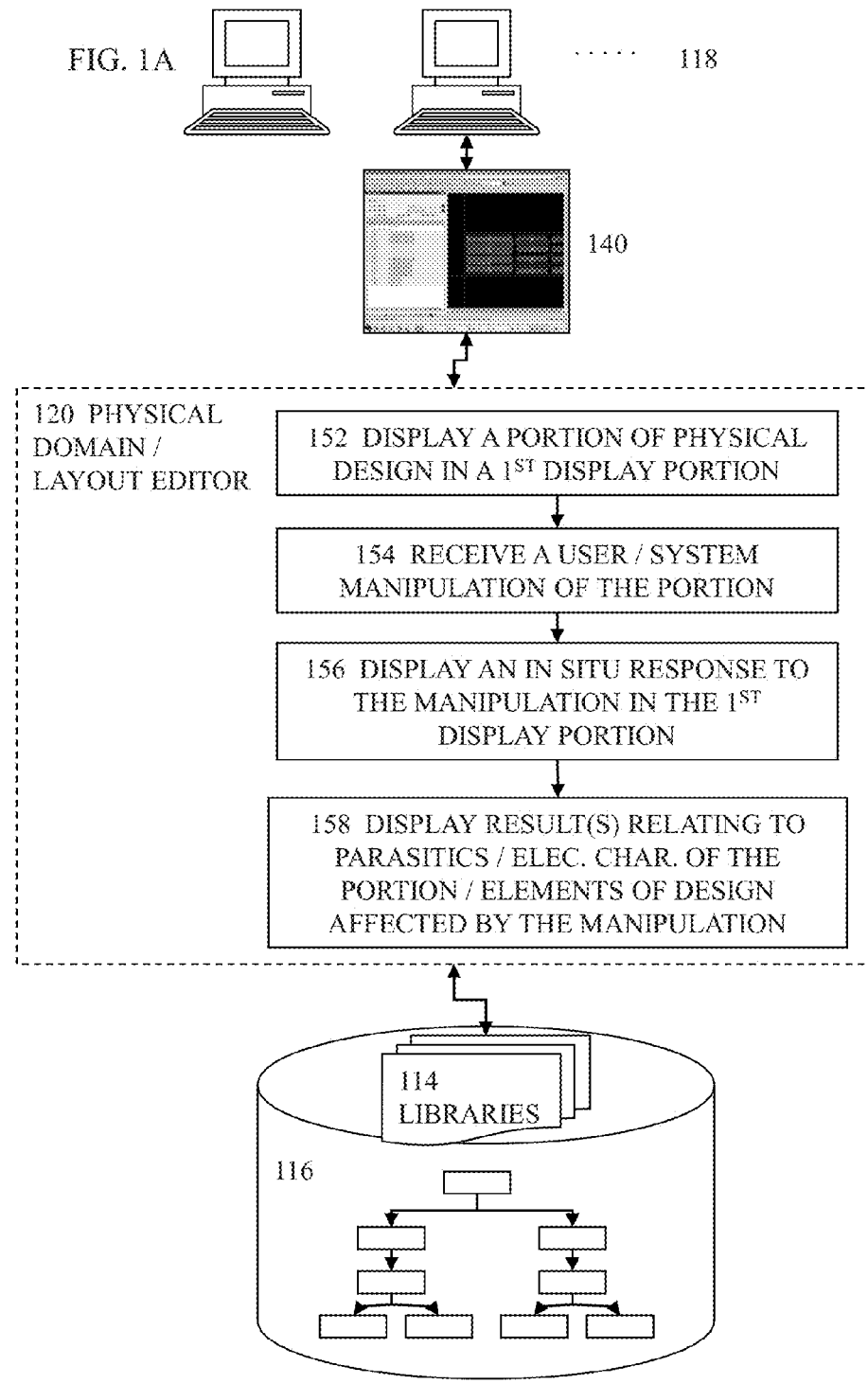

| 406C INTERACTIVE MULTI-TAB NAVIGATION PANE(S) | | | |
|---|---|---|---|
| 402D PARASITICS | 404D COMPARE | 406D EM | 408D NEW EM |

| 422D DATASET(S) SELECTION |
|---|

| 410D USER-DEFINABLE ELEC. CHAR(S) / ATTRIBUTE(S); |
|---|
| 410D2 RESISTANCE(S); |
| 410D4 AVG. AC CURRENT(S); |
| 410D6 AVG. DC CURRENT(S); |
| 410D8 LAYER INFORMATION; |
| 410D10 GEOM. CHARACTERISTIC(S); |
| 410D12 CUT(S); |
| 410D14 CUT AREA(S); |
| 410D16 CAPACITANCE(S): BY NET; BY LAYER, ETC. |
| ETC. |

| 412D SORTING & SORT CRITERIA; |
|---|
| 414D INTERACTIONS WITH USER INPUT & MANIPULATIONS; |
| 416D INTERACTIONS WITH BROWSER; |
| 418D USER-DEFINABLE DISPLAY PREFERENCE |
| 420D USER-DEFINABLE SYNCHRONIZATION WITH THE GUI |
| ETC. |

FIG. 4D

| 402F GUI MENU ITEMS |
|---|

| 404F EAD DESIGN BROWSER<br>- PHYSICAL DESIGN DISPLAY PORTION CONTENT CONTROL<br>- DESIGN EDITING FUNCTIONS<br>- COLLAPSIBLE PHYSICAL ELEMENT TREES NAVIGATOR<br>- PARASITIC(S), ELEC. CHAR., & OTHER DATA ASSOCIATED WITH PHYSICAL ELEMENT(S) / TREE(S)<br>- CONSTRAINT(S) & COMPLIANCE CHECK RESULT(S) WITH LEGENDS & DESCRIPTION<br>- LEGEND CONTROL | 406F PHYSICAL DESIGN DISPLAY PORTION<br>- IN-SITU RESPONSE(S) TO USER / SYSTEM MANIPULATION(S)<br>- RESULT(S) RELATING TO PARASITIC(S) OR ELEC. CHARACTERISTIC(S) IN RESPONSE TO USER / SYSTEM MANIPULATION(S) OF A PORTION OF THE PHYSICAL DESIGN OR OTHER ELEMENT(S) IMPACTED BY MANIPULATION(S) |
|---|---|

| 408F UI FOR HINT(S) / SUGGESTION(S) FOR CONSTRAINT(S) & COMPLIANCE CHECK RESULT(S) OR UI FOR ASSISTED FIX(ES) / WHAT-IF ANALYSES |
|---|

FIG. 4F

METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS

CROSS-REFERENCE TO RELATED APPLICATION(S)

The instant Application constitutes a continuation-in-part of U.S. patent application Ser. No. 12/982,628, entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS" and concurrently filed on Dec. 30, 2010. The contents of the aforementioned Application are hereby expressly incorporated by reference in their entireties. The U.S. patent application Ser. No. 12/982,628 claims the benefit of U.S. Provisional App. Ser. No. 61/367,398, filed on Jul. 24, 2010 and entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS", U.S. Provisional App. Ser. No. 61/367,412, filed on Jul. 24, 2010 and entitled "METHODS, SYSTEMS, AND ARTICLES OF MANUFACTURE FOR IMPLEMENTING ELECTRONIC CIRCUIT DESIGNS WITH ELECTRICAL AWARENESS", U.S. Provisional App. Ser. No. 61/367,404, filed on Jul. 24, 2010 and entitled "METHODS, SYSTEMS, AND ARTICLES OF MANUFACTURES FOR IMPLEMENTING ELECTRONIC CIRCUIT DESIGNS WITH ELECTRO-MIGRATION AWARENESS", U.S. Provisional App. Ser. No. 61/367,406, filed on Jul. 24, 2010 and entitled "METHODS, SYSTEMS, AND ARTICLES OF MANUFACTURES FOR IMPLEMENTING ELECTRONIC CIRCUIT DESIGNS WITH IR-DROP AWARENESS", U.S. Provisional App. Ser. No. 61/367,407, filed on Jul. 24, 2010 and entitled "METHODS, SYSTEMS, AND ARTICLES OF MANUFACTURES FOR IMPLEMENTING ELECTRONIC CIRCUIT DESIGNS WITH SIMULATION AWARENESS", and U.S. Provisional App. Ser. No. 61/367,410, filed on Jul. 24, 2010 and entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS".

This Application is related to U.S. patent application Ser. No. 12/982,721, entitled "METHODS, SYSTEMS, AND ARTICLES OF MANUFACTURE FOR IMPLEMENTING ELECTRONIC CIRCUIT DESIGNS WITH ELECTRICAL AWARENESS", U.S. patent application Ser. No. 12/982,762, entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS", U.S. patent application Ser. No. 12/982,790, entitled "METHODS, SYSTEMS, AND ARTICLES OF MANUFACTURE FOR IMPLEMENTING ELECTRONIC CIRCUIT DESIGNS WITH SIMULATION AWARENESS", U.S. patent application Ser. No. 12/982,628, entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS", and U.S. patent application Ser. No. 12/982,732, entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS". The entire disclosures of the above applications are hereby expressly incorporated by reference in their entireties in the instant Application.

BACKGROUND

Conventional electronic circuit design tool set generally comprises some schematic level tools, such as the schematic editor, one or more simulators, etc., and some physical level tools, such as the layout editor, the physical verification tool(s), one or more physical level simulators, etc. These tools may have their own user interfaces such as graphical user interfaces (GUI). A designer often needs to go back and forth among a few user interfaces to obtain the desired or necessary information or data while implementing an electronic circuit design. For example, a designer may need to use a physical verification tool to perform some verifications of an electronic circuit layout and then return to a layout tool to observe or manipulate the layout in order to see if the layout passes the verification.

Thus, there exists a need for providing in situ, customizable information in designing electronic circuits with electrical awareness.

SUMMARY

Disclosed comprises a method, a system, and a computer program product for providing customizable information in designing electronic circuits with electrical awareness. In a single embodiment or in some embodiments, the method or the system for providing customizable information in designing electronic circuits with electrical awareness comprises the process or module for displaying a portion of a physical design in a first display portion of a user interface. The method or the system may further comprise the process or module for receiving a manipulation of the portion of the physical design, wherein the manipulation may be effected by a user/designer or from any tools in the electronic circuit design tool set.

In a single embodiment or in some embodiments, the method or the system may further comprise the process or module for displaying a response generated by a tool in the electronic circuit design tool set in response to the manipulation in the first display portion of the user interface. The method or the system may also comprise the process or module for displaying, in either the first display portion of the user interface or another portion of the user interface, one or more results relating to parasitic(s), electrical characteristic(s), or physical data of the portion of the electronic circuit design or any other elements of the electronic circuit design that are affected by the manipulation in a single embodiment or in some embodiments. In some embodiments, the user interface comprises a graphical user interface of a physical domain electronic circuit design tool.

BRIEF DESCRIPTION OF THE DRAWINGS

The drawings illustrate the design and utility of various embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 1A-C illustrate top level system diagrams for implementing various embodiments of the methods or systems for providing customizable information in designing electronic circuits with electrical awareness.

FIGS. 4A-F illustrate more details about a user interface in one or more embodiments.

FIGS. 35A-C illustrates the automatic interaction among various parts of a user interface in some embodiments.

FIGS. 36A-C illustrate the automatic interaction among various parts of a user interface in some embodiments.

DETAIL DESCRIPTION

Figure 1B:
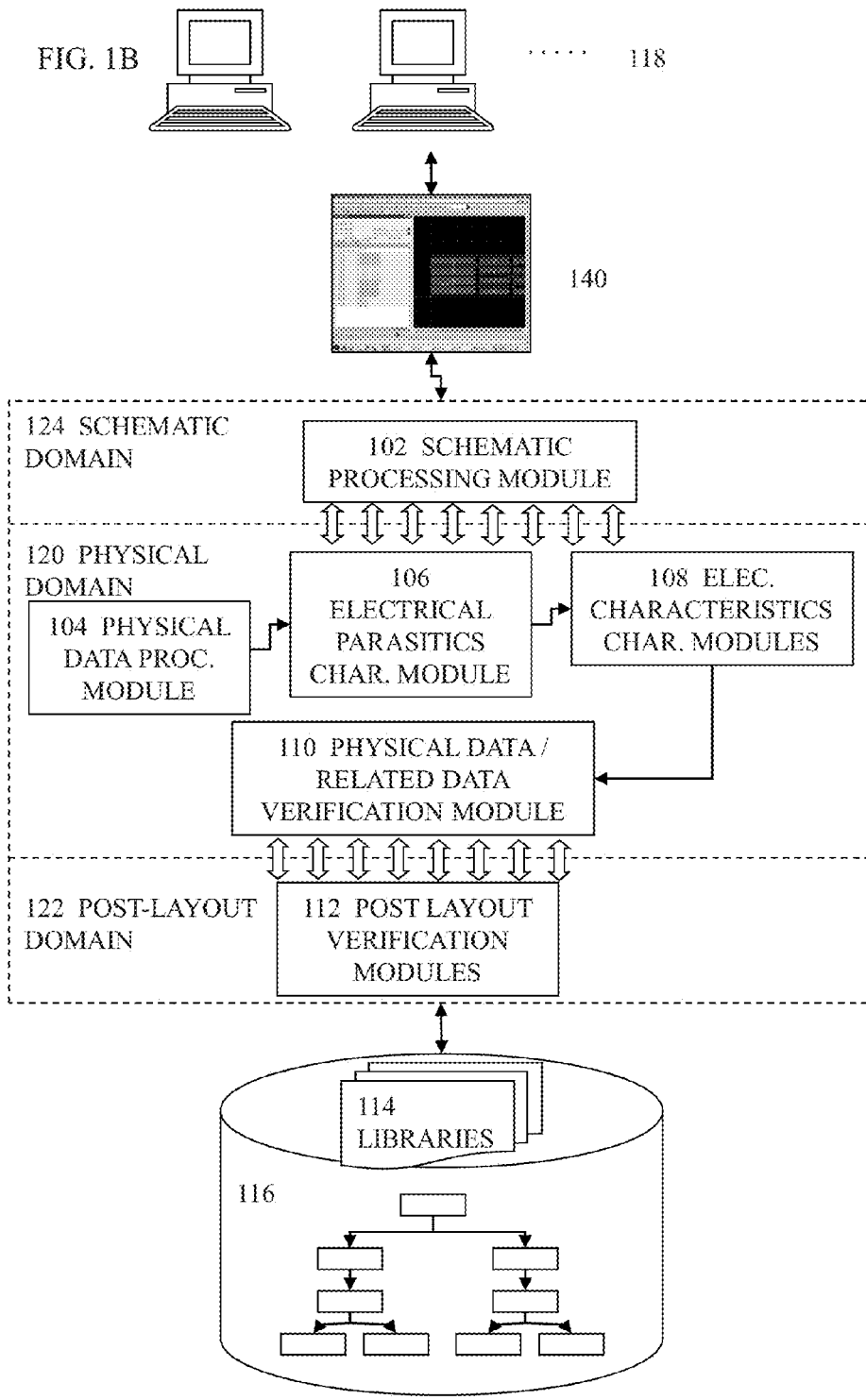

Various embodiments of the invention are directed to a methods, systems, and articles of manufacture for providing in situ, customizable information in designing electronic circuits with electrical awareness in a single embodiment or in some embodiments. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of various embodiments of the invention. Where certain elements of some embodiments of the invention may be partially or fully implemented using known components (or methods or processes), only those portions of such known components (or methods or processes) that are necessary or desired for an understanding of the present invention will be described, and the detailed descriptions of other portions of such known components (or methods or processes) will be omitted so as not to obscure the invention. Further, various embodiments of the invention encompasses present and future known equivalents to the components referred to herein by way of illustration.

Referring to FIG. 1A which illustrates a top level system diagram for implementing various embodiments of the methods or systems for providing customizable information in designing electronic circuits with electrical awareness, the system comprises one or more user terminals or computing nodes 118 which interfaces with one or more physical domain electronic circuit design tools 120 via at least one user interface 140. The one or more physical domain electronic circuit design tools 120 further interact with a storage system, device, or medium 116 that stores various information or data such as flat or hierarchical electronic circuit designs at various abstraction levels, libraries 114, various analysis results or data, etc.

In a single embodiment or in some embodiments, the one or more physical domain tools comprises a module for displaying a portion of a physical design in a first display portion 152. The one or more physical domain tools may further comprise a module 154 for receiving a manipulation on the portion of the electronic circuit design in some embodiments and a module 156 for displaying a response of at least one of the tools in an electronic circuit design tool set, which comprises the one or more physical domain tools, in response to the manipulation. In some embodiments, the manipulation comprises a manipulation from a user/designer or from one or more tools in the electronic circuit design tool set on the portion of the electronic circuit. In some embodiments, the electronic circuit design tool set comprises one or more schematic level tools such as a schematic editor or one or more schematic level simulators.

It shall be noted that the modules any of the modules 152, 154, 156, and 158 may be implemented in hardware circuitry, software, or a combination thereof. In some embodiments where one of the modules is implemented as software, the software is to interact with some or all of the components in a computing system as illustrated in FIG. 4 to perform its intended functions.

Referring to FIG. 1B which illustrate a top level system diagram for implementing various embodiments of the methods or systems for providing customizable information in designing electronic circuits with electrical awareness, the system comprises one or more user terminals or computing nodes 118 which interfaces with one or more schematic processing module 102 in the schematic domain 124 and one or more physical domain electronic circuit design tools in the physical domain 120 via at least one user interface 140. In some embodiments, the schematic processing module may comprise, for example, a schematic editor or a schematic simulator. In one or more embodiments, The one or more physical domain electronic circuit design tools 120 further interact with a storage system, device, or medium 116 that stores various information or data such as flat or hierarchical electronic circuit designs at various abstraction levels, libraries 114, various analysis results or data, etc.

In some embodiments, the one or more physical domain electronic circuit design tools 120 may further interact with a post layout verification modules 112 which comprises, for example, a design rule checking (DRC) tool, a physical verification tool, etc. in a post-layout domain 122 in which these post-layout domain tools perform their intended functions with a complete layout of an electronic circuit.

Figure 1C:
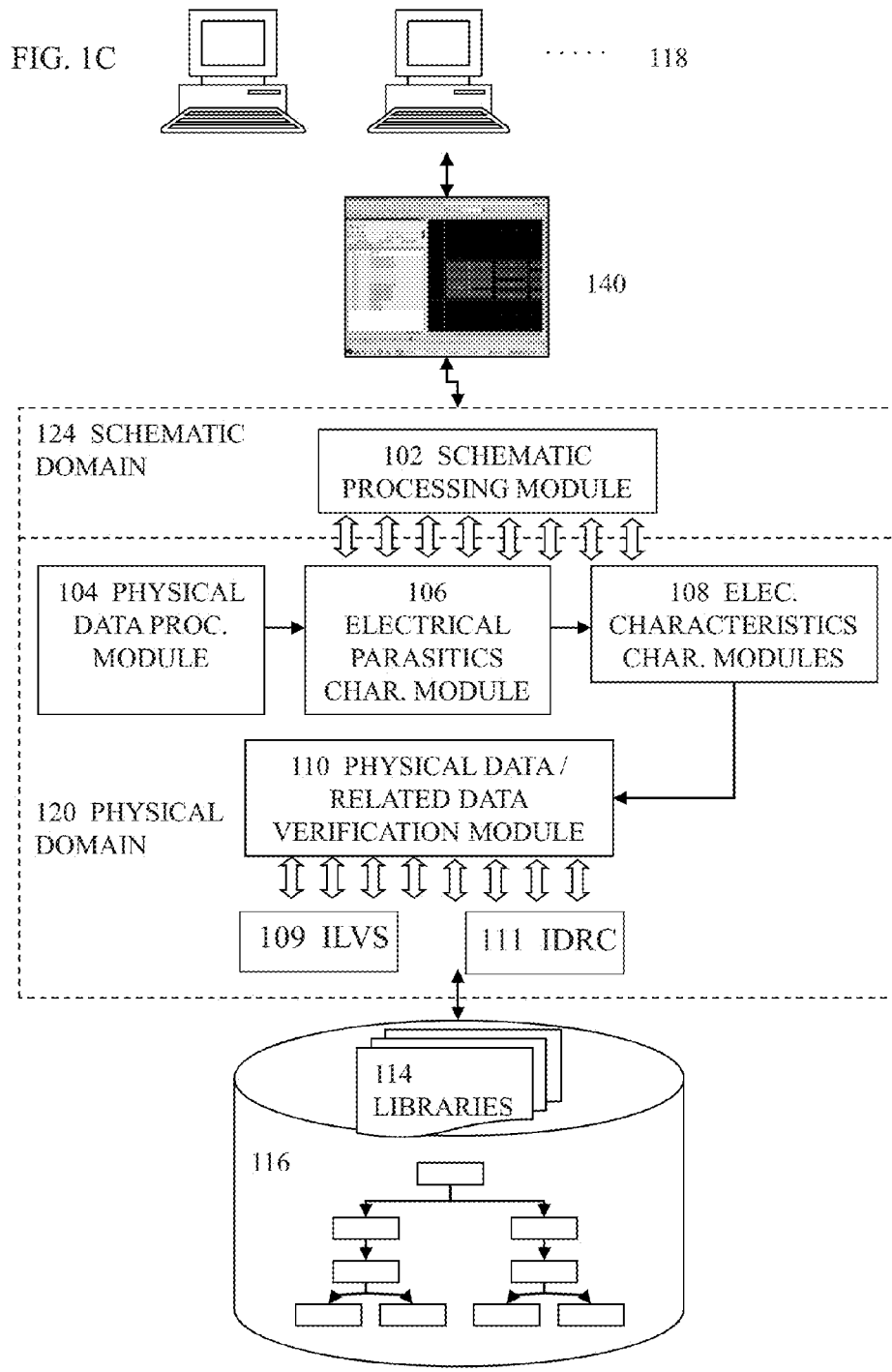

In some embodiments shown in FIG. 1C, the functions provided by the post layout verification modules are built directly into the interactive infrastructure. In this mode, the binder that synchronizes the schematic and layout in as each physical design object is added is incrementally performing LVS 109 (Layout Versus Schematic) such that the post verification LVS is not required. Similarly, in this mode design rule checking (DRC) can be done incrementally 111 (IDRC) as physical design objects are created. In this embodiment, the completed layout meets design and manufacturability rules required for verification.

The one or more physical domain electronic circuit design tools 120 may comprise, for example, a physical data processing module 104 that is configured with hardware circuitry, software, or a combination thereof or is programmed for performing identifying, determining, or updating physical data of a net, a device, or a component of a complete or incomplete physical design of the electronic circuit.

The one or more physical domain electronic circuit design tools 120 may also comprise an electrical parasitics characterization module 106 that is configured with hardware circuitry, software, or a combination thereof or is programmed for performing characterizing one or more electrical parasitics or one or more device parameters that are associated with the physical data.

In some embodiments, the characterization of electrical parasitics associated with physical data may be done with a two stage approach. This process begins with the selection of a particular net or a partial net. In the first stage, the process identifies where along that net that a geometric description should be created. The geometric descriptions may include wire widths and spacings, conductor and ILD (inter layer dielectrics) thicknesses, or thickness of barrier materials. A common description may be created and provided via an API (application programming interface.)

The second stage may include one or more components that may translate, transform, convert, or map (hereinafter "map") the geometric description to an equivalent parasitic value such as a resistance, capacitance or inductance. This translation, transformation, conversion, or mapping (hereinafter "mapping") may be done with mathematical algorithms or models that are often referred to as parasitic extraction. The models may be created through the use of semi-empirical methods that combine models or knowledge of the underlying physics with data provided by various solver(s), simulator(s), or a combination thereof. In some cases, the mapping for capacitance may also be done with a solver.

In some embodiments, the second stage may use parasitic extraction for some nets and a field solver for other nets. In some embodiments, the second stage may use a combination of parasitic extraction for, for example, resistance(s) and a field solver for, for example, capacitance(s) on the same net. In some embodiments, the characterization of electrical parasitics may be performed with extraction tools that map geometric dimensions and patterns to corresponding parasitics such as R, L, and C. In some embodiments, the characterization of electrical parasitics includes the use of field solvers (such as but not limited to one or more EM or electro-migration field solvers) that map geometric dimensions and patterns to capacitance(s).

The one or more physical domain electronic circuit design tools 120 may also comprise an electrical characteristics characterization module 108 that is configured with hardware circuitry, software, or a combination thereof or is programmed for performing characterizing one or more electrical characteristics that are associated with the one or more electrical parasitics and the physical data.

The one or more physical domain electronic circuit design tools 120 may also comprise a physical data or related data verification module 110 that is configured with hardware circuitry, software, or a combination thereof or is programmed for performing various verification on the one or more parasitics, the one or more electrical characteristics, or the physical data. More details about the module 104, 106, 108, and 110 are described in related U.S. patent application Ser. No. 12/982,721, entitled "METHODS, SYSTEMS, AND ARTICLES OF MANUFACTURE FOR IMPLEMENTING ELECTRONIC CIRCUIT DESIGNS WITH ELECTRICAL AWARENESS", U.S. patent application Ser. No. 12/982,790, entitled "METHODS, SYSTEMS, AND ARTICLES OF MANUFACTURE FOR IMPLEMENTING ELECTRONIC CIRCUIT DESIGNS WITH SIMULATION AWARENESS", U.S. patent application Ser. No. 12/982,762, entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS", and U.S. patent application Ser. No. 12/982,732, entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS", the contents of all the aforementioned applications are hereby incorporated by reference in their entirety.

It shall be noted that the modules any of the modules 102, 104, 106, 108, 110, and 112, may be implemented in hardware circuitry, software, or a combination thereof. In some embodiments where one of the modules is implemented as software, the software is to interact with some or all of the components in a computing system as illustrated in FIG. 4 to perform its intended functions.

Figure 2A:
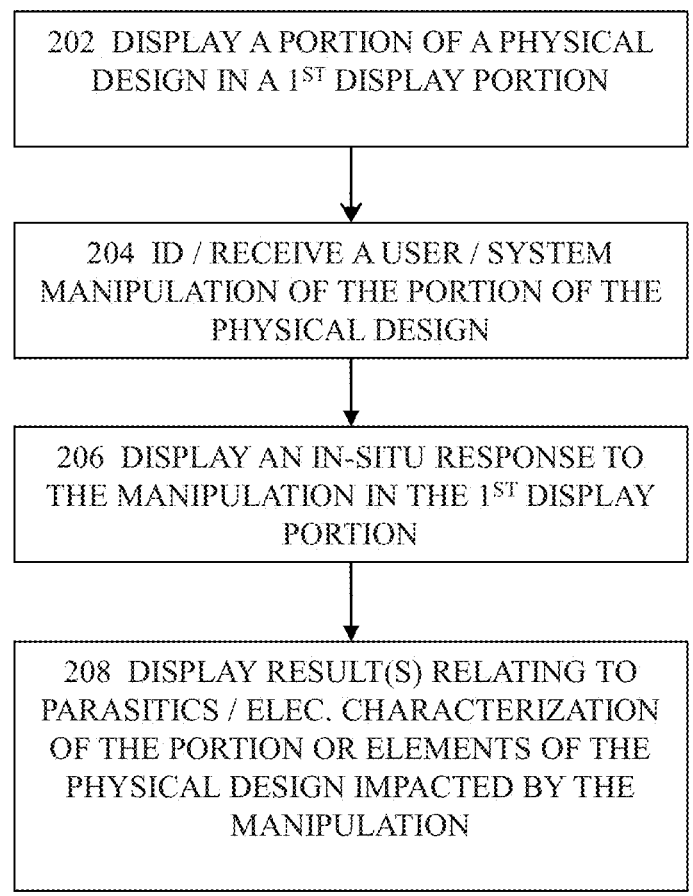
FIGS. 2A-B illustrates some top level diagrams for the method or system for providing customizable information in designing electronic circuits with electrical awareness.

Referring to FIG. 2A which illustrates a top level diagram for the method or system for providing customizable information in designing electronic circuits with electrical awareness in one or more embodiments, the method or the system may comprise a process or a module 202 for displaying a portion of a physical design in a first display portion of a user interface in a single embodiment or in some embodiments. In some embodiments, the user interface comprises a graphical user interface of a physical domain electronic circuit design tool. An example of a physical domain electronic circuit design tool comprises an electronic layout editor in some embodiments.

The method or the system may further comprise a process or module 204 for identifying or receiving a manipulation of the portion of the physical design in a single embodiment or in some embodiments. In some embodiments, the manipulation may be effected by a user/designer or by any tool in the electronic circuit design tool set which may comprise, for example, some schematic domain tools, some physical domain tools such as a router, or some post-layout tools that require a complete layout instead of a partial layout of an electronic circuit design. Some examples of the post-layout tools comprise, for example but not limited to, an LVS tool, a physical/formal verification tool, a post-layout optimization tool, or a sign-off tool in some embodiments.

The manipulation may comprise, for example, a user's identification of an area of interest in the physical design by using the user interface or a pointing device, a change in the physical data, electrical characteristic(s), or other related items in the electronic circuit design, a click on or moving a cursor over an entity, a menu item, a net, a device, or a component (hereinafter component), or any other items in the entire display area, or any commands or instructions associated with the physical design. It shall be noted that a manipulation may also refers to any operations performed or to be performed, either automatically by the system or assisted by a user, in one or more electronic circuit design tools.

In a single embodiment or in some embodiments, the method or system may further comprise a process or module 206 for displaying a response to the manipulation of the portion of the electronic circuit design in the first display portion in which the portion of the physical design is also displayed. In some embodiments, the response may be overlaid on top of the portion of the physical design in the first display portion. In some embodiments, the response may be implemented as a pop-up window in the first display portion or other portions of the user interface. In some embodiments, the display of the response to the manipulation comprises an in situ response to the manipulation. In these embodiments, the display of the response to the manipulation occurs without generally interrupting the state of various electronic circuit design tools by, for example, leaving one tool for another tool in order to generate or cause to generate the response. In some embodiments, the display of the response to the manipulation occurs substantially in real-time. Nonetheless, it shall be noted that the manipulation may trigger one or more processes or may invoke one or more modules to perform various functions in order to generate the response to the manipulation, and that the triggering of the one or more processes or the invocation of various modules may take certain time to complete. As a result, the display of the response occurs substantially in real-time.

In a single embodiment or in some embodiments, the method or system may further comprise a process or module 208 for displaying one or more result(s) relating to the physical data of a net, a device, or a component of the portion of the physical design, electrical parasitic(s) associated with the physical data, electrical characteristic(s), electrical characteristic(s) associated with the physical data or the electrical parasitic(s), or other elements of the physical design that are impacted by the manipulation.

Figure 2B:
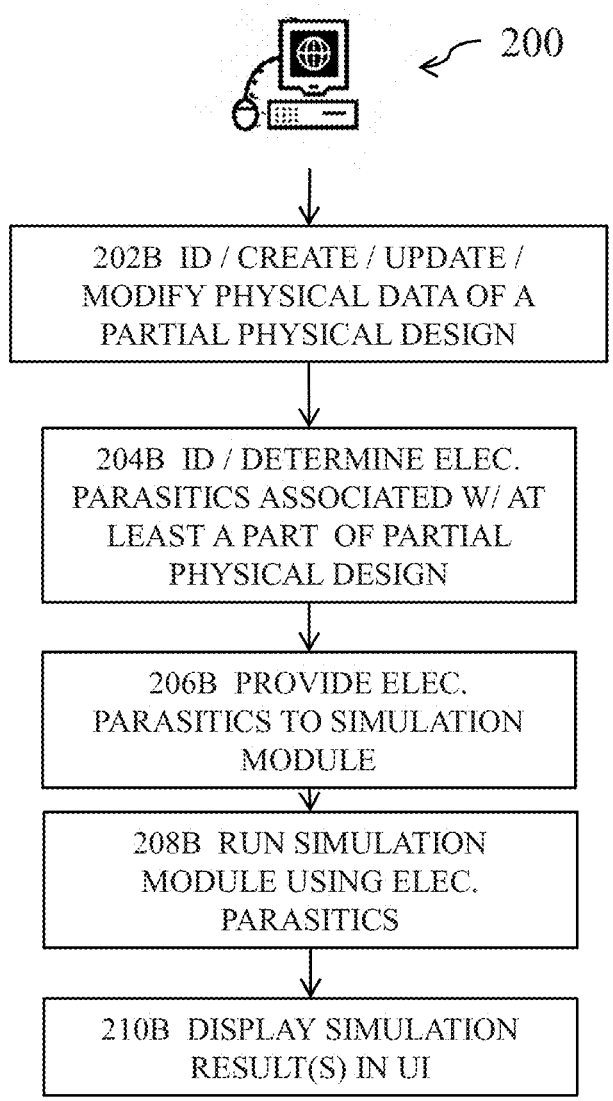

FIG. 2B illustrates a top level diagram for the method or system for providing customizable information in designing electronic circuits with electrical awareness in some embodiments. The method or the system may comprise the process or the hardware module for identifying, creating, updating, or modifying the physical data of a net, a shape of the net, a device, or a component (hereinafter "component") from a physical design, such as but not limited to, a layout, of an electronic circuit design at 202B via a remote or local computing node, a terminal, a work station, or a server (hereinafter a "computing node") 200 in one or more embodiments. In some embodiments, the physical design comprises a partial physical design of an electronic circuit design wherein the partial physical design does not and will not pass a layout versus schematic (LVS) check or verification without further editing, updating, or modification. In some embodiments, the method or the system may also comprise the process or module for identifying, determining, or characterizing an electrical parasitic that is associated with the component in the physical design at 204B. In some embodiments, the method or the system may also comprise the process or module for identifying, determining, or characterizing a device parameter that is associated with the component in the physical design at 204B. In some embodiments, the method or the system may also comprise the process or module for identifying, determining, or characterizing an electrical parasitic or a device parameter that is associated with the component in the physical design at 204B. In these embodiments, the electrical parasitic and the device parameter are collectively referred to as "electrical parasitic" or simply "parasitic".

In some embodiments, the characterization of electrical parasitics associated with physical data may be done with a two stage approach. This process begins with the selection a particular net or partial net. In the first stage, the process identifies where along that net that a geometric description should be created. The geometric descriptions may include wire widths and spacings, conductor and ILD (inter layer dielectrics) thicknesses, or thickness of barrier materials. A common description may be created and provided via an API (application programming interface.)

The second stage may include one or more components that may translate, transform, convert, or map (hereinafter "map") the geometric description to an equivalent parasitic value such as a resistance, capacitance or inductance. This translation, transformation, conversion, or mapping (hereinafter "mapping") may be done with mathematical algorithms or models that are often referred to as parasitic extraction. The models may be created through the use of semi-empirical methods that combine models or knowledge of the underlying physics with data provided by various solver(s), simulator(s), or a combination thereof. In some cases, the mapping for capacitance may also be done with a solver.

In some embodiments, the second stage may use parasitic extraction for some nets and a field solver for other nets. In some embodiments, the second stage may use a combination of parasitic extraction for, for example, resistance(s) and a field solver for, for example, capacitance(s) on the same net. In some embodiments, the characterization of electrical parasitics may be performed with extraction tools that map geometric dimensions and patterns to corresponding parasitics such as R, L, and C. In some embodiments, the characterization of electrical parasitics includes the use of field solvers (such as but not limited to one or more EM field solvers) that map geometric dimensions and patterns to capacitance(s).

The method or the system may then provide the electrical parasitic to one or more simulator modules or simulation processes at 206B in some embodiments. The method or the system may perform the one or more simulation processes or invoke the one or more simulator modules using the electrical parasitic at 208B in some embodiments. The method or the system may further comprise the process or module of displaying the simulation result(s) in a user interface (UI) at 210B in one or more embodiments. In some embodiments, the processes or modules of 202B, 204B, 206B, 208B, and 210B may be performed at the time when the component is being created, modified, or updated. In some other embodiments, the processes or modules of 202B, 204B, 206B, 208B, and 210B may be performed after the completion of the creation, modification, or updating of the component but before the creation, modification, or updating of the next component. In other words, the processes or modules of 202B, 204B, 206B, 208B, and 210B may be performed incrementally on a component by component basis in the latter embodiments.

Figure 3A:
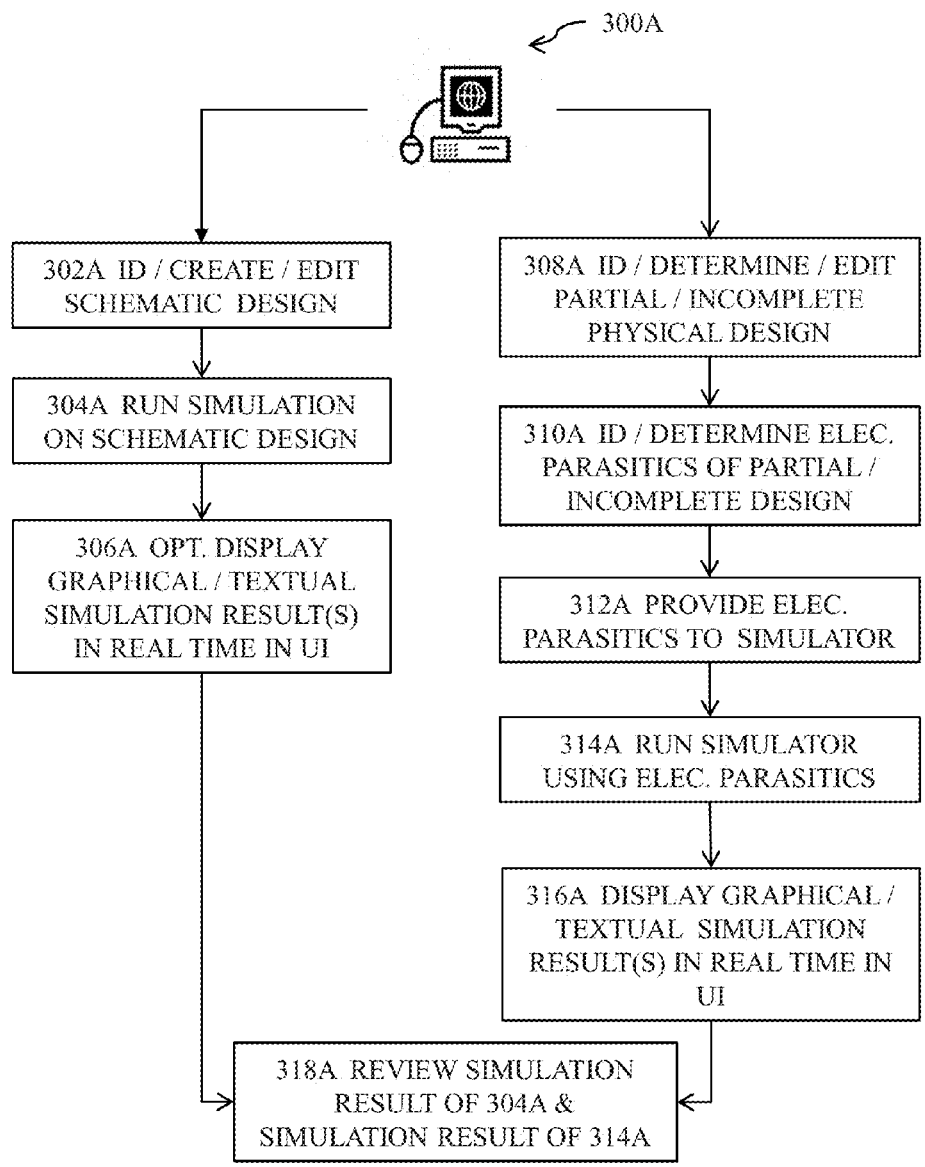
FIGS. 3A-D illustrate some top level diagrams for the method or system for providing customizable information in designing electronic circuits with electrical awareness in some embodiments.

FIG. 3A illustrates a top level diagram for the method or system for providing customizable information in designing electronic circuits with electrical awareness in some embodiments. The method or the system may comprise the process or hardware module for identifying, creating, editing, or modifying a schematic design at 302A via using a computing node 300A in one or more embodiments. The method or the system may further comprise the process or module of performing a schematic simulation to identify, characterize, or determine the intended behavior or characteristics of an electronic circuit design at 304A in some embodiments. At 306A, the method or the system may further optionally comprise the process or module for graphically or textually displaying schematic simulation result(s) in a user interface of the computing node at 306A in some embodiments. In some embodiments, the user interface comprises a graphical user interface (GUI).

The method or the system may also comprise the process or module for identifying, determining, modifying, or updating the physical data of a component in a physical design in the electronic circuit design at 308A in one or more embodiments. In some embodiments, the physical design comprises a partial physical design of an electronic circuit design wherein the partial physical design does not and will not pass a layout versus schematic (LVS) check or verification without further editing, updating, or modification. The method or the system may further comprise the process or module for identifying, determining, or characterizing an electrical parasitic that is associated with the component in the physical design at 310A as well as the process or module for providing or forwarding the electrical parasitic to a simulator or a simulation process at 312A in some embodiments.

The method or the system may then perform the simulation process or invoke the simulator module using the electrical parasitic at 314A in some embodiments. At 316A, the method or the system may further optionally comprise the process or module for graphically or textually displaying the simulation result(s) in a user interface in some embodiments. In some embodiments, the process or module 316A is performed or invoked substantially in real time to provide in situ display of the simulation result(s) when the component or the physical data thereof is being edited, modified, or updated such that a user who is creating, editing, updating, or modifying the component knows how his or her creating, editing, updating, or modification of the component impacts at least a part of the electronic circuit design or whether his or her creating, editing, updating, or modification of the component complies with the intended behavior or characteristic of the component. At 318A, the method or the system may further optionally comprise the process or module for reviewing or evaluating the simulation result(s) of 304A and the simulation result(s) of 314A in one or more embodiments. In some embodiments, the process or module for reviewing or evaluating the simulation result(s) at 318A may comprise comparing the simulation result(s) of 304A with the simulation result(s) of 314A.

Figure 3B:
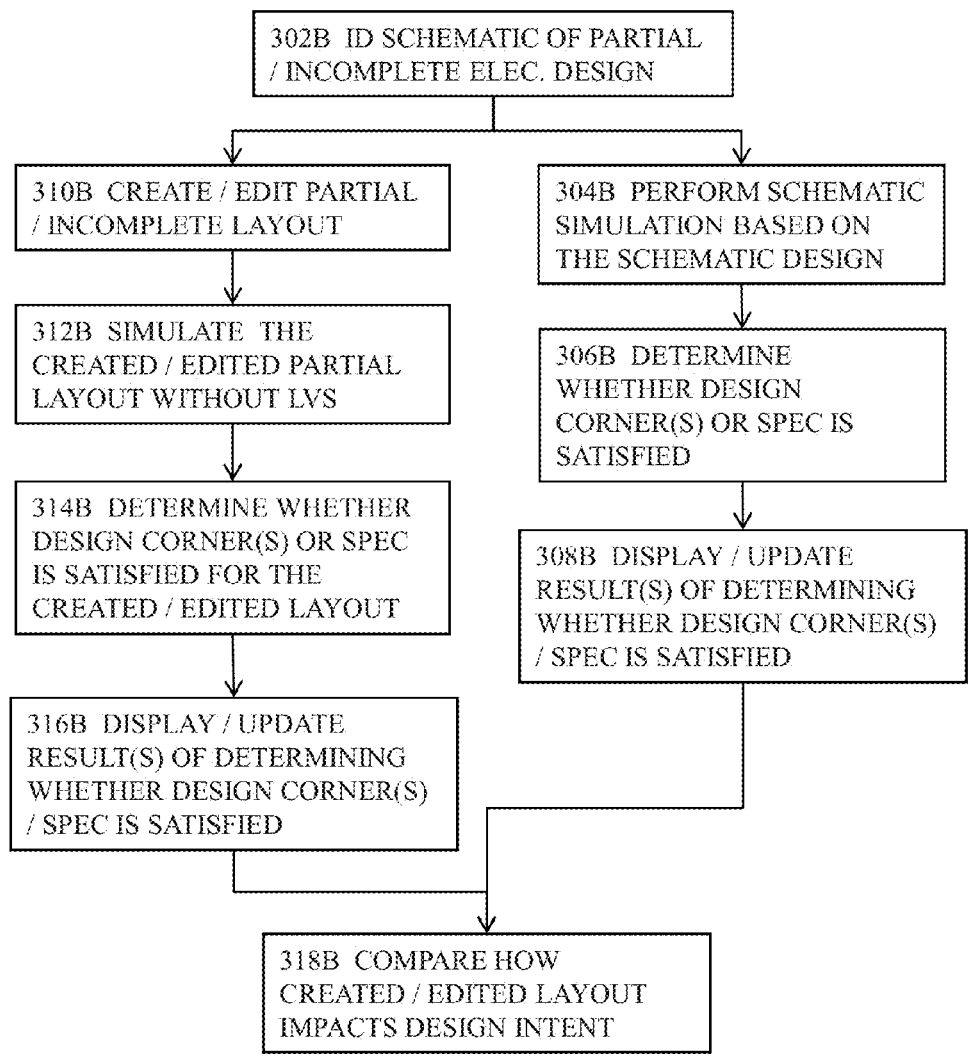

FIG. 3B illustrates a top level diagram for the method or system for providing customizable information in designing electronic circuits with electrical awareness in some embodiments. In one or more embodiments, the method or the system may comprise the process or module for identifying the schematic design of a physical electronic circuit design at 302B. In some embodiments, the physical design comprises a partial physical design of an electronic circuit design wherein the partial physical design does not and will not pass a layout versus schematic (LVS) check or verification without further editing, updating, or modification. The method or the system may further comprise the process or module for performing a schematic simulation based on the schematic design to generate some simulation results at 304B.

The method or the system may further comprise the process or module for determining whether some design corners or the specification of the electronic circuit design is satisfied at 306B based on the simulation results generated at 304B. The method or the system may further optionally comprise the process or module for graphically or textually displaying or updating a result of the process for determining whether the design corner(s) or the specification is satisfied at 308B in some embodiments. In some embodiments, the schematic simulation results may be identified from a computer readable storage medium without performing the schematic simulation. For example, in some cases where the schematic simulation has been performed, and the simulation results have been stored, such simulation results may be directly retrieved from storage without having to performing the schematic simulation again.

In some embodiments, the method or the system may comprise the process or module for creating, editing, updating, or modifying the physical data of a component in a layout at 310B. In some embodiments, the physical design comprises a partial physical design of an electronic circuit design wherein the partial physical design does not and will not pass a layout versus schematic (LVS) check or verification without further editing, updating, or modification. The method or the system may comprise the process or module for performing a simulation of the created, edited, updated, or modified layout at 312B in one or more embodiments. In some embodiments, the method or the system as illustrated in FIG. 3B performs various processes or invokes various modules without having to or requiring the performance of the LVS check or verification. In these embodiments, the partial layout or even the complete layout remains LVS correct without having to pass the LVS check or verification.

At 314B, the method or the system may also comprise the process or module for determining whether some design corner(s) or the specification is satisfied for the created, edited, updated, or modified layout based at least in part upon the result of 312B in some embodiments. The method or the system may further optionally comprise the process or module of graphically or textually displaying or updating the results of the determination whether the design corner(s) or the specification is satisfied at 316B in some embodiments. At 318B, the method or the system may further optionally comprise the process or module for reviewing or evaluating the simulation result(s) of 304B and the simulation result(s) of 312B in one or more embodiments. In some embodiments, the process or module for reviewing or evaluating the simulation result(s) at 318B may comprise comparing the simulation result(s) of 304B with the simulation result(s) of 312B.

Figure 3C:
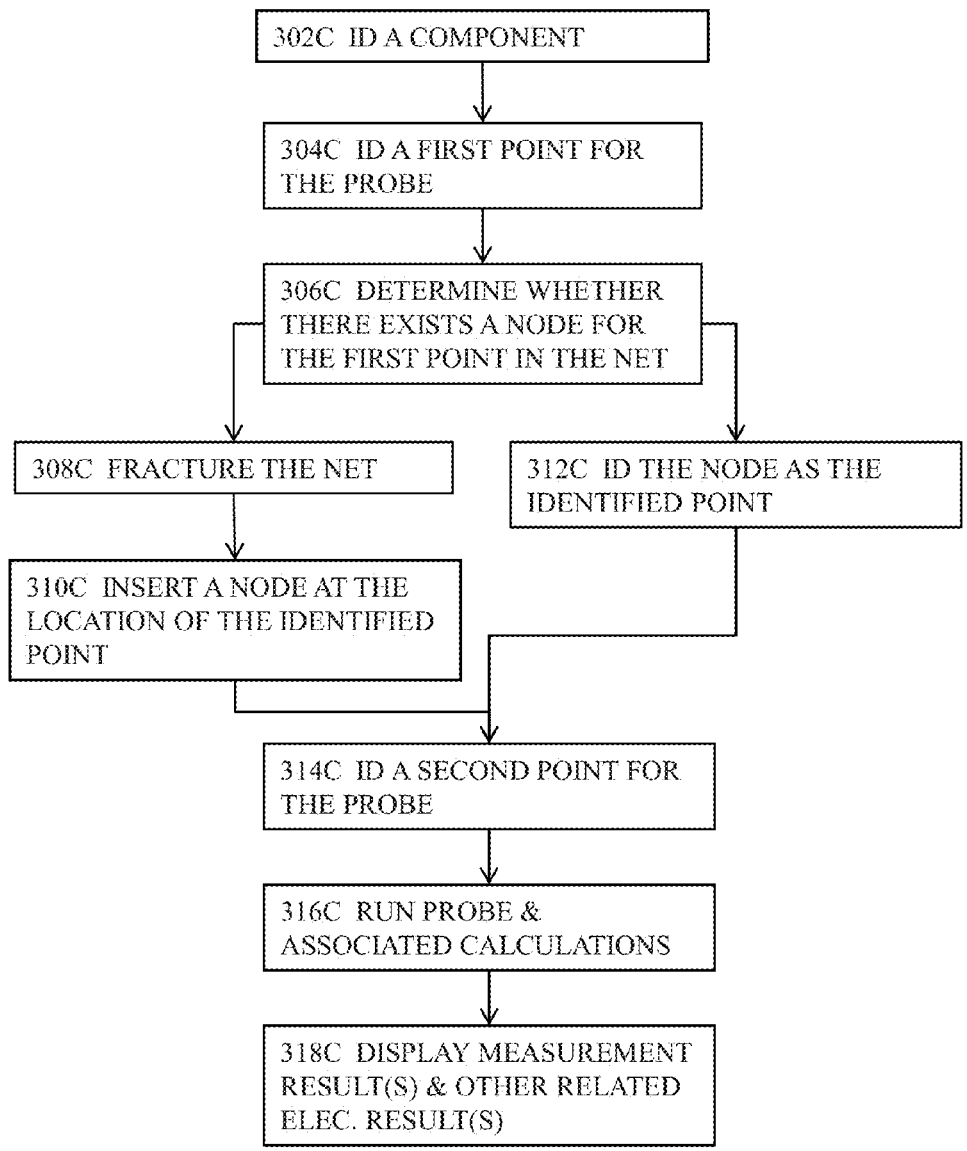

FIG. 3C illustrates a top level diagram for the method or system for providing customizable information in designing electronic circuits with electrical awareness in some embodiments. More specifically, the method or the system illustrated in FIG. 3C depicts a method or system for implementing an electrically aware measurement process for an electrical parasitic or an electrical characteristic in some embodiments. The method or the system comprises the process or module for identifying a component of a physical design of an electronic circuit design at 302C in one or more embodiments. In some embodiments, the physical design comprises only a partial physical design that does not pass a LVS check or verification.

The method or the system may further comprise the process or module for identifying a first point for the measurement or the measurement probe at 304C (hereinafter measurement) in one or more embodiments. In some embodiments, the first point may be identified according to a user's input. For example, a user may identify the first point by clicking at a point in, for example, the physical design. In some embodiments, the first point may be identified based on the identification of the component. For example, if a net or a segment thereof is identified at 302C the method or the system may automatically identifies the appropriate terminal(s) or connection(s) for the component as the first point in some embodiments.

The method or the system may further comprise the process or module 306C for determining whether there exists a node for the first point of a measurement in some embodiments. At 308C, the method or the system may comprise the process or module for fracturing the net which constitutes the component in some embodiments or to which the component belongs in some other embodiments. The method or the system may further comprise the process or module 310C for inserting a node at the location of the first point if it is determined that there does not exist a node at the location in some embodiments. In some embodiments where it is determined that there exists an existing node at the first point, the method or the system may identify the existing node as the first point for the measurement at 312C.

Figure 3D:
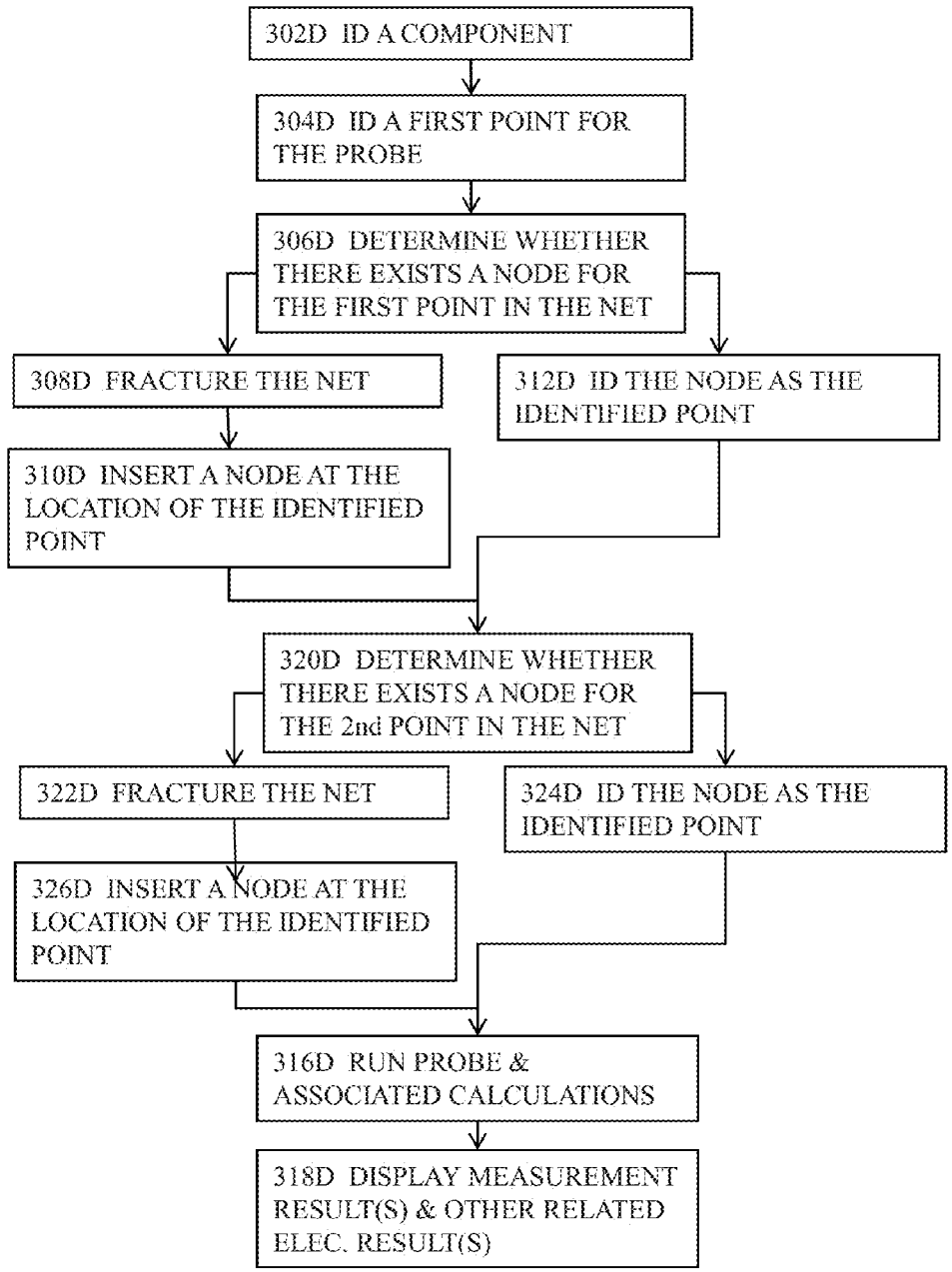

At 314C, the method or the system further comprises the process or module for identifying a second point for the measurement at 314C in one or more embodiments. In some embodiments, the method or the system identifies the second point in a manner that is substantially similar to that in 304C. FIG. 3D illustrates a top level diagram for the method or system for providing customizable information in designing electronic circuits with electrical awareness in some embodiments. The processes or actions of 302D, 304D, 306D, 308D, 310D, and 312D are substantially similar to those of 302C, 304C, 306C, 308C, 310C, and 312C of FIG. 3C respectively.

In some embodiments, the method or the system may further comprise the process or module of identifying a second point for the measurement or the measurement probe and then determining whether there already exists a node for the second point at 320D. At 322D, the method or the system may further comprise the process or module for fracturing the net which constitutes the component in some embodiments or to which the component belongs in some other embodiments where the method or the system determines that no there does not exist a pre-existing node for the second point. In these embodiments, the method or the system may further comprise the process or module for inserting a node at the location of the second point. In some other embodiments where the method or the system determines that there already exists a pre-existing node for the second point, the method or the system may comprise the process or module for identifying the pre-existing node as the second point for the measurement or measurement probe.

The method or the system may then proceeds to perform the measurement using the first point and the second point to determine the desired electrical parasitic or characteristics at 316D in one or more embodiments. In some embodiments, the method or the system may further perform additional or associated calculations at 316D to determine the desired electrical parasitic or characteristic. At 318D, the method or the system may further optionally comprise the process or module for displaying the measurement result(s) or other related electrical result(s) in some embodiments. One or more illustrative examples of the processes illustrated in FIG. 3C and FIG. 3D will be provided in subsequent paragraphs with reference to one or more figures.

Figure 4A:
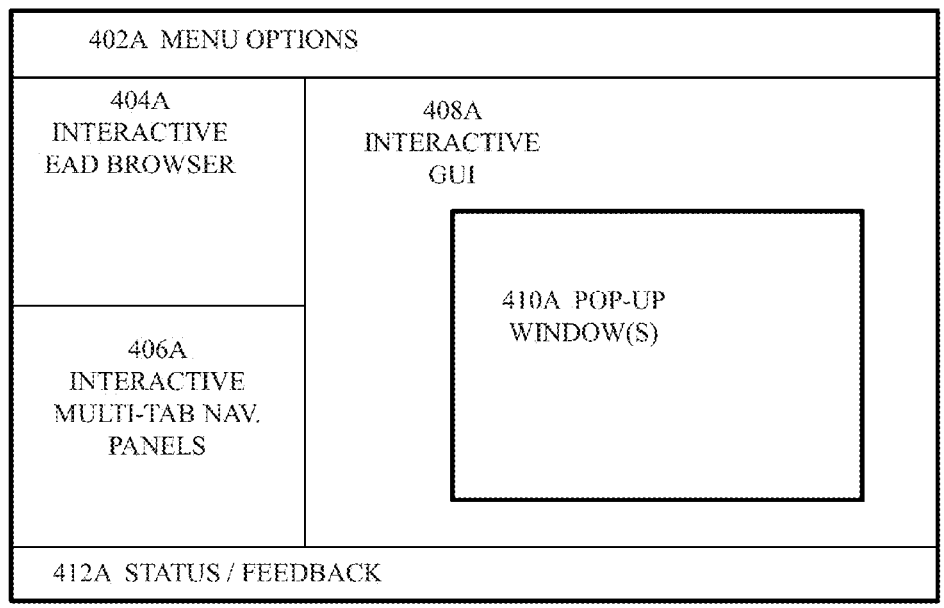

FIG. 4A illustrates an exemplary arrangement for some items in a user interface for providing customizable information in designing electronic circuits with electrical awareness in some embodiments. In one or more embodiments, the user interface may comprise a plurality of menu options 402A such as but not limited to options for file manipulations, invocation of various modules (e.g., the modules illustrated in FIGS. 1A-C), options for rolling backward or rolling forward certain actions, etc. The user interface may further comprise a graphical display area 408A such as an interactive GUI that interactively communicates or displays various information or data based on or in response to any changes in the state of the electronic circuit design in some embodiments. Such changes in the state of the electronic circuit design may comprise, for example but not limited to, an edit, update, modification, or creation of a component in the physical design, a user's input into or manipulation of the electronic circuit design, an invocation of a module, a performance of a process, etc.

The user interface may also comprise one or more pop-up window 410A to communicate or display various information, data, options, settings, or messages to a user in some embodiments. The user interface may also comprise an interactive browser 404A or an interactive navigator 406A in some embodiments. The user interface may also comprise a status or feedback display area 412A to display information about the status or to communicate certain feedback. More details about various items illustrated in FIG. 4A will be described in subsequent paragraphs with reference to various figures.

Figure 4B:
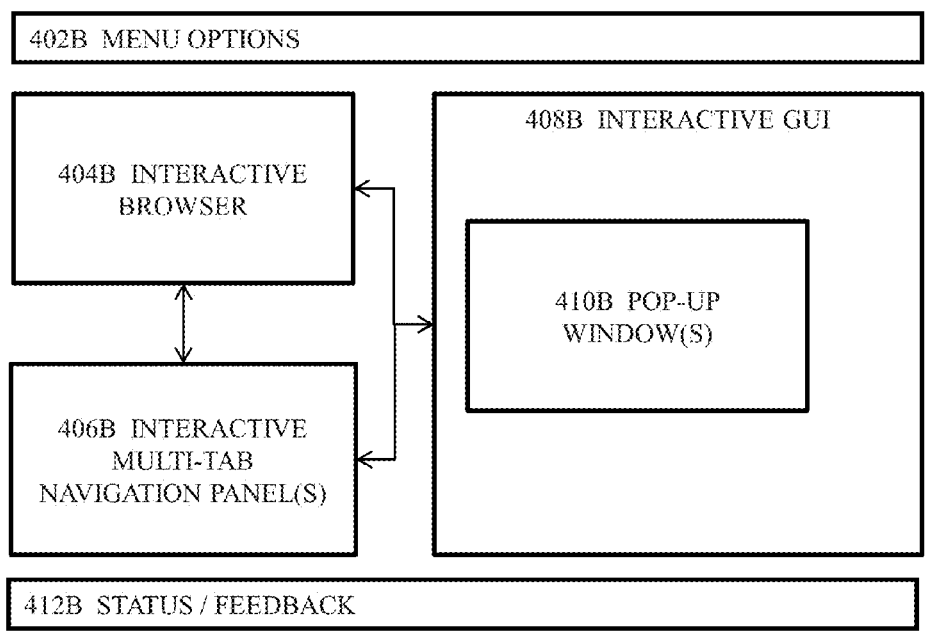

FIG. 4B illustrates further details about an exemplary arrangement for some items in a user interface for providing customizable information in designing electronic circuits with electrical awareness in some embodiments. More specifically, FIG. 4B shows the interactive characteristics of various user interface items. In the exemplary arrangement as illustrated in FIG. 4B, the interactive browser 404B may be interactively and operatively coupled with or linked to the interactive GUI 408B, one or more pop-up windows 410B, or the interactive navigator 406B such that an operation or manipulation performed in the interactive GUI 408B, one or more pop-up windows 410B, or the interactive navigator 406B causes or triggers corresponding action(s), operation(s), or manipulation(s) in the interactive browser 404B in one or more embodiments.

In these embodiments or in some other embodiments, the interactive browser 404B may also be interactively and operatively coupled with or linked to the interactive GUI 408B, one or more pop-up windows 410B, or the interactive navigator such that an operation or manipulation performed in the interactive GUI 408B, one or more pop-up windows 410B, or the interactive navigator 406B causes or triggers corresponding action(s), operation(s), or manipulation(s) in the interactive browser 404B. In some embodiments, the options menu 402B or the status or feedback display area 412B may also be interactively and operatively coupled with or linked to any one of the interactive browser 404B, the interactive GUI 408B, one or more pop-up windows 4108, and the interactive navigator 406B such that an action, operation, or manipulation in one of the above user interface items triggers, causes, or invokes a corresponding action, operation, response, manipulation, or display of information in one or more of these user interface items in some embodiments.

Figure 4C:
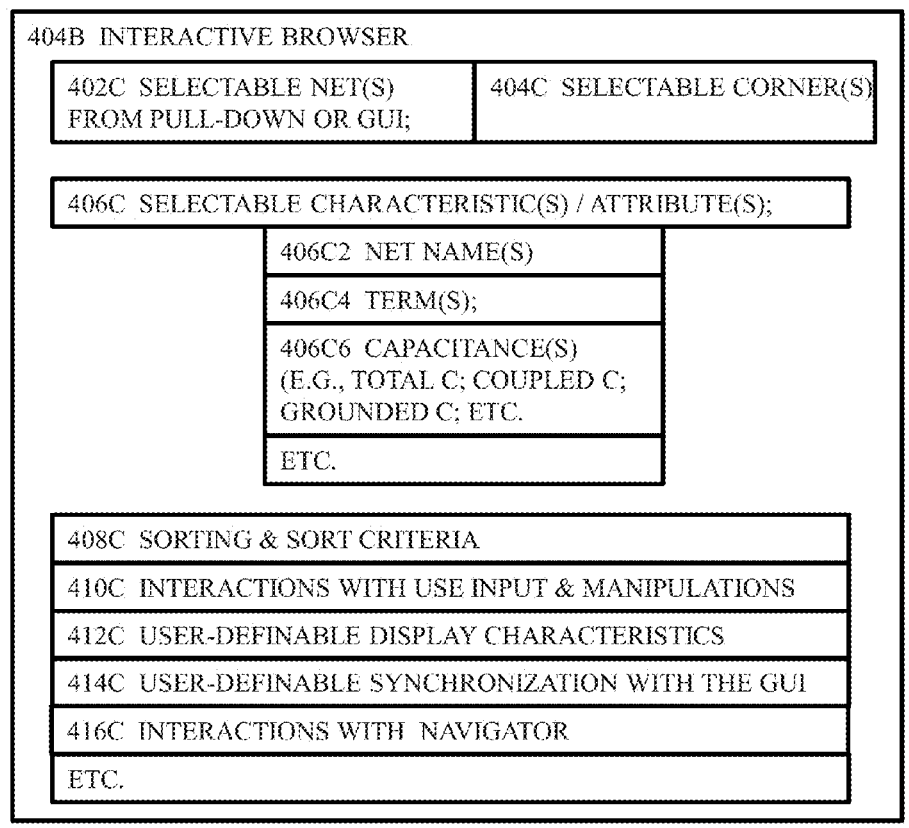

FIG. 4C illustrates further details of the interactive browser 404B in one or more embodiments. More specifically, FIG. 4C shows exemplary contents of the interactive browser 404B in these embodiments. In some embodiments, the interactive browser 404B may comprise textual or graphical display of a list of components (such as a list of nets) 402C in at least a portion of a physical design of an electronic circuit design.

In some embodiments, the list of components may be presented in a form of a pull-down menu. In some embodiments, the list of components may be presented in a form of hierarchical structure. In some embodiments, the list of components is presented in an expandable and collapsible structure with one or more hierarchies such that a user may identify a particular component and display the identified component at a desired level of granularity. In some embodiments, at least some of the list of components may be user selectable.

For example, a user may click on a particular net or some of the associated or included devices in this particular net to identify and select this particular net as the net of interest in some embodiments. In addition or in the alternative, once a component has been identified or selected in the interactive browser 404B, the interactive GUI may automatically adjust the graphical display to provide a proper view with proper level of granularity in response to the identified or selected component. In some embodiments, a user may also select or identify a component in the interactive GUI by, for example, clicking on the component in the interactive GUI. In these embodiments, the interactive browser 404B may automatically adjust the display of its contents or may further expand or collapse certain levels in 402C to properly display the component identified or selected from the interactive GUI. In some embodiments, the interactive browser may further emphasize the selected or identified component by, for example but not limited to, highlighting, color coding, or other visual aides to help the user to identify the component in 402C.

The interactive browser 404B may further comprise one or more selectable corners 404C or one or more selectable characteristics or attributes 406C in one or more embodiments. In some embodiments, the selectable characteristics or attributes comprise, for example but not limited to, identification of a component (e.g., the name of a net) 406C2, or various types of parasitics 406C6 such as total capacitance(s), coupled capacitance(s), or grounded capacitance(s), etc. In some embodiments where the component comprises a net, the selectable characteristics or attributes 406C may comprise the total number of terminals 406C4 or the total number of violations of certain constraints for each component at each of a plurality of levels.

In some embodiments, the interactive browser 404B may further include provisions for activating one or more sorting functions or one or more selectable sorting criteria 408C which may be used to sort the displayed information or data. In some embodiments, the interactive browser 404B may further comprise one or more provisions for interacting with user input and manipulation(s) 410C such as but not limited to various editing, undo, redo, or delete functions, display mode for the interactive browser (e.g., a list view or a tabulated view of the components), etc.

In some embodiments, the interactive browser 404B may further comprise user-definable display characteristics 412C. For example, the user may choose to use red to show all components with current densities that are 20% higher than the specification or a design corner, to use yellow to show all components with current densities that are between 0% to 20% higher than the specification or a design corner, and green for to show all components with current densities that are equal to or less than the specification or a design corner in one embodiments. In some embodiments, the user may define different display characteristics for the interactive browser 404B and the interactive GUI. In some embodiments, the user may synchronize (414C) the display characteristics for both the interactive browser 404B and the interactive GUI.

In some embodiments, the interactive browser 404B may further comprise one or more provisions for interacting with the interactive navigator, the interactive GUI, the options menu, or the status or feedback display area (416C). For example, the interactive browser may provide the provision for the user to select whether or how to display, for example, capacitance(s) (e.g., display capacitance(s) by layer, or display capacitance by the component) in some embodiments. In some embodiments, the interactive browser may further provide the provision for a user to select which dataset is to be used to determine whether a particular component satisfies the specification or a design corner. For example, the interactive browser may provide the user with a list of datasets (such as a worst case dataset) for the user to select.

FIG. 4D illustrates further details about the interactive navigator or interactive navigation pane(s) ("interactive navigator" herein) 406C in some embodiments. In one or more embodiments, the interactive navigator 406C may comprise a plurality of provisions to enable a user to select which analysis mode is to be invoked or displayed. The plurality of provisions comprises the provision for electrical parasitics 402D which triggers or causes the display of electrical parasitic(s) that have been determined for the component(s) of interest in some embodiments. The plurality of provisions comprises the provision for comparing function(s) 404D which compares various electrical characteristic(s), electrical parasitic(s), device parameter(s), or other data of one component with that of one or more other component(s) in some embodiments. For example, 404D may invoke the process or module to compare the electrical parasitics of one net with those of another net in some embodiments. In some embodiments, the interactive navigator comprise a provision to enable a user to select one or more datasets (422D) to present various information or data for the selected component(s) of interest.

The plurality of provisions may further comprise the first provision for electro-migration (EM) 406D or the second provision 408D. The first provision (406D) or the second provision for electro-migration (408D) provides a user with various customizable settings, options, or functions, and displays various customizable types of information or data to the user. In some embodiments, the interactive navigator may also provide a provision for a user to determine how various customizable data will be updated. For example, the provision may provide the user with the capability to determine whether or not the customizable data will be automatically or manually updated in response to the creation, editing, updating, or modification made to the schematic or physical electronic circuit design. In some of the examples illustrated in some of the subsequent paragraphs with reference to various figures, the first provision (406D) is denoted as "EM", and the second provision for electro-migration is denoted as "New EM".

In some embodiments, the first provision of EM 406D presents the EM related information or data, such as but not limited to various EM related electrical parasitics or electrical characteristics, geometric data or information of one or more components, or other characteristics or attributes of at least a portion of a physical electronic circuit design, in a list data structure on a, for example, property-by-property basis (e.g., resistances or capacitances), component-by-component (e.g., net-by-net or path-by-path) basis, or a layer-by-layer basis (e.g., metal 1, metal 2, dielectric 1, etc.) in some embodiments. The list data structure may comprise a hierarchical structure that comprises one or more hierarchies that may be expanded or collapsed.

In some embodiments, the second provision of EM 408D presents the EM related information or data, such as but not limited to various EM related electrical parasitics or electrical characteristics, geometric data or information of one or more components, or other characteristics or attributes of at least a portion of a physical electronic circuit design, in a tabulated form. In some embodiments, the tabulated form comprises a spread sheet or a database representation of various the EM related information or data in a row-based or column-based format. In some embodiments, the interactive navigator further provides the functions for perform various arithmetic, mathematical, or statistical operations or analyses of the EM related information or data. In some embodiments, the EM related information or data comprise, for example, the physical attributes of one or more components such as the length(s), width(s), or cross-sectional area(s) of an interconnect or a segment thereof. In some embodiments, the various EM related information or data comprise, for example, resistance(s), various types of currents or current densities, the number of cuts or the cut area for a component, or the layer that a component belongs to.

In one or more embodiments, the interactive navigator displays or presents one or more characteristics or attributes that are definable or customizable by a user (410D). The one or more characteristics comprise, for example but not limited to, resistance(s) (410D2), average AC (alternating current) current(s) (410D4), average DC (direct current) current(s) (410D6), layer information such as the name(s) of corresponding layer(s) (410D8), geometric characteristic(s) (410D10), the number of cuts for a component (410D12), the cut area for a component (410D14), various types of capacitances that are arranged on a, for example but not limited to, component-by-component (e.g., net-by-net) or layer-by-layer basis in some embodiments. The interactive navigator may provide a user with the options to determine what data or information to display.

The interactive navigator may further provide a sorting function such that a user may sort the displayed data or information based on one or more user-definable sorting criteria (412D) in some embodiments. The interactive navigator may further interact with user's input or manipulation within the interactive navigator or in other part(s) of the user interface (414D) in some embodiments. For example, the interactive navigator may interactively presents in situ, customizable information, data, or message(s), provides option(s), selection(s), choice(s), decision(s), or function(s), or invokes one or more sub-module(s) or process(es) in response to user's input or manipulation(s) within the interactive navigator or in other part(s) of the user interface. For example, the interactive navigator may interact with the interactive browser (416D), the interactive user interface, the options menu, or the status or feedback display area.

The interactive navigator may further provide the functions or capability for a user to define the user's preferences for the displayed data or information in the user interface (418D) in some embodiments. For example, the user may determine which color or highlight scheme is to be used to display what type of information or data to emphasize certain types of displayed information or data. The interactive navigator may further provide the functions or capability for a user to determine whether or not the displayed information, data, or design in various parts of the user interface are to be synchronized (420D) in some embodiments. For example, the user may determine whether or not the interactive browser, the interactive navigator, and the interactive graphical display area are to be synchronized with the same color coding or highlight scheme.

Figure 4E:
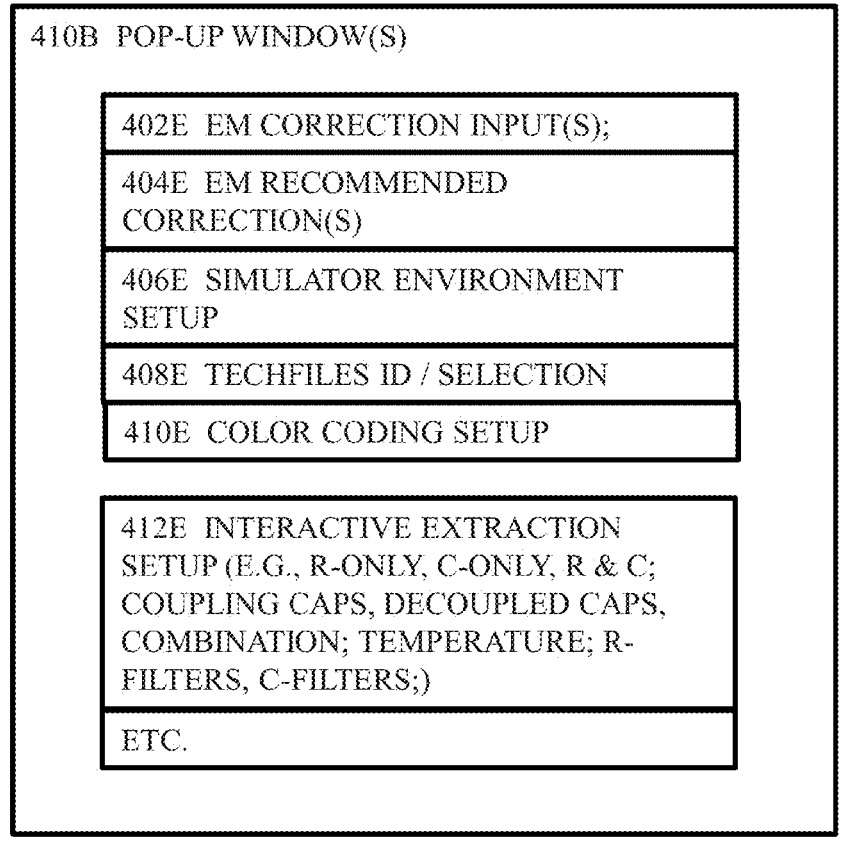

FIG. 4E illustrates some exemplary contents of one or more pop-up windows in some embodiments. A pop-up window (410B) may comprise, for example but not limited to, EM correction user input(s) (402E) or recommended EM correction or hint (404E) for a user to determine whether or not certain design elements are to be modified to address some EM violations or concerns that have not risen to EM violations in some embodiments. In the embodiments where recommended EM corrections or hints are provided in a pop-up window or in other parts of the user interface, the pop-up window may further provide information or data to show the after effect of the application of the EM corrections or hints such that the user may see how the EM corrections or hints are going to impact the electronic circuit design.

A pop-up window may further provide the functions or capability for a user to set up the respective environment of various simulators, such as but not limited to a schematic simulator or a layout simulator (406E) in some embodiments. A pop-up window may further provide the functions or capability for a user to identify or select one or more techfiles each of which is associated with a specific foundry (408E). A pop-up window may further provide the functions or capability for a user to select or determine display preferences such as the color coding or highlighting schemes for various textual or graphical display or representation of information or data (410E) in some embodiments. A pop-up window may further provide the functions or capability for a user to set up the extractor (412E) in some embodiments. For example, a user may determine whether the extractor is to extract resistances only, capacitances only, or both resistances and capacitances. The user may determine what the extractor will extract from the physical electronic circuit design based at least in part upon, for example, a balance between the computation resources and time constraints.

FIG. 4F illustrates more details about some items in the user interface for providing customizable information in designing electronic circuits with electrical awareness in some embodiments. In some embodiments, FIG. 4F illustrates some of the components of a user interface. For example, the user interface as illustrated in FIG. 4F may comprise GUI menu items 402F, a first display portion 406F of the physical design display area, a second display area or portion (collectively portion) 404F for the interactive EAD (electrically aware design) browser, or an interface or a third display portion 408F for displaying various hints, suggestions, or recommendations for one or more constraint verification result(s) or compliance check result(s) or for automatic or assisted fixes or what-if analyses.

In some embodiments, the user interface comprises a physical design display portion content control which may be used to control or customize how various information or data may be displayed in the physical design display portion 406F. For example, the physical design display portion content control may be used to select whether certain layers, nets, components, hierarchical levels, physical data, electrical characteristics, electrical parasitics, other data associated with the physical design, etc. of the physical design are to be displayed, the appearance of the display for various entities such as what colors are to be used to display various information or data in the physical design display portion, etc. in some embodiments.

In some embodiments, the user interface provides one of more interactive design editing functions to a user. In some embodiments, the user interface comprises a navigator for a user to navigate through one or more trees of elements associated with various nets, devices, or components (hereinafter component) of the physical design or a portion thereof. For example, the navigator may provide individual component information or data for a given portion of the physical design in a collapsible tree with multiple branches, each of which may comprise one or more collapsible levels of data or information to be displayed. In some embodiments, the user interface comprises a display of physical data, electrical parasitics associated with the physical data, electrical characteristics associated with the physical data or the electrical parasitics, or other related data of the physical design or a portion thereof.

In some embodiments, the user interface comprises a display of one or more results of physical, parasitic, or electrical constraint verification or compliance check. In some embodiments, such a display of one or more results may also comprise using a customizable thermal map for various results. For example, any violation of a constraint or design rule may be shown in a first color, a first line type, or a first shape texture; any components whose parasitics, physical data, electrical characteristics, or other data are at a level that does not rise to the level of violation but may cause concerns or other issues may be displayed in a second color, a second line type, or a second shape texture; any components that meet various constraints, design rules, or requirements may be displayed in a third color, a third line type, or a third shape texture.

In some embodiments, the user interface further displays legends for the display so a user may understand what information the thermal display conveys. In some embodiments, the thermal maps may be customized in a way such that a user may easily spot areas of concerns in the physical display portion. For example, a user may customize the thermal map display to use the color red for any violations of constraints or hard design rules that have to be fulfilled and to use white for the remaining physical design. In this example, a user may easily spot the violations in red in the physical design display portion.

Figure 4G:
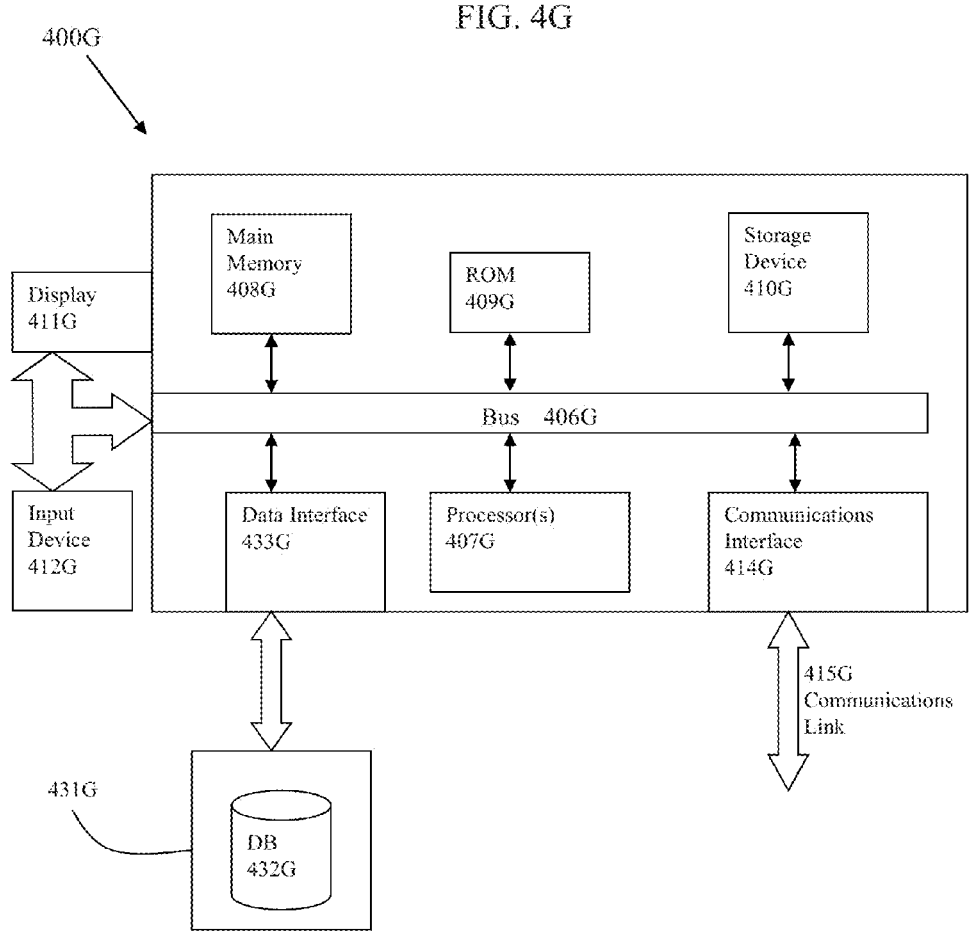
FIG. 4G illustrates an exemplary system that may be used to implement various processes or modules described herein.

In some embodiments, the physical design display portion may be configured to provide in situ and/or real-time responses to manipulations that are effected from a user, one or more electronic circuit design tools, or a combination thereof. The physical design display portion may also be configured to display one or more results relating to the characterizations of electrical parasitic(s) or electrical characteristic(s) of a particular component of interest in response to the manipulations of this particular component of interest in some embodiments. The physical design display portion may further be configured to display one or more results relating to the characterizations of electrical parasitic(s) or electrical characteristic(s) of other elements of the physical design that are impacted by the manipulations of the particular component. In some embodiments, the process for displaying the simulation FIG. 4G illustrates a block diagram of an illustrative computing system 400G suitable for implementing some embodiments of the method or system for providing in situ, customizable information in designing electronic circuits with electrical awareness as described in the preceding paragraphs with reference to various figures. Computer system 400G includes a bus 406G or other communication mechanism for communicating information, which interconnects subsystems and devices, such as processor 407G, system memory 408G (e.g., RAM), static storage device 409G (e.g., ROM), disk drive 410G (e.g., magnetic or optical), communication interface 414G (e.g., modem or Ethernet card), display 411G (e.g., CRT or LCD), input device 412G (e.g., keyboard), and cursor control (not shown).

According to one embodiment, computer system 400G performs specific operations by one or more processor or processor cores 407G executing one or more sequences of one or more instructions contained in system memory 408G. Such instructions may be read into system memory 408G from another computer readable/usable storage medium, such as static storage device 409G or disk drive 410G. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof (herein "processor") 407G, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof.

The term "computer readable storage medium" or "computer usable storage medium" as used herein refers to any medium that participates in providing instructions to processor 407G for execution. Such a medium may take many forms, including but not limited to, non-volatile media and volatile media. Non-volatile media includes, for example, optical or magnetic disks, such as disk drive 410G. Volatile media includes dynamic memory, such as system memory 408G.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 400G. According to other embodiments of the invention, two or more computer systems 400G coupled by communication link 415G (e.g., LAN, PTSN, or wireless network) may perform the sequence of instructions required to practice the invention in coordination with one another.

Computer system 400G may transmit and receive messages, data, and instructions, including program, e.g., application code, through communication link 415G and communication interface 414G. Received program code may be executed by processor 407G as it is received, and/or stored in disk drive 410G, or other non-volatile storage for later execution. In an embodiment, the computer system 400G operates in conjunction with a data storage system 431G, e.g., a data storage system 431G that contains a database 432G that is readily accessible by the computer system 400G. The computer system 400G communicates with the data storage system 431G through a data interface 433G. A data interface 433G, which is coupled to the bus 406G, transmits and receives electrical, electromagnetic or optical signals that include data streams representing various types of signal information, e.g., instructions, messages and data. In embodiments of the invention, the functions of the data interface 433G may be performed by the communication interface 414G.

Figure 5:
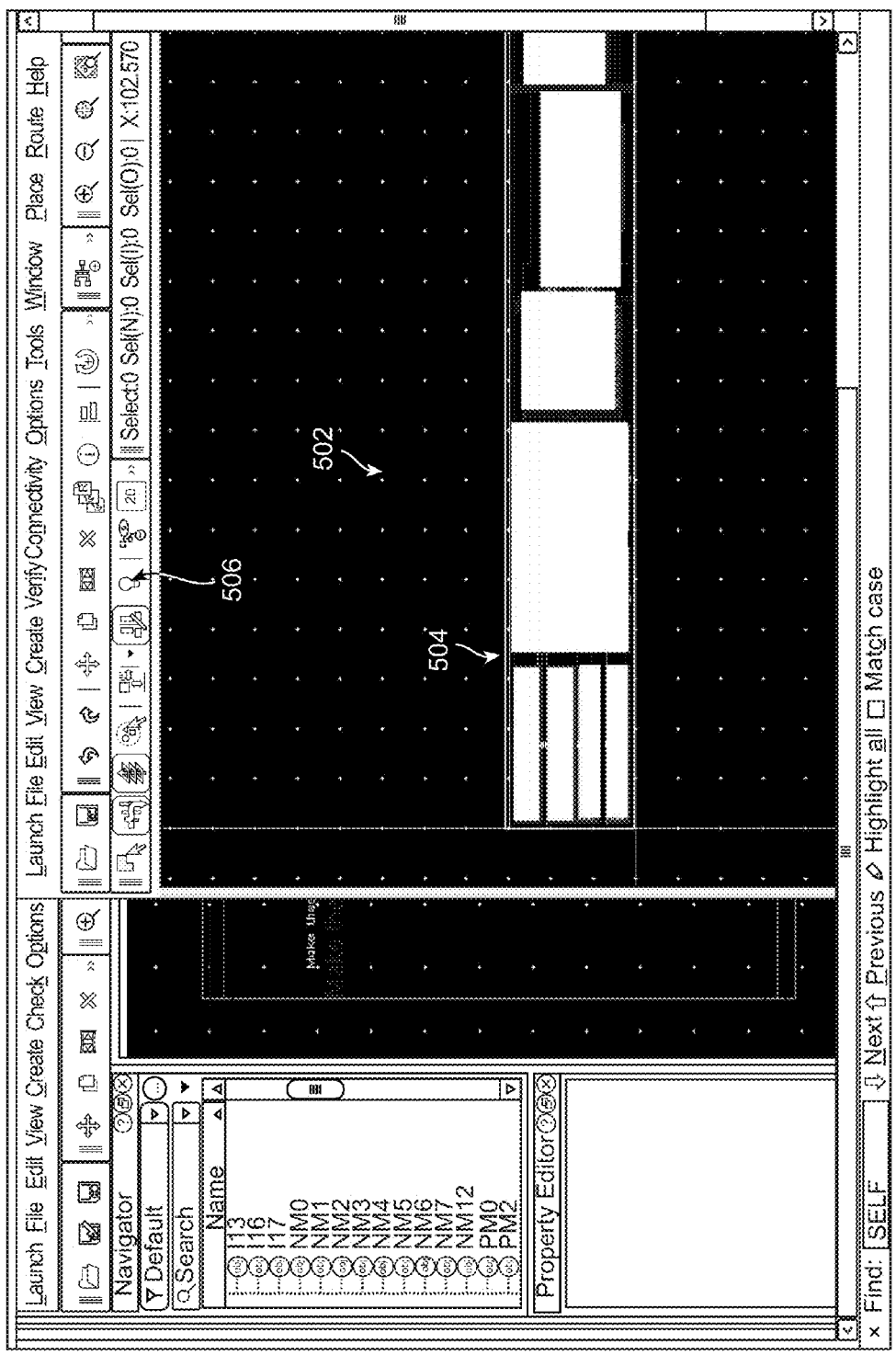
FIGS. 5-27 illustrate more details for the user interface for providing customizable information in designing electronic circuits with electrical awareness in some embodiments.
Figure 6:
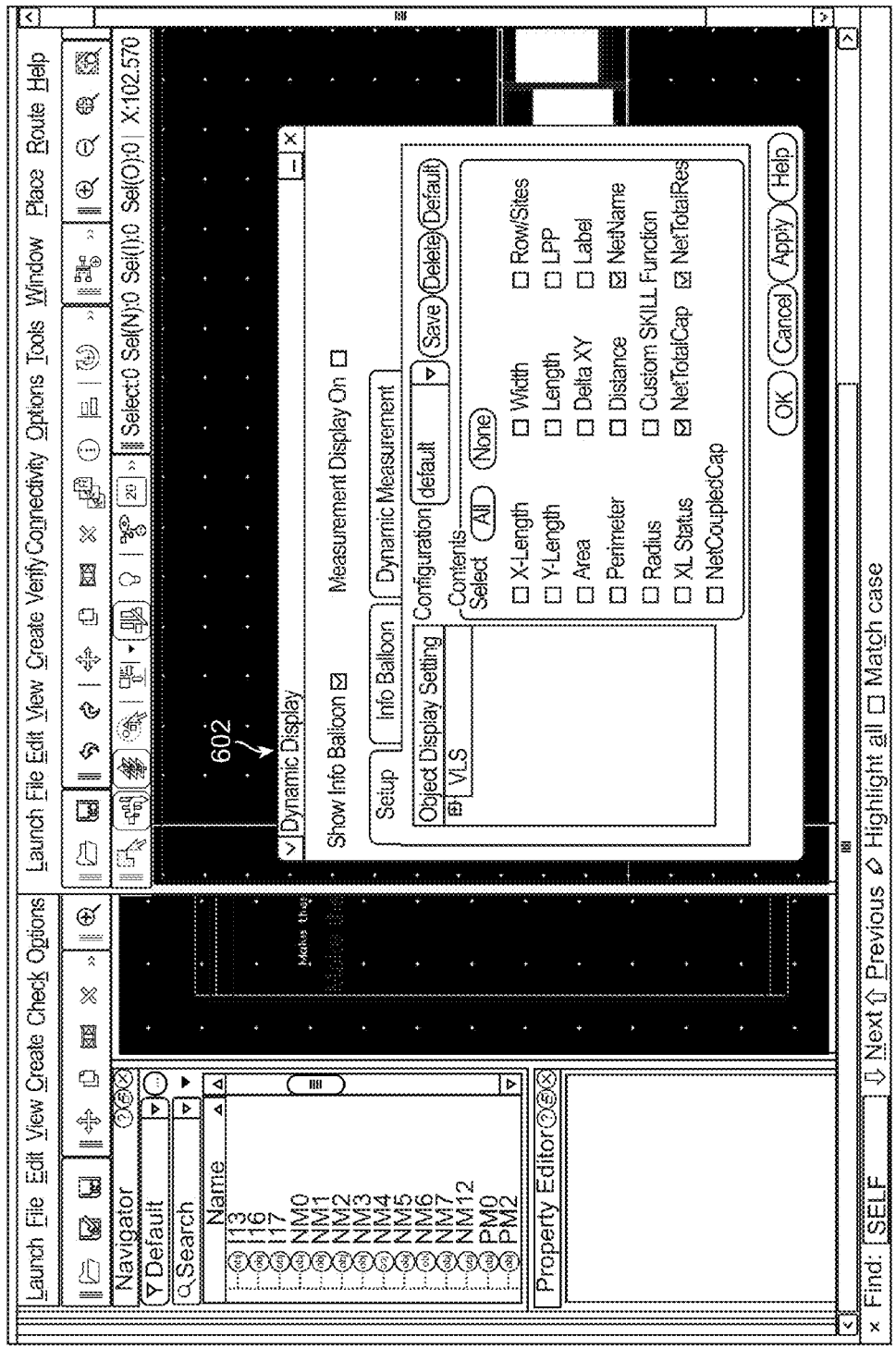

FIG. 5-27 illustrate various user interface screen shots to demonstrate various functionalities for providing in situ, real-time, customizable information in designing electronic circuits with electrical awareness. More particularly, FIG. 5 illustrates a portion of a layout 504 in a physical design display portion 502 and various menu items 506 of the user interface. FIG. 6 illustrates a physical design display portion content control dialog box 602 where the user may select, for example, whether information balloons are going to be shown or whether measurement display is to be shown. The control dialog box 602 also provides customizable contents for the physical design display portion. For example, a user may choose whether or not to display certain physical data of components (e.g., X-Length, Y-Length, Width, Area, Length, Label of the component, Perimeter, Radius, etc.) The user may also customize the display to show capacitance(s) (e.g., total capacitance of a net, coupling capacitance between one net and another net, etc.), resistance (e.g., the total resistance of a net, etc.), or other electrical parasitics.

Figure 7:
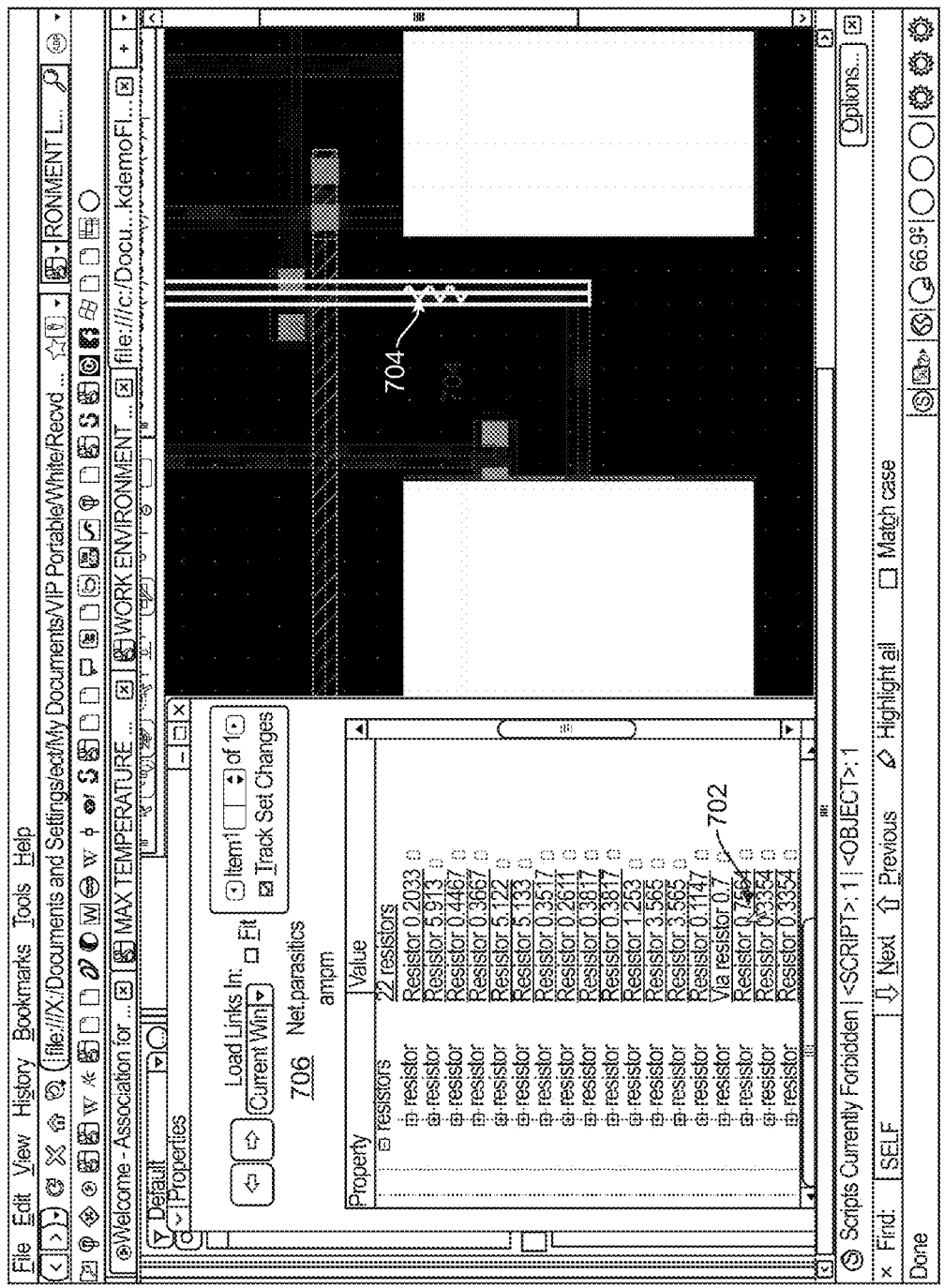

FIG. 7 illustrates a user interface in which some physical components of a portion of a physical design is shown in the physical design display portion of a layout editor. More specifically, the user interface illustrated in FIG. 7 further shows a list of electrical parasitics in a dialog box 706 which lists, for example and among other items, a collapsible tree of resistors. The collapsible parasitics tree of resistors lists a plurality of resistors at the first level, and each resistor listed under the collapsible parasitics tree may be further expanded to show further information.

In addition, the collapsible parasitics tree is associated with a summary of the tree which may comprise, for example but not limited to, the total number of resistors in the portion of the physical design. Furthermore, each resistor listed in the collapsible parasitics tree is also associated with a summary which comprises, for example but not limited to, the resistance value of the particular resistor. Moreover, each resistor may be associated with other information. For example, a particular resistor may be associated with the physical data such as material, length, width, temperature, locations, etc. such that the user or the system may manipulate the resistor by changing the physical data. For example, in some embodiments where an electro-migration analysis is performed and found that the maximum current through a particular wire segment exceeds the maximum allowable limit, the system or the user may alter a width of the wire segment to meet the maximum allowable current limit by, for example, dragging the wire 704 to increase its width or changing the value of the width to perform automatic or assisted fix of the electro-migration violation based on a hint or recommendation provided by the system.

In some embodiments when a user clicks on or moves a user interface cursor (e.g., a mouse cursor) over a particular resistor 702, this particular resistor becomes highlighted (for example, in red) and the corresponding component or a portion thereof is also highlighted (for example, in white as show in the physical design display portion). Moreover, a resistor symbol 704 may be shown while providing connectivity information for this particular resistor. In some embodiments, a user may click on or move the user interface cursor over a particular component or a portion thereof 704 in the physical design display portion, and the corresponding resistor in the collapsible parasitics tree may be shown as highlighted (for example, in red). In this manner, a user may easily identify or manipulate the layout even down to the individual component level.

Figure 8:
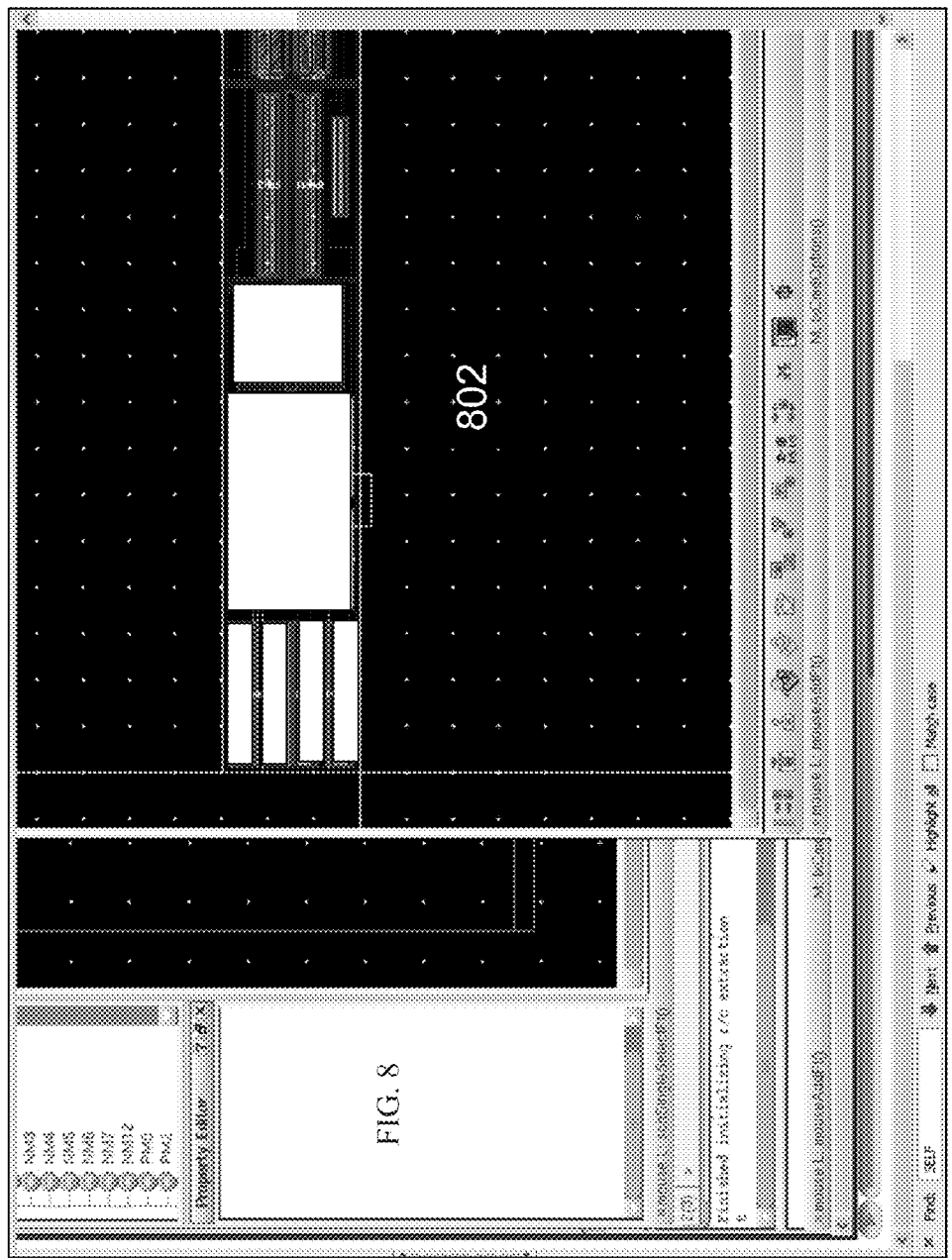
Figure 9:
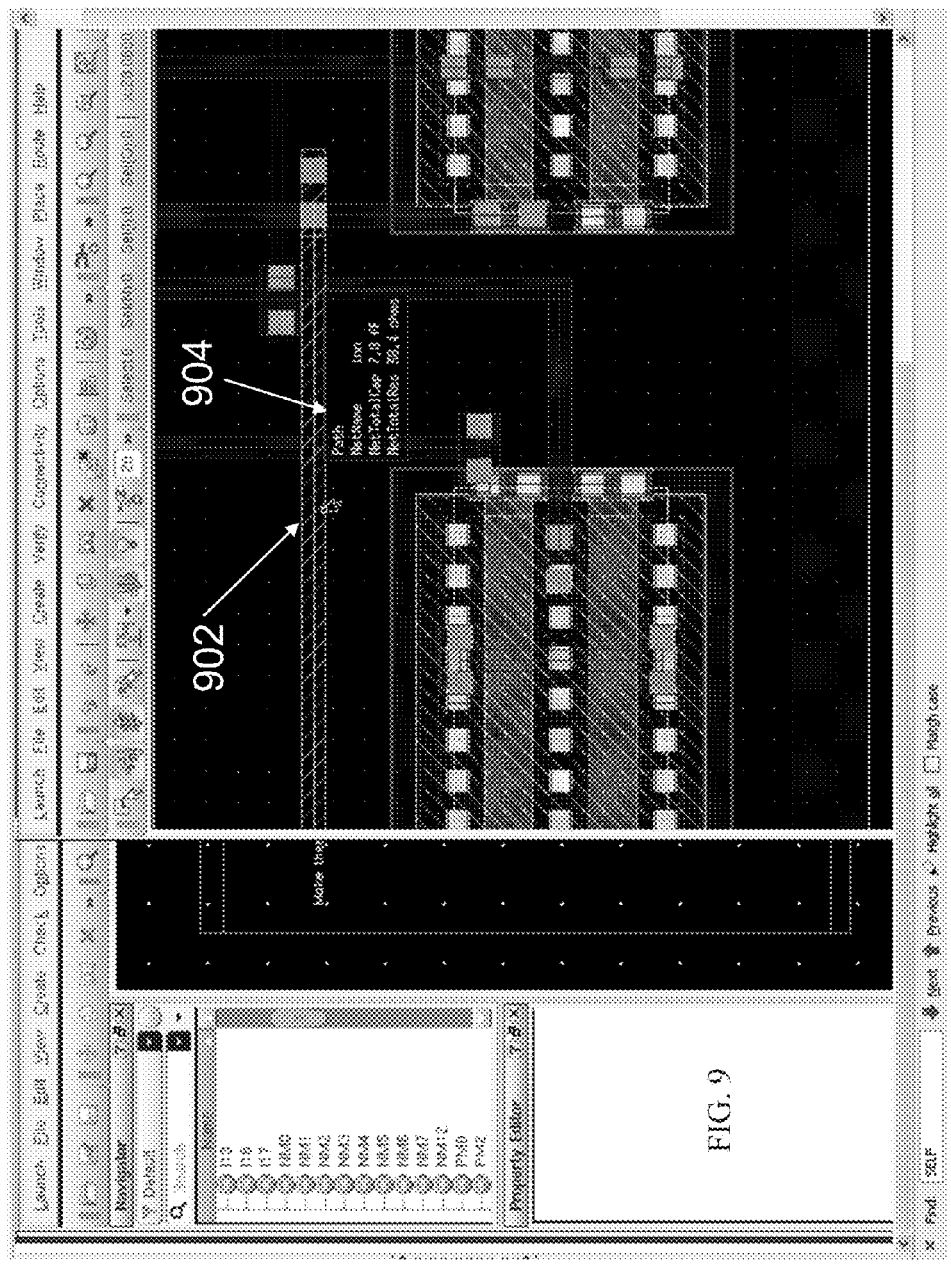

FIG. 8 illustrates a user interface showing a portion of a physical design in the physical design display portion where a user defines an area of interest 802. FIG. 9 illustrates the zoomed in view of the area of interest in FIG. 8. FIG. 9 further illustrates that a user clicks on or move the user interface cursor over a component 902, and the system's automatic response 904 to the user's manipulation of the physical design by showing the component in a cross hatch pattern, the path of the component, the name of the net to which the component belongs. FIG. 9 also illustrates that the system's automatic response to the user's manipulation of the physical design by showing some electrical parasitics, for example the net total capacitance, and the net total resistance that are associated with the component.

Figure 10:
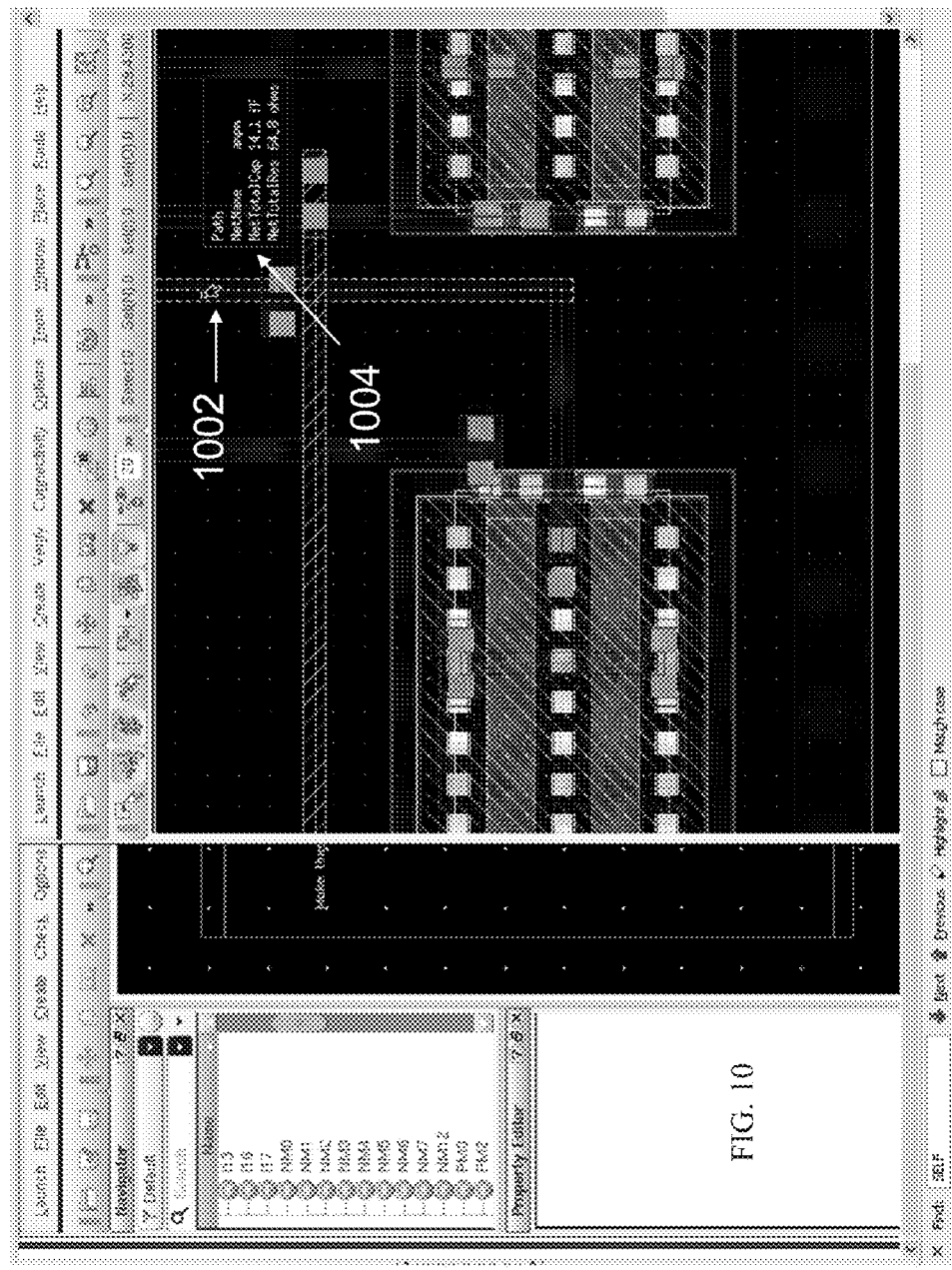

FIG. 10 also illustrates the zoomed in view of the area of interest in FIG. 8. Similar to FIG. 9, FIG. 10 also illustrates that a user clicks on or move the user interface cursor over a component 1002, and the system's automatic response 1004 to the user's manipulation of the physical design by showing the component in a cross hatch pattern, the path of the component, the name of the net to which the component belongs. FIG. 10 also illustrates that the system's automatic response to the user's manipulation of the physical design by showing some electrical parasitics, for example the net total capacitance, and the net total resistance that are associated with the component.

Figure 11A:
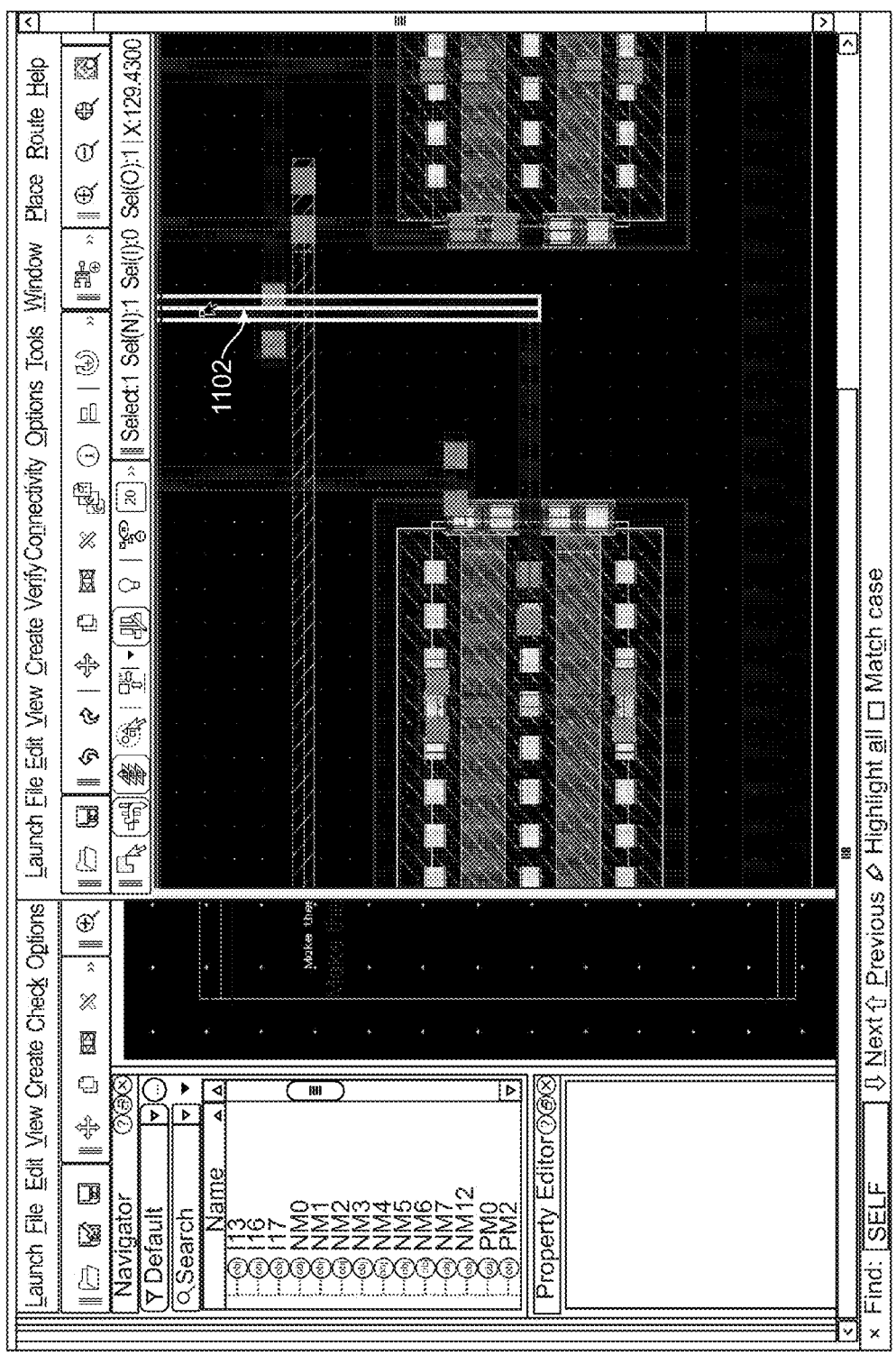
Figure 11B:
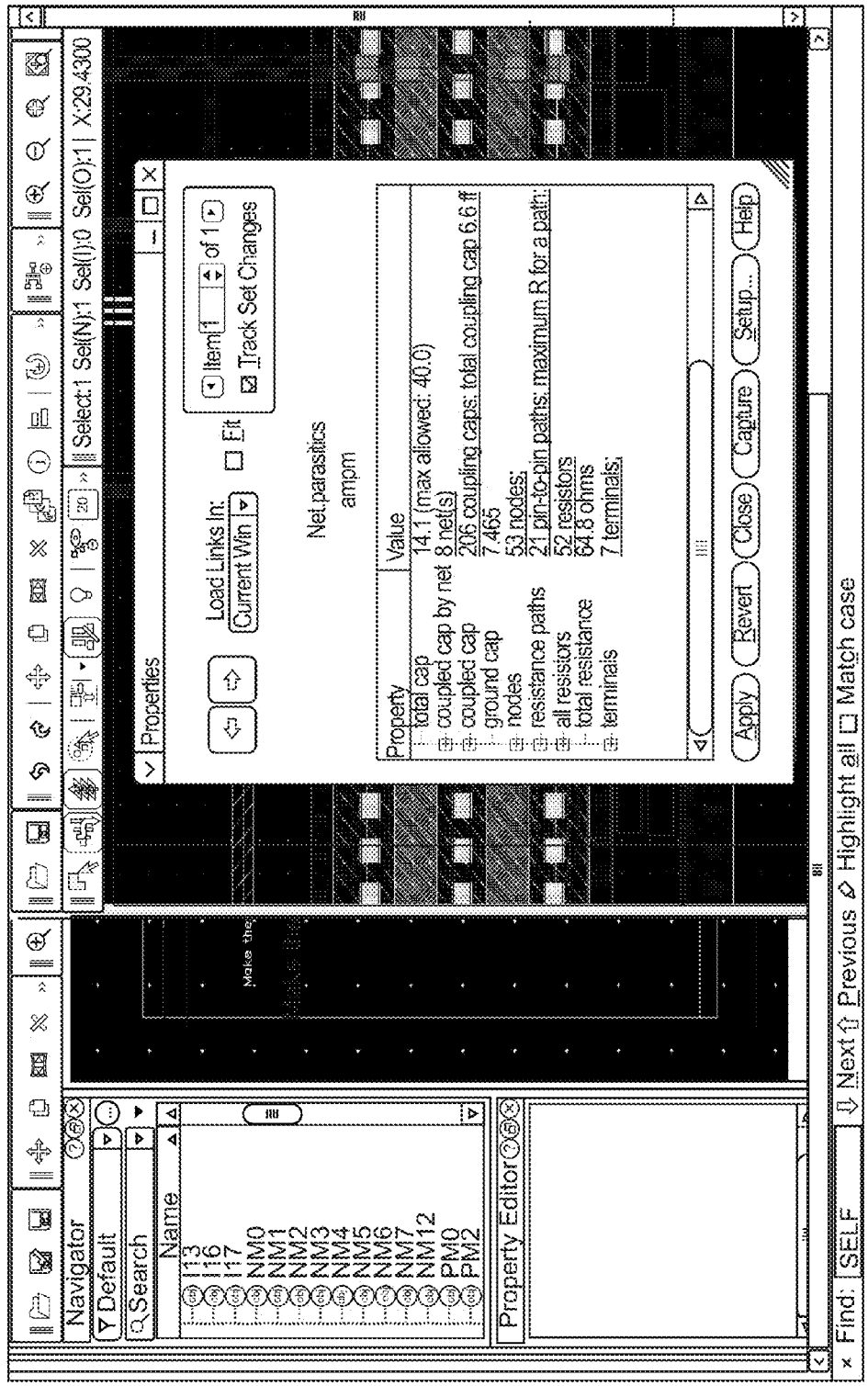
Figure 12:
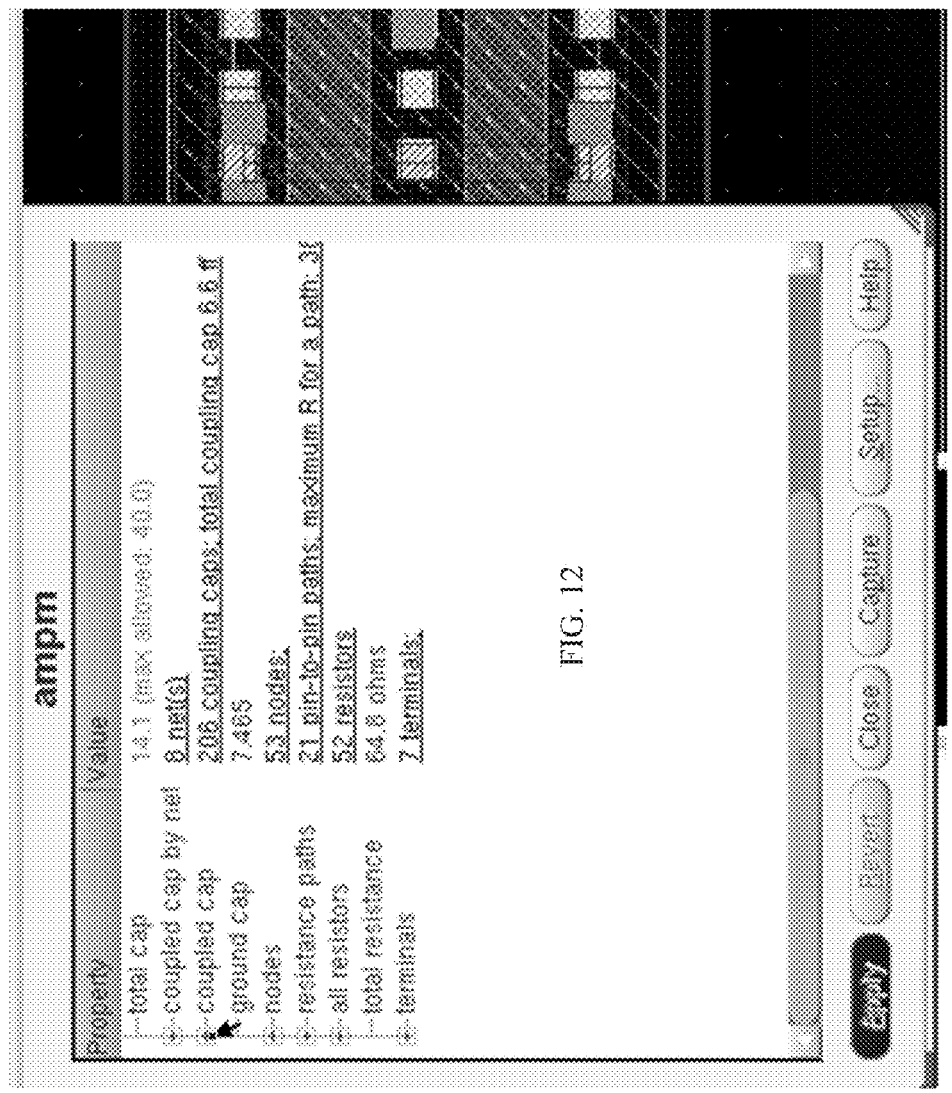

FIGS. 11A-B illustrate a user's selection or identification of a component 1102 and the system's response to the user's manipulation of the physical design by showing the parasitics dialog box. FIG. 12 illustrates further details of the dialog box as shown in FIG. 11B. In some embodiments, the dialog box in response to the user's manipulation of the physical design further lists, for example but not limited to, the total capacitance, the coupled capacitance by net with associated net(s), the coupled capacitance with associated capacitors, the ground capacitance, the number of nodes, the resistance paths with maximum resistance information and the number of pin-to-pin paths, the number of resistors, the total resistance, or the number of terminals that are associated with the selected or identified by the user. As it may be seen from FIG. 12, the dialog box presents the information or data in one or more collapsible trees, where each of the coupled capacitance by net, coupled capacitances, the nodes, the resistance paths, the all resistors, and the terminals constitutes a collapsible tree. FIG. 12 also illustrates that the user move the user interface cursor to the "coupled capacitances" to click on the "+" symbol to expand the tree. The result of the expanded tree of the "coupled capacitances" tree is shown in FIG. 13.

Figure 13:
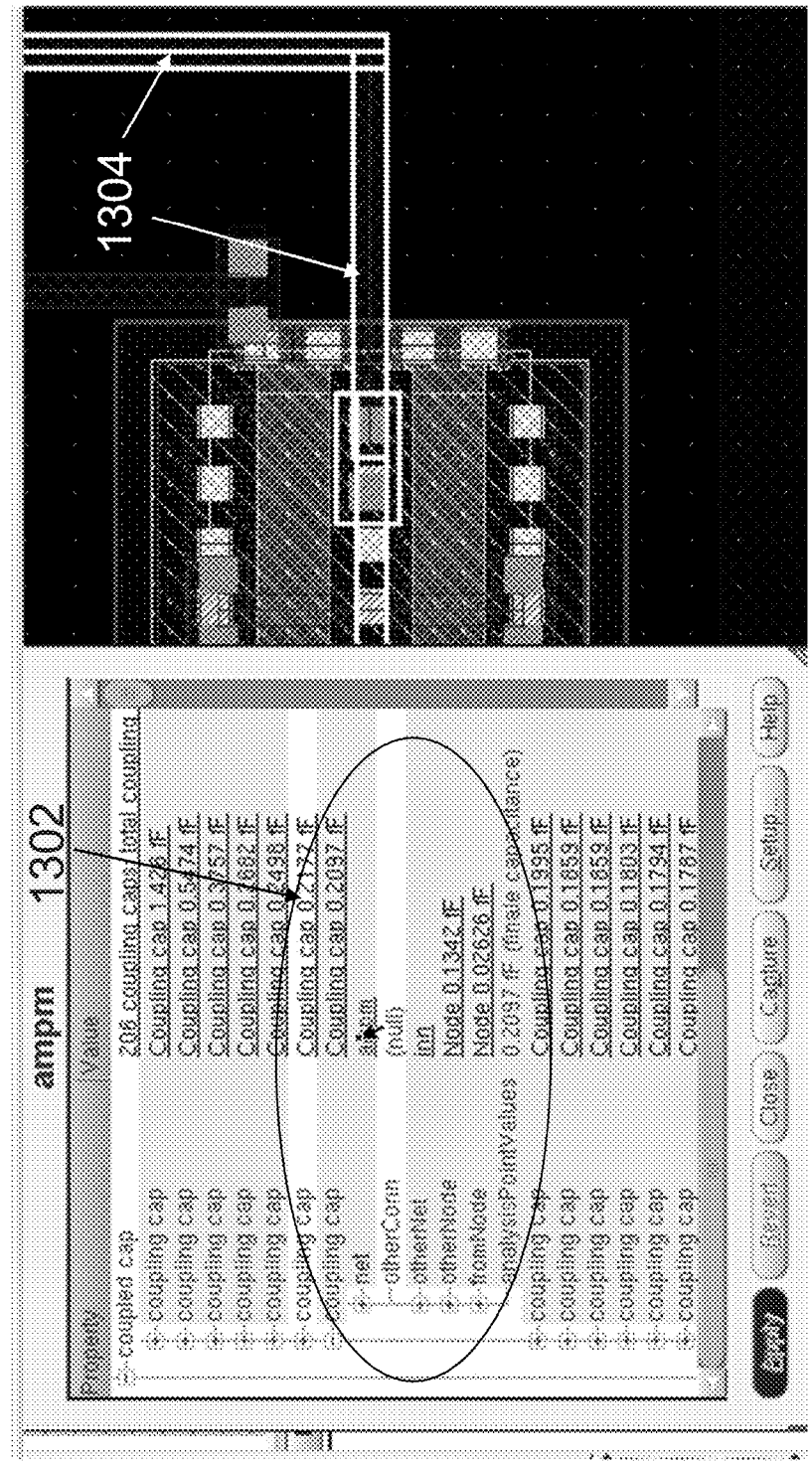

FIG. 13 illustrates the result of the expanded tree of the "coupled capacitances" tree of FIG. 12. Furthermore, FIG. 13 illustrates a list of coupling capacitances, each of which may constitute a collapsible tree with one or more levels in some embodiments. FIG. 13 further shows that when the user expands a particular coupling capacitance 1302, the corresponding components 1304 in the physical design display portion are highlighted (for example, in white). As shown in FIG. 13, this particular capacitance is associated with the net with a name of the net, other nets, other node(s), from node, and the analysis value of the capacitance value (0.2097 fF in this example.)

Figure 14:
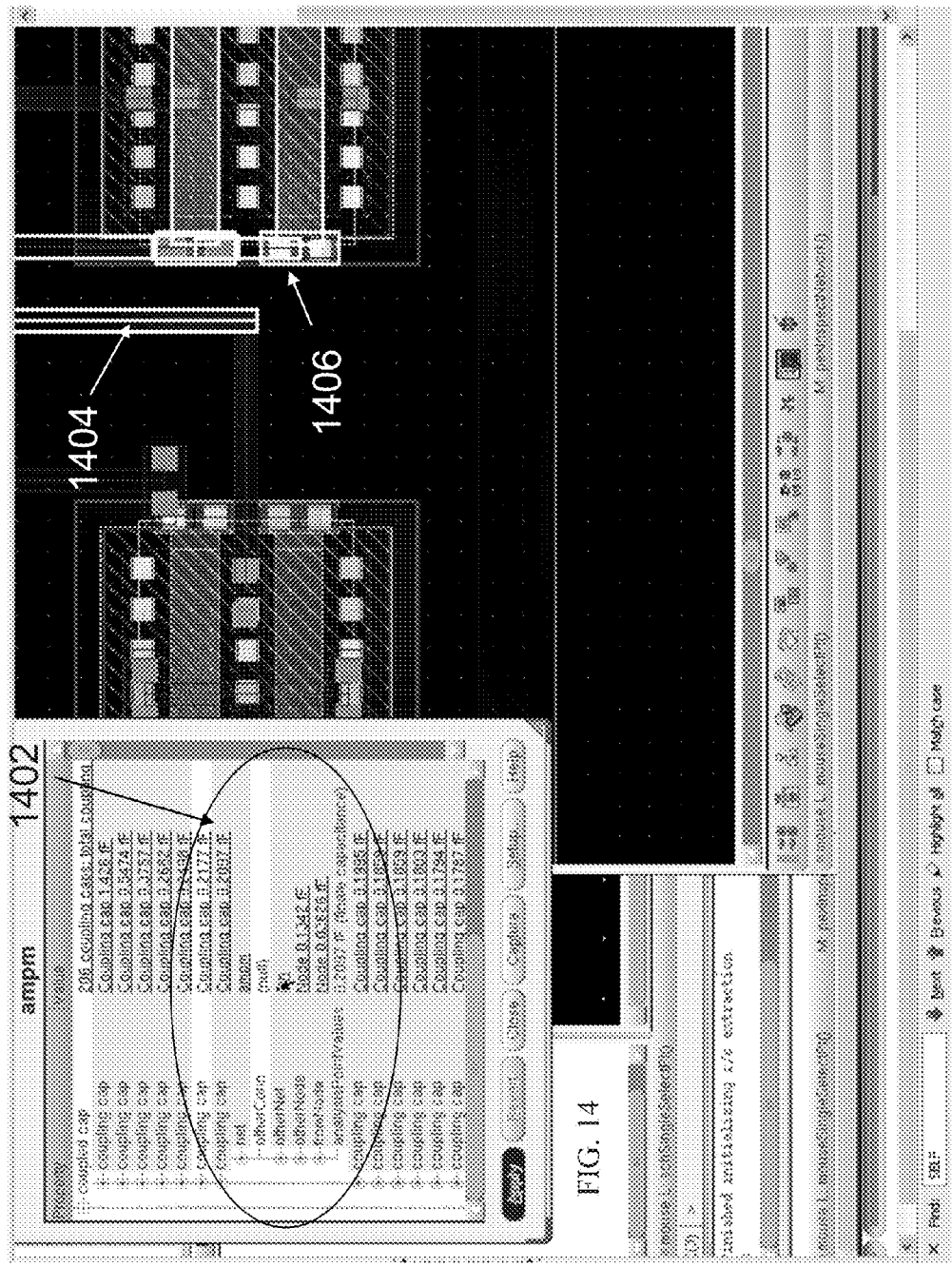

FIG. 14 illustrates further illustrates the interactive feature of the user interface whether the user clicks on or move the user interface cursor over "OtherNet" 1402 in the dialog box to show which net causes the coupling capacitance with the selected or identified net of interest 1404. As it can be seen from this example as illustrated in FIG. 14, the system highlights the net(s) 1406 that have caused coupling capacitance with the net of interest 1404. In this example, the "OtherNet" comprises a collapsible tree which has not been expanded to show individual net that has caused coupling capacitance with the net of interest 1404. As a result, all the nets that have caused coupling capacitance with net of interest are highlighted in the physical design display portion. Moreover, it shall be noted that in the example as illustrated in FIG. 14, the physical design display portion has been expanded either automatically or with assistance to show the nets 1406 that have caused coupling capacitance with the net of interest 1404.

Figure 15:
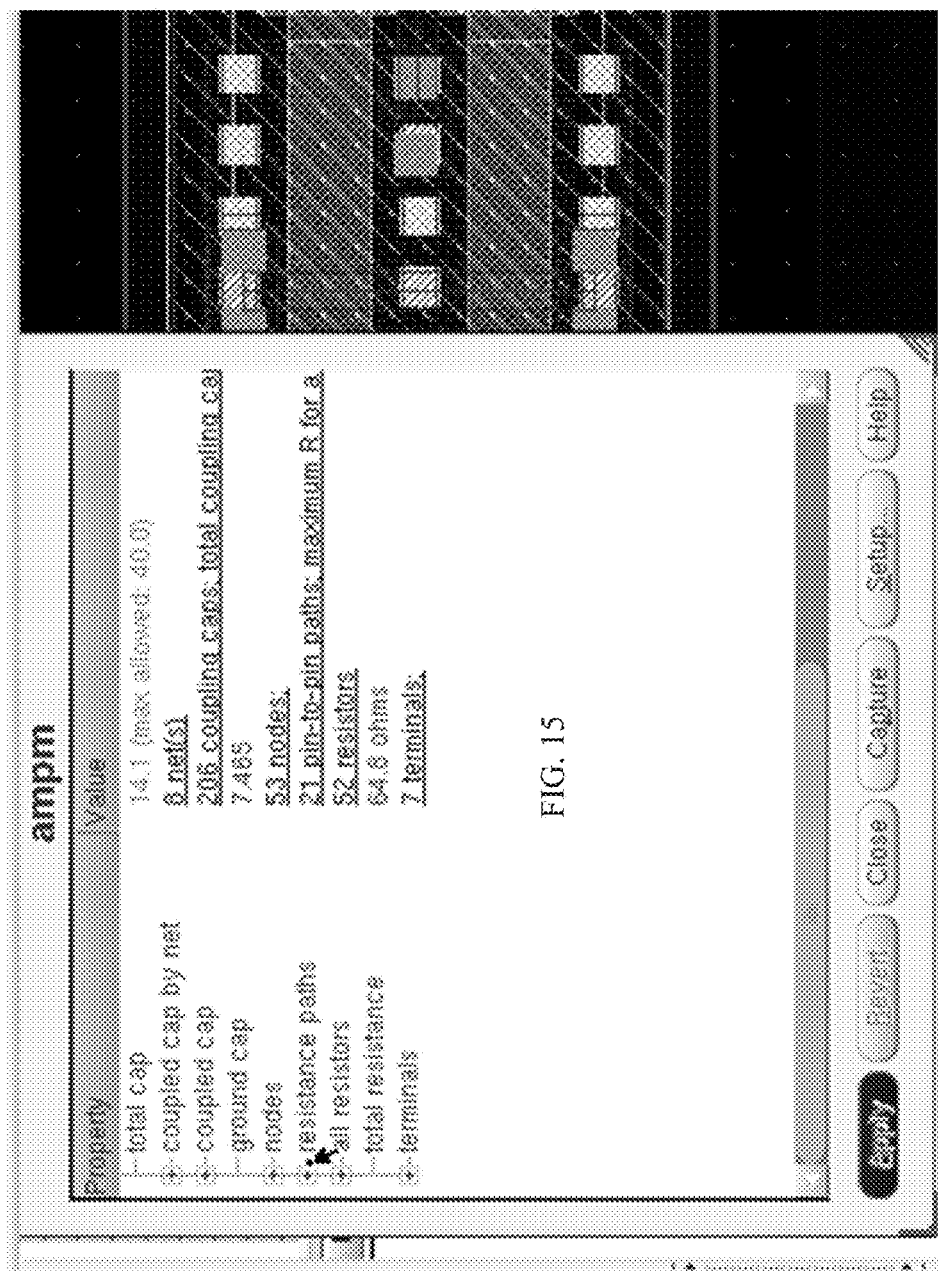
Figure 16:
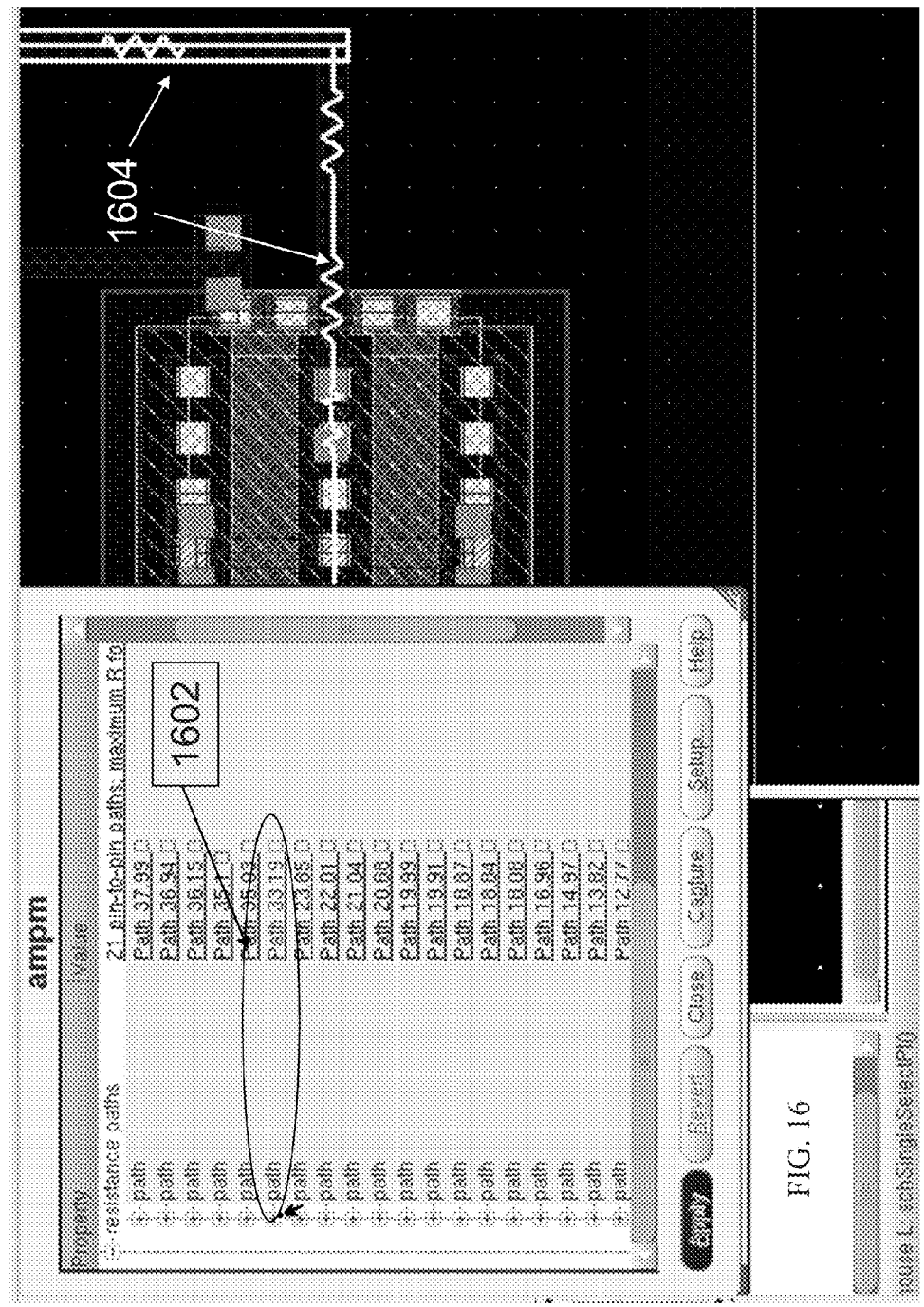

FIG. 15 further illustrates a similar dialog box as that in FIG. 12 which illustrates further details of the dialog box as shown in FIG. 11B. Moreover, FIG. 15 shows that the user moves the user interface cursor to "resistance paths" in an attempt to expand the collapsible tree for "resistance paths". The expanded "resistance paths" is illustrated in FIG. 16. FIG. 16 illustrated the first level of content of the collapsible tree for "resistance path" as shown in FIG. 15. More specifically, FIG. 16 illustrates that the user clicks on or moves the user interface cursor over a particular path 1602. In response to the user's manipulation of the physical design, the system highlights (in red in this example) the path 1602 in the dialog box, highlights (in white in this example) the paths in the physical design display portion, and display the path with a plurality of resistor symbols 1604 along the path at the location to indicate where the resistance may be captured. In some embodiments, the user may similarly click on or move the user interface cursor over a particular component in the physical design display portion. In response to the user's manipulation of the physical design, the system highlights the path in the physical design display portion, represents the path with one or more resistor symbols, and highlights the path in the dialog box.

Figure 17:
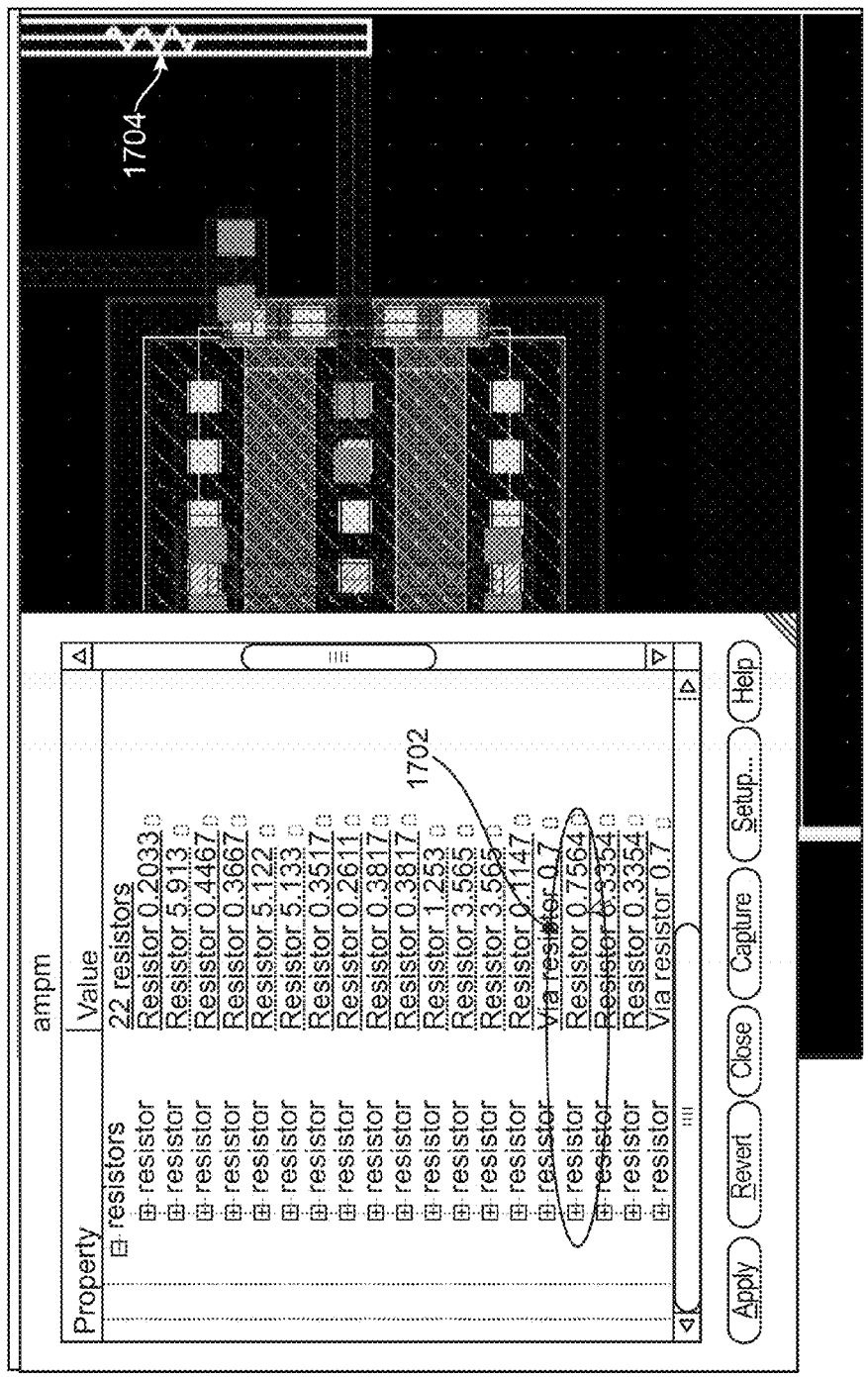

FIG. 17 similarly illustrates the first level of content of the collapsible tree for "resistance path" as shown in FIG. 15. More specifically, FIG. 17 illustrates that the user clicks on or moves the user interface cursor over a particular path 1702. In response to the user's manipulation of the physical design, the system highlights (in red in this example) the path 1702 in the dialog box, highlights (in white in this example) the paths in the physical design display portion, and display the path with a resistor symbol 1704 along the path at the location to indicate where the resistance may be captured. In some embodiments, the user may similarly click on or move the user interface cursor over a particular component in the physical design display portion. In response to the user's manipulation of the physical design, the system highlights the path in the physical design display portion, represents the path with one or more resistor symbols, and highlights the path in the dialog box.

Figure 18:
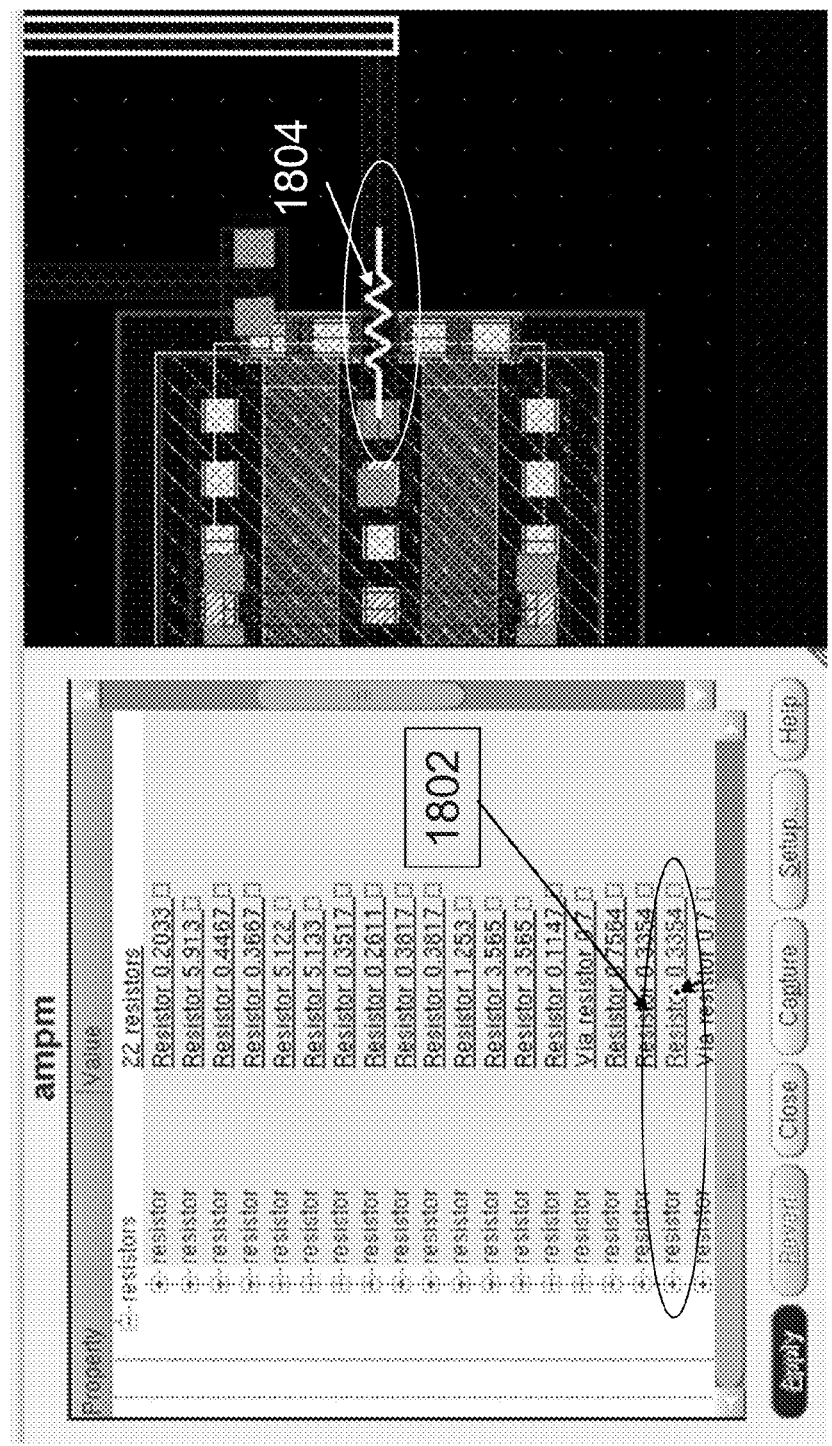

FIG. 18 similarly illustrates the first level of content of the collapsible tree for "resistance path" as shown in FIG. 15. More specifically, FIG. 18 illustrates that the user clicks on or moves the user interface cursor over a particular path 1802. In response to the user's manipulation of the physical design, the system highlights (in red in this example) the path 1802 in the dialog box, highlights (in white in this example) the path(s) in the physical design display portion, and display the path with a resistor symbol 1804 along the path at the location to indicate where the resistance may be captured. In some embodiments, the user may similarly click on or move the user interface cursor over a particular component in the physical design display portion. In response to the user's manipulation of the physical design, the system highlights the path in the physical design display portion, represents the path with one or more resistor symbols, and highlights the path in the dialog box.

Figure 19:
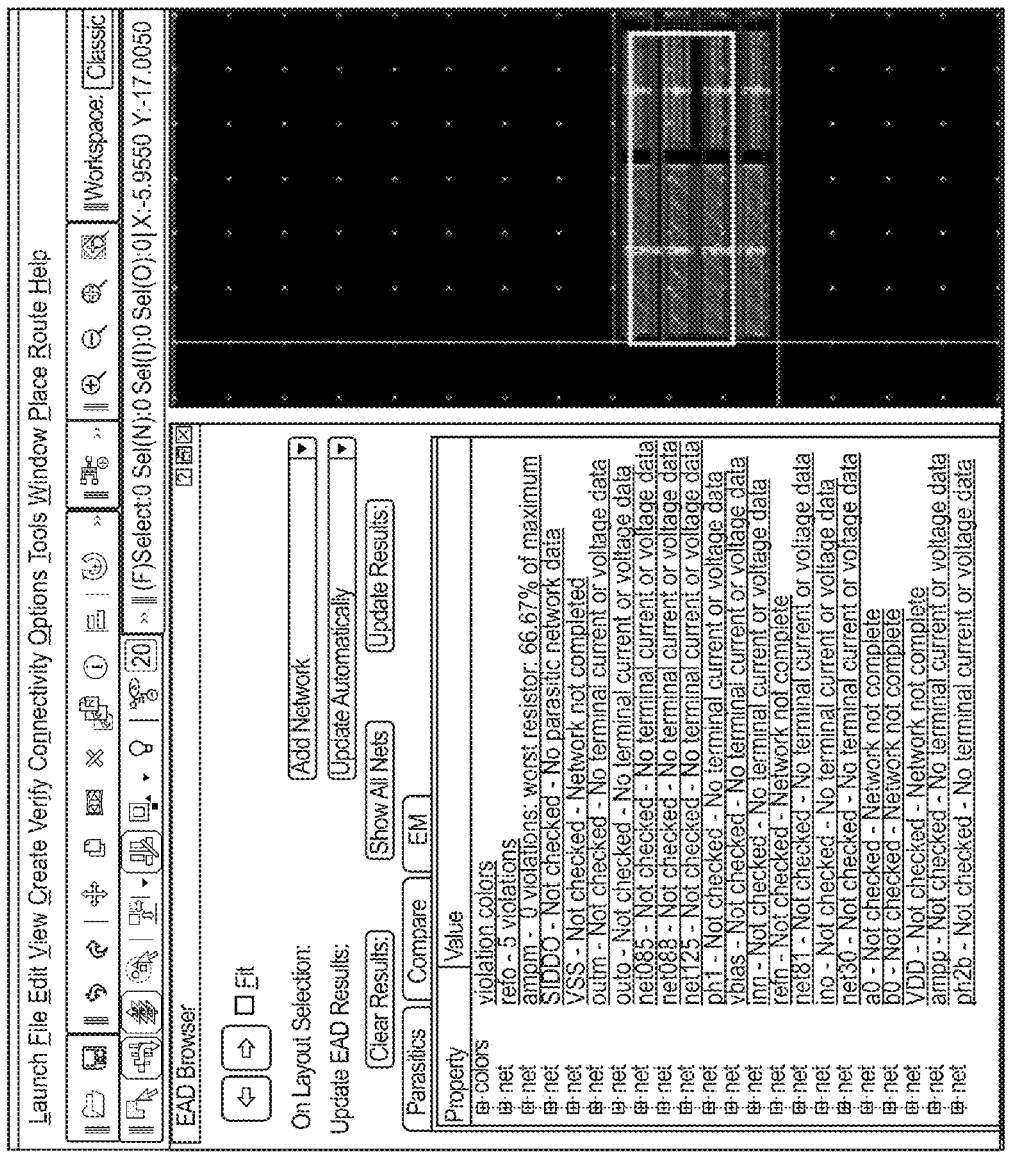
Figure 20:
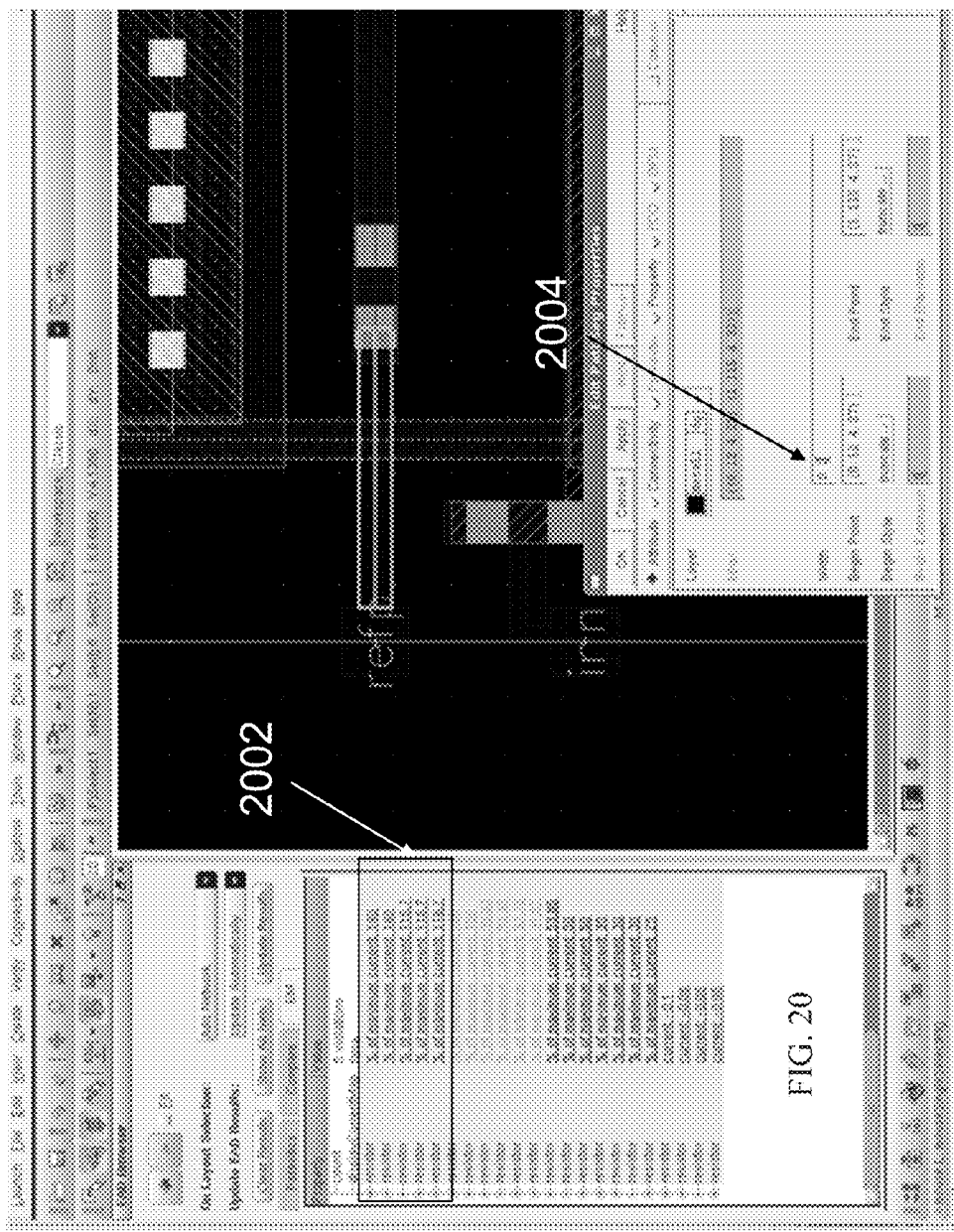

FIG. 19 illustrates the in situ, real-time constraint verification or compliance check result display capability of the user interface in some embodiments. More particularly, the EAD browser display portion shows one or more collapsible trees for electro-migration analysis results, one of which indicates that there are five violations and is highlighted in red. The right-hand side of the user interface display the portion of the physical design. FIG. 20 illustrates the expanded view of the collapsible tree indicating the five violations. More particularly, FIG. 20 shows the first level of content of the collapsible tree indicating the five violations 2002 in the left-hand side of the user interface. As it can be seen from the example as illustrated in FIG. 20, each of the five violations is associated with brief description of the violation. In this instant example, all five resistors are indicated as violations because the percentage of the maximum current is over 100% of the maximum allowable current in each resistor. It shall be further noted that each of the first level items in the collapsible tree may be further expanded as previously discussed to display further information for interaction purposes. FIG. 20 further shows that the resistors through which the respective maximum current is over 100% of the maximum allowable current are all shown in red; the resistors through which the respective maximum current is between, for example, 90% to 100% of the maximum allowable current are all shown in orange; and the resistors through which the respective maximum current is 50% or less of the maximum allowable current are all shown in blue. It shall be noted that the thermal map display of various resistors carrying different maximum currents do not necessarily have to be displayed in this color arrangement, and that the above thermal map is used as an example to explain and illustrate the capabilities of the user interface. Moreover, FIG. 20 further shows a dialog box which provides the user with the ability to change the physical data of a specific component. In this example, the dialog box presents the user with the option of entering different width value 2004 for a particular resistor. The user may enter a different width value, and the system will determine whether the entered value complies with the electro-migration constraint automatically. The system may also provide hints, suggestions, or recommendations to the user via similar means so the user may know how to fix the violations in some embodiments.

Figure 21:
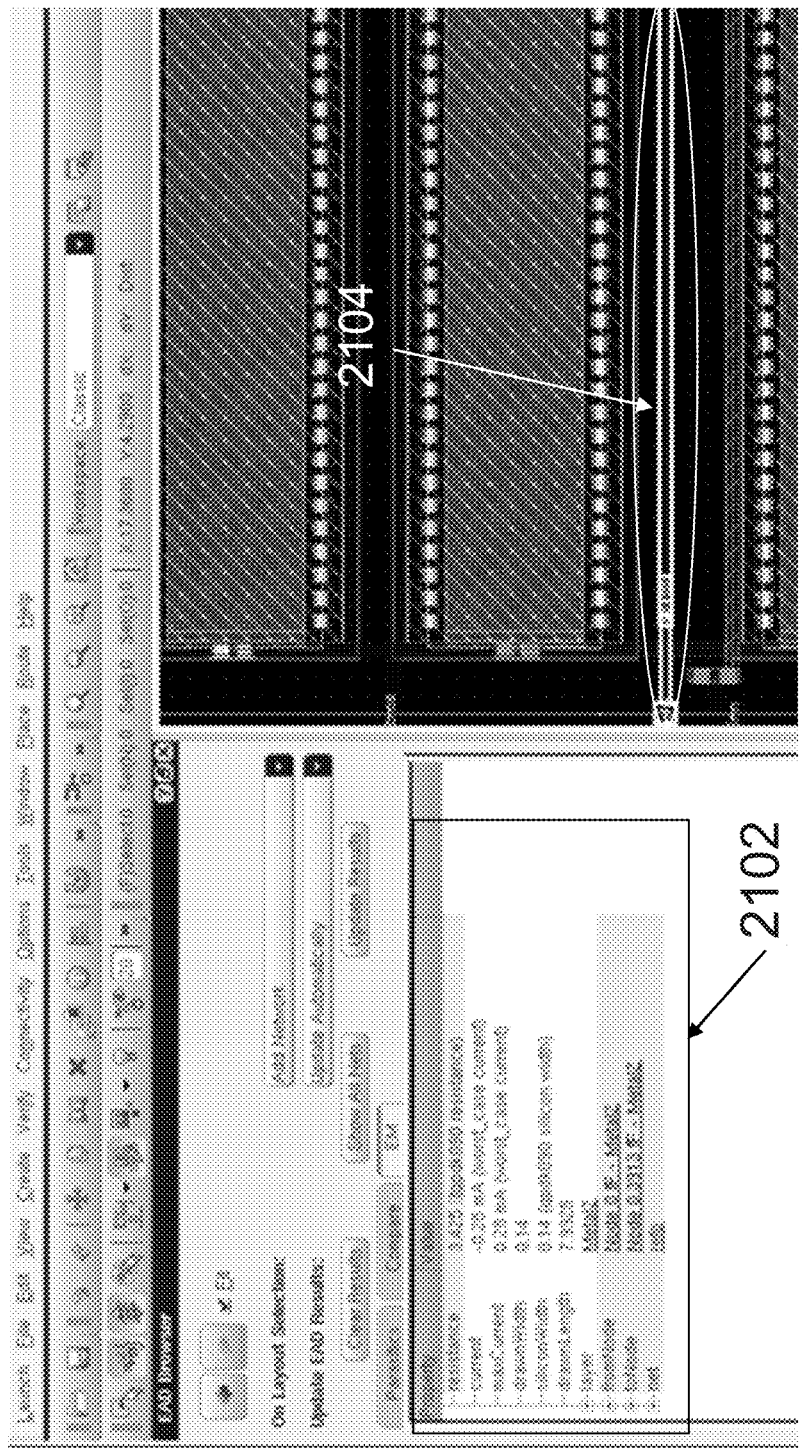

FIG. 21 illustrates the expanded view of a collapsible tree of a component for the in situ, real-time constraint verification or compliance check (e.g., electro-migration analysis) result display capability in the EAD browser of the user interface in some embodiments. More specifically, FIG. 21 shows that the user clicks on a particular component in the EAD browser to expand its contents into one or more sublevels, some of which may be further expanded (2102). In this example, the information or data associated with the component 2104 may comprise some electrical parasitics of the component (e.g., the resistance of the component, etc.), the electrical characteristics of the component (e.g., the current, the maximum current flowing through the component), or some physical data of the component (e.g., the drawn width of the component, the width on silicon, the drawn length, the starting node of the component, the end node of the component, the layer or net to which the component belongs, etc.) as shown in 2102.

FIG. 21 also shows that the corresponding component in the physical design display portion of the user interface is highlighted (204) in response to the user's manipulation of the physical design. FIG. 21 further illustrates various design editing functions provided by the user interface in some embodiments. For example, the user interface provides a user with the capability to select layout(s), to add network(s), to determine the system will update the physical design with all or some of the physical data, electrical parasitics, or electrical characteristics. As another example, FIG. 21 further illustrates that the user interface provides the options to the user to compare various characteristics of two or more components (e.g., nets).

Figure 22:
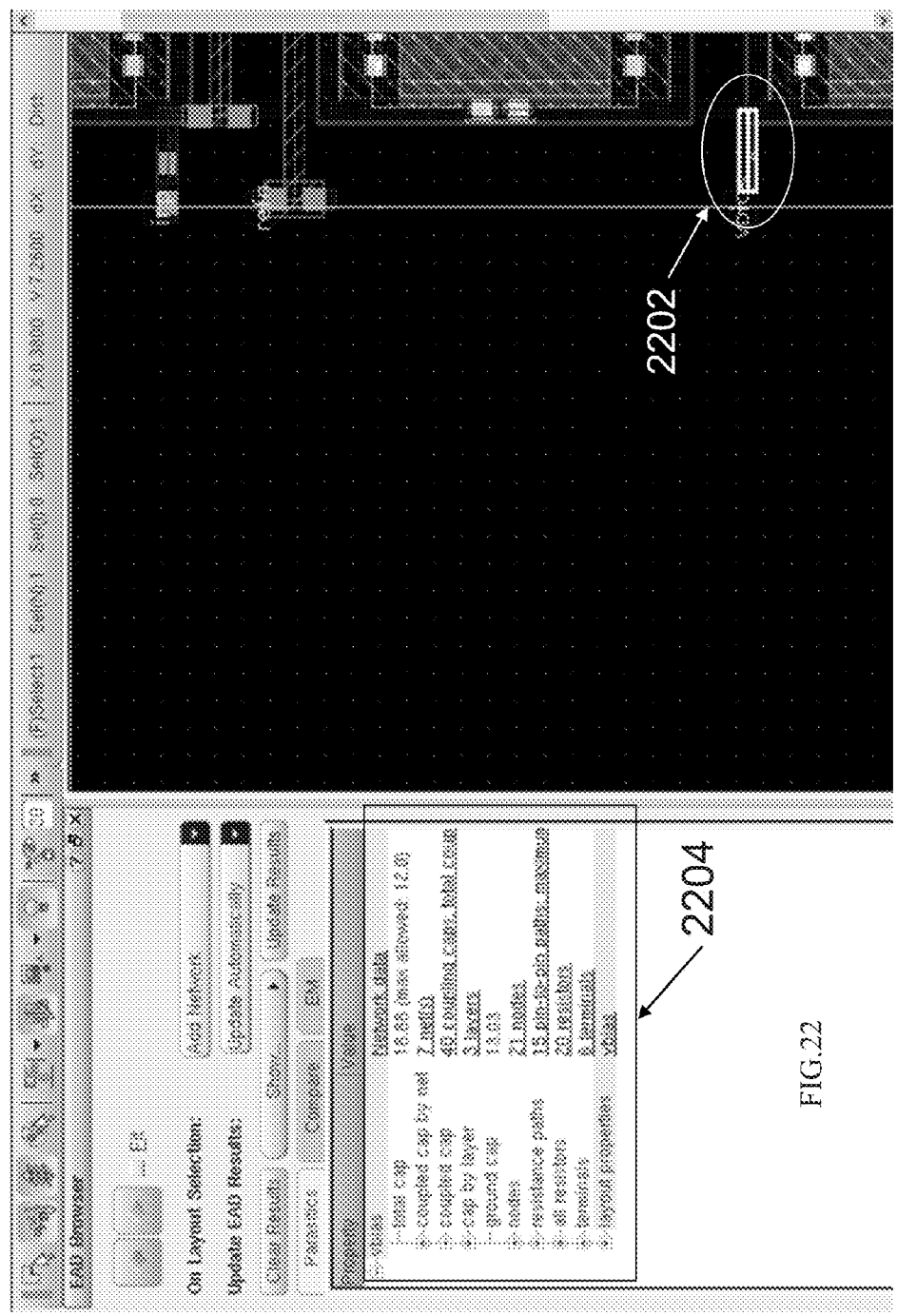

FIG. 22 illustrates the in situ, real-time, and interactive parasitics display capability of the user interface of a physical level electronic circuit design tool in some embodiments. In this example, the user interface shows detailed information of a component that results in a total capacitance over the maximum allowable limit. In this embodiment, the violation is also highlighted in red in the EAD Browser, whereas the remaining data or information that does not cause issues or problems is shown in blue. In addition, in response to the user's expansion of the particular collapsible tree showing a parasitic constraint verification result in 2204, the component 2202 associated with the parasitic constraint verification result is highlighted (for example, in white) as shown in 2202 in the physical design display portion.

In this example, the EAD browser window further shows various data or information that comprises, for example but not limited to, the total capacitance, the coupled capacitance by net, the coupled capacitances, the capacitance by layer, the ground capacitance, the nodes, the resistance paths, the number of resistors, the number of terminals, etc. Moreover, each of the above items of information or data is associated with a description or descriptive value, and some of the above items of information or data may be further expanded to display additional information or data.

Figure 23:
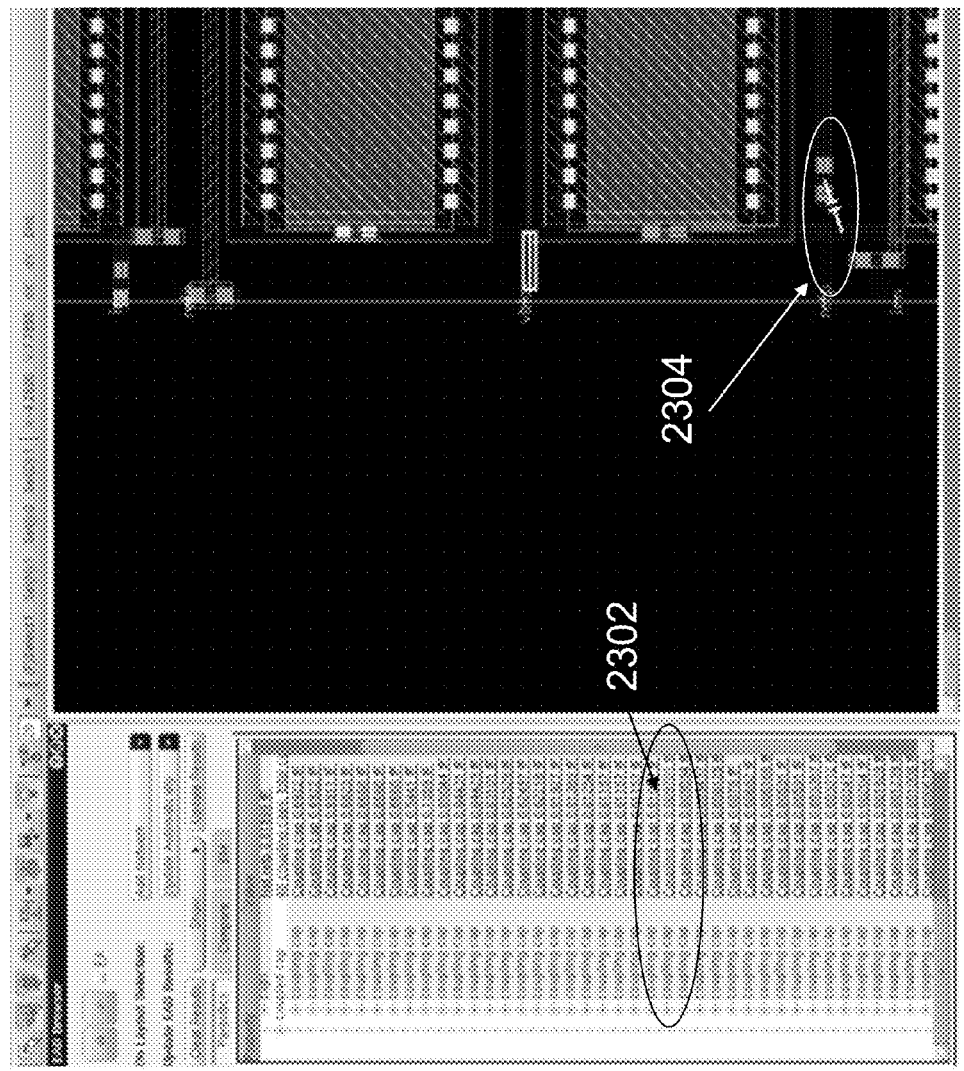

FIG. 23 illustrates the further expanded view of the "coupled cap" item which comprises a plurality of coupling capacitances, some or all of which may be further expanded to show additional information or data. In this example, a coupling capacitance is identified and highlighted in red and is associated with a description of 0.009701 fF as shown in 2302. The "coupled cap" collapsible tree is also associated with a brief description of the total number of capacitances and the total coupling capacitance.

In addition, when a particular coupling capacitance is identified in the EAD browser window, the corresponding component that causes the coupling capacitance is highlighted and is represented by a capacitance symbol in the physical design display portion of the user interface as shown in 2304.

Figure 24:
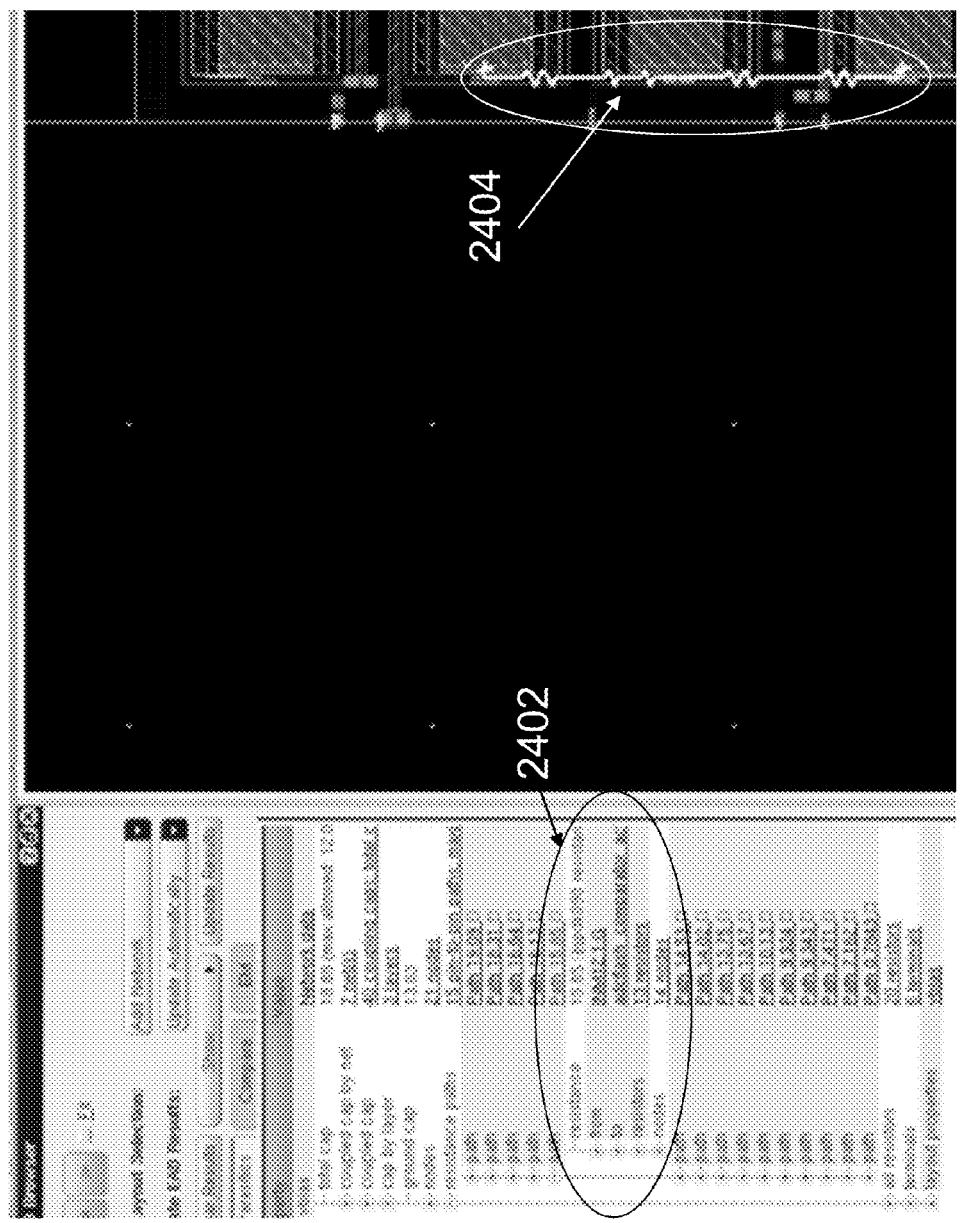

FIG. 24 illustrates the further expanded view of the "resistance paths" item which further comprises a plurality of paths, some or all of which may be further expanded to show additional information or data in some embodiments. In this example, a particular path is identified, expanded, and highlighted in red, for example, in 2402 (color not shown) in the EAD browser to show additional information about this particular path. In this example, the additional information comprises the resistance of the path, the from node and the to node of the path, the number of resistors identified along the path, or the number of nodes identified along the path. In some embodiments, the method or system described herein automatically show a graphical display for the resistance path (2404) in the GUI in response to the identification, expansion, or highlighting of the "resistance path" in the EAD browser (2402). In some embodiments, the method or system described herein automatically identifies, expands, or highlights the corresponding resistance paths in the EAD browser (2402) in response to the identification, expansion, or highlighting of the "resistance path" in the graphical display are (2402) such as a layout editor. It shall be noted that some or all of these additional pieces of information may be further expanded to show even more information or data. The GUI also allows the user to select two pins and then display the total resistance of the selected path.

In this example, the system automatically highlights the component(s) corresponding to the identified path and represents the path with a plurality of resistor symbols located in the vicinity of the locations where these resistors are captured or extracted in response to the identification of the particular path.

Figure 25:
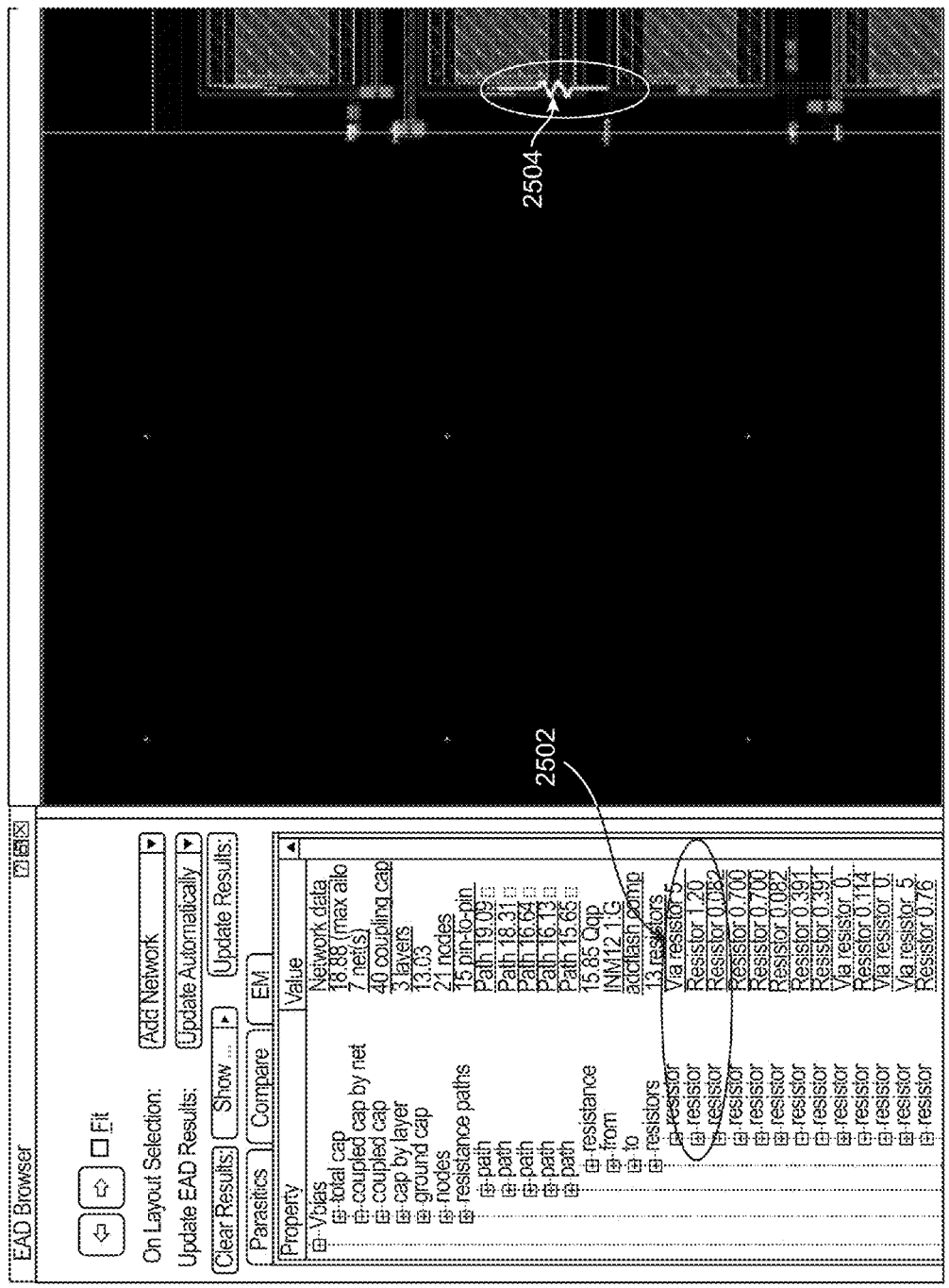

FIG. 25 illustrates the further expanded view of the "resistors" item under a particular "path" item in the "resistance paths" collapsible tree in some embodiments. More specifically, FIG. 25 illustrates that a particular resistor is identified and associated with a resistance of $1.207\Omega$ as shown in 2502, and that in response to the identification of the particular resistor, the system automatically highlights the corresponding component and represents the component with a resistor symbol 2504 in the vicinity of a location where the resistance is captured or extracted in the physical design display portion.

Figure 26:
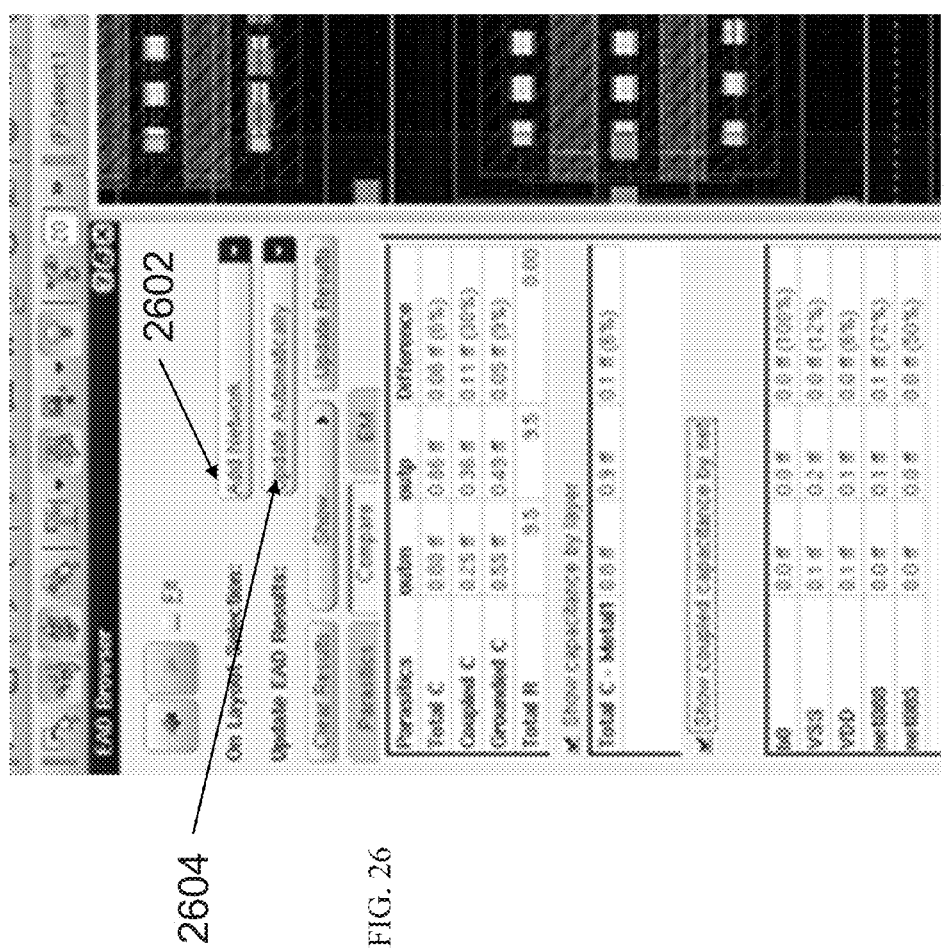

FIG. 26 illustrates the capability of the user interface in displaying parasitics comparison results of a plurality of nets in some embodiments. A user may add nets for comparison by selecting the nets from the "Add Network" pull down menu (2602). The user may also choose whether or not the comparison results are to be updated automatically by selecting the update method from the "Update Automatically" pull down menu (2604) in some embodiments.

Once the nets are identified, the EAD browser displays the parasitics of each net and the comparison results of the corresponding parasitics of the nets. In this example as illustrated in FIG. 26, two nets are identified, and the EAD browser shows the total capacitances of the net "outm" and "outp" and the difference therebetween, the coupled capacitances and the differences, the grounded capacitances and the differences, and the total resistances and the difference. The EAD browser further shows the total capacitance by layer, the coupled capacitance by net, and the respective differences.

Figure 27:
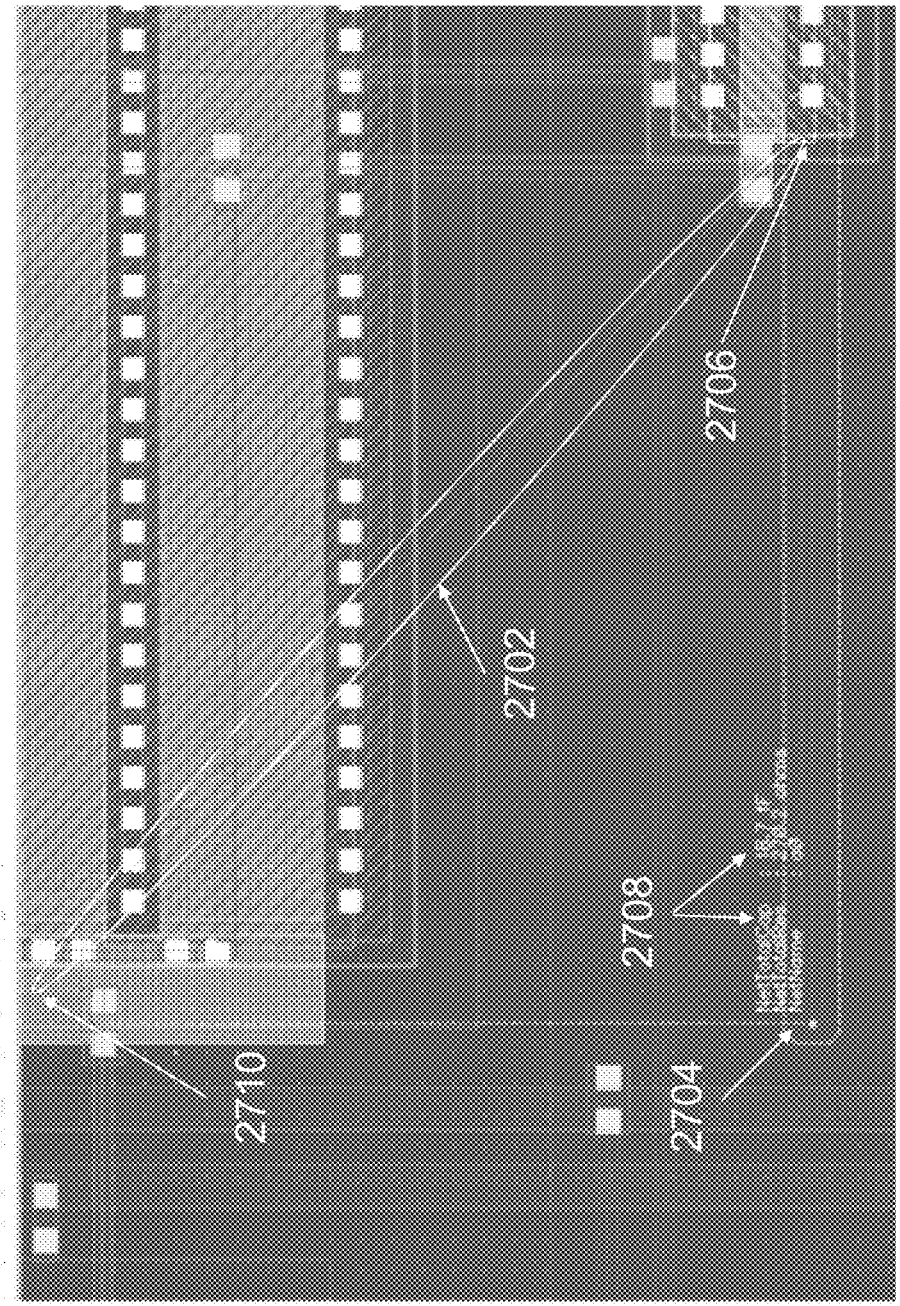

FIG. 27 illustrates the interactive and in situ display of various data or information related to a component in a physical design tool in some embodiments. FIG. 27 illustrates the routing of a net with the GUI providing real-time parasitic updates as the route is manipulated during creation. FIG. 27 illustrates that a user manipulates the a component 2704 by dragging the left end of 2704 in a physical design tool such as a layout editor. FIG. 27 further shows the user interface of the layout editor displays various data or information 2708 in situ and in substantially real-time. In this example, the system generates the balloon information in response to the user's manipulation of the physical design component (for example, dragging the component 2704), and the balloon information 2708 comprises, for example, the total capacitance, the total resistance, and the name of the net to which the component belongs.

Furthermore, in response to the user's manipulation of the component 2704 in the physical design, the system anticipates the end point of the user's modification to the component 2704 and determines and displays a flight line 2702 which starts from the node 2706 and ends at a anticipated end point 2710. In some embodiments, the flight line 2702 varies in response to the user's manipulation of the component 2704. That is, the end point 2710 of the flight line 2702 varies based on how the user modifies the component 2704 by, for example, dragging the component. In addition, as the user is modifying the component, the system automatically characterizes the changing physical data, the associated electrical parasitics, and the associated electrical characteristics, performs various constraint or physical data verification, and displays various information or data in response to the settings of the user interface.

Some embodiments related to the interactive routing example shown in FIG. 27 may also use the linear solver component described in U.S. patent application Ser. No. 12/982,762, entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS" to compute electrical characteristics (voltage(s), current(s), max current capacity, etc.) assuming the net terminates where the physical object is currently defined, for example the end of the wire 2704 in FIG. 27.

Some embodiments related to the interactive routing example shown in FIG. 27 may also use the linear solver component described in U.S. patent application Ser. No. 12/982,762, entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS" to compute electrical characteristics (voltage(s), current(s), max current capacity, etc.) assuming the net terminates with the object that intersects the flight line, for example 2710 in FIG. 27.

Some embodiments related to the interactive routing example shown in FIG. 27 may also use the linear solver component described in U.S. patent application Ser. No. 12/982,762, entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS" to compute electrical characteristics (voltage(s), current(s), max current capacity, etc.), compare that characteristic with a limit or constraint, and compute/display the percentage consumed toward the limit or constraint, assuming the net terminates where the physical object is currently defined, for example the end of the wire 2704 in FIG. 27.

Some embodiments related to the interactive routing example shown in FIG. 27 may also use the linear solver component described in U.S. patent application Ser. No. 12/982,762, entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS" to compute electrical characteristics (voltage(s), current(s), max current capacity, etc.), compare that characteristic with a limit or constraint, and compute/display the budget or surplus relative to the limit or constraint, assuming the net terminates where the physical object is currently defined, for example the end of the wire 2704 in FIG. 27.

Some embodiments related to the interactive routing example shown in FIG. 27 may also use the linear solver component described in U.S. patent application Ser. No. 12/982,762, entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS" to compute electrical characteristics (voltage(s), current(s), max current capacity, etc.), compare that characteristic with a limit or constraint, and compute/display the percentage consumed toward the limit or constraint, assuming the net terminates with the object that intersects the flight line, for example 2710 in FIG. 27.

Some embodiments related to the interactive routing example shown in FIG. 27 may also use the linear solver component described in U.S. patent application Ser. No. 12/982,762, entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS" to compute electrical characteristics (voltage(s), current(s), max current capacity, etc.), compare that characteristic with a limit or constraint, and compute/display the budget or surplus relative to the limit or constraint, assuming the net terminates with the object that intersects the flight line, for example 2710 in FIG. 27.

Interactive routing in the aforementioned examples can be achieved through manual, automatic or semi-automated or assisted routing operations. The results of the electrical characteristic comparison may be displayed or may also be used to suggest or automatically modify the physical design to correct the problem.

In some embodiments as illustrated in FIGS. 5-27, all operations are performed, and all information or data are determined and displayed in the same user interface without requiring the user to leave the electronic circuit design tool with which the user interface is associated.

Figure 28:
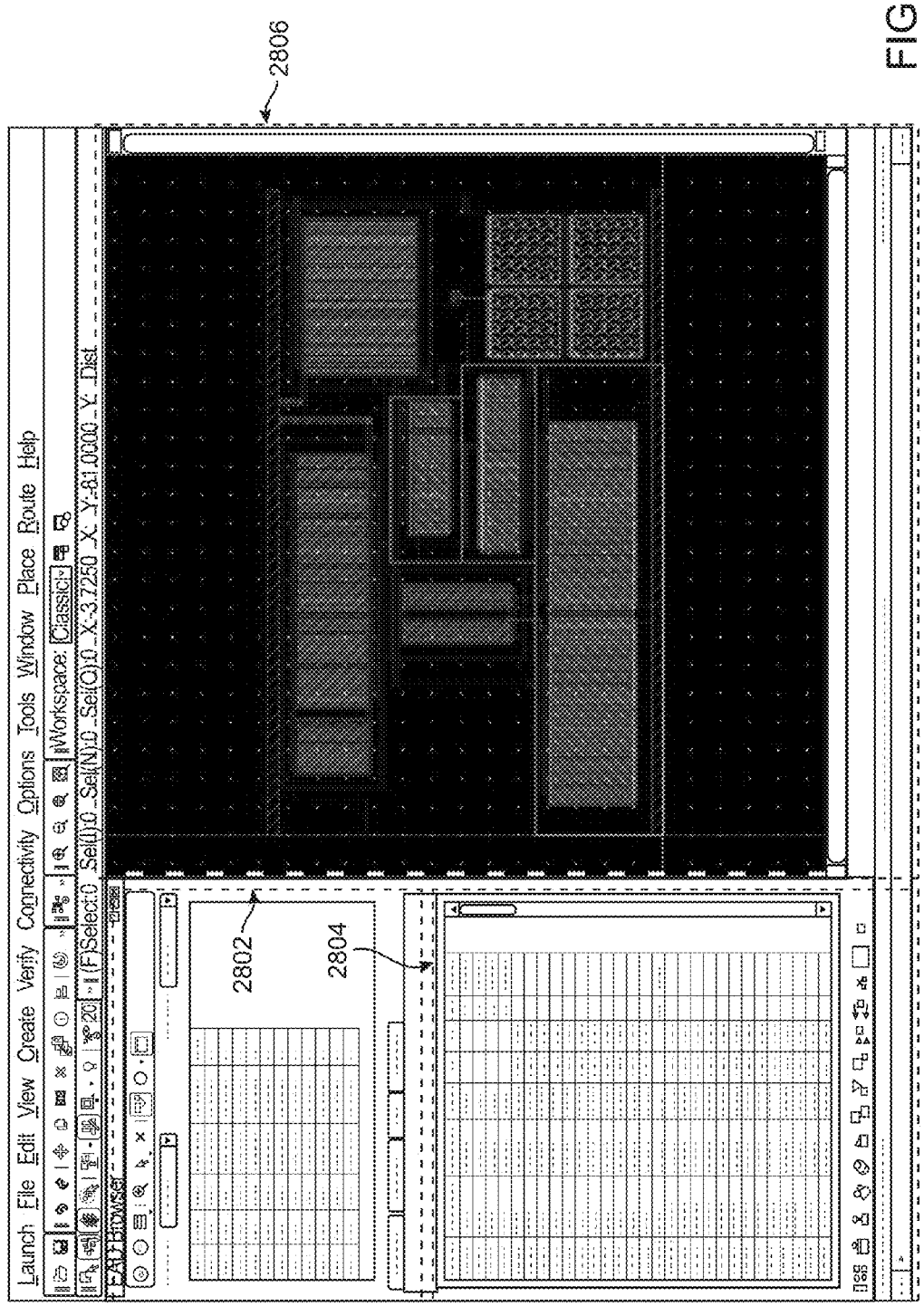
FIG. 28 illustrates an integrated user interface that comprises an interactive browser, an interactive graphical display area, and an interactive navigator in one or more embodiments.
Figure 28A:
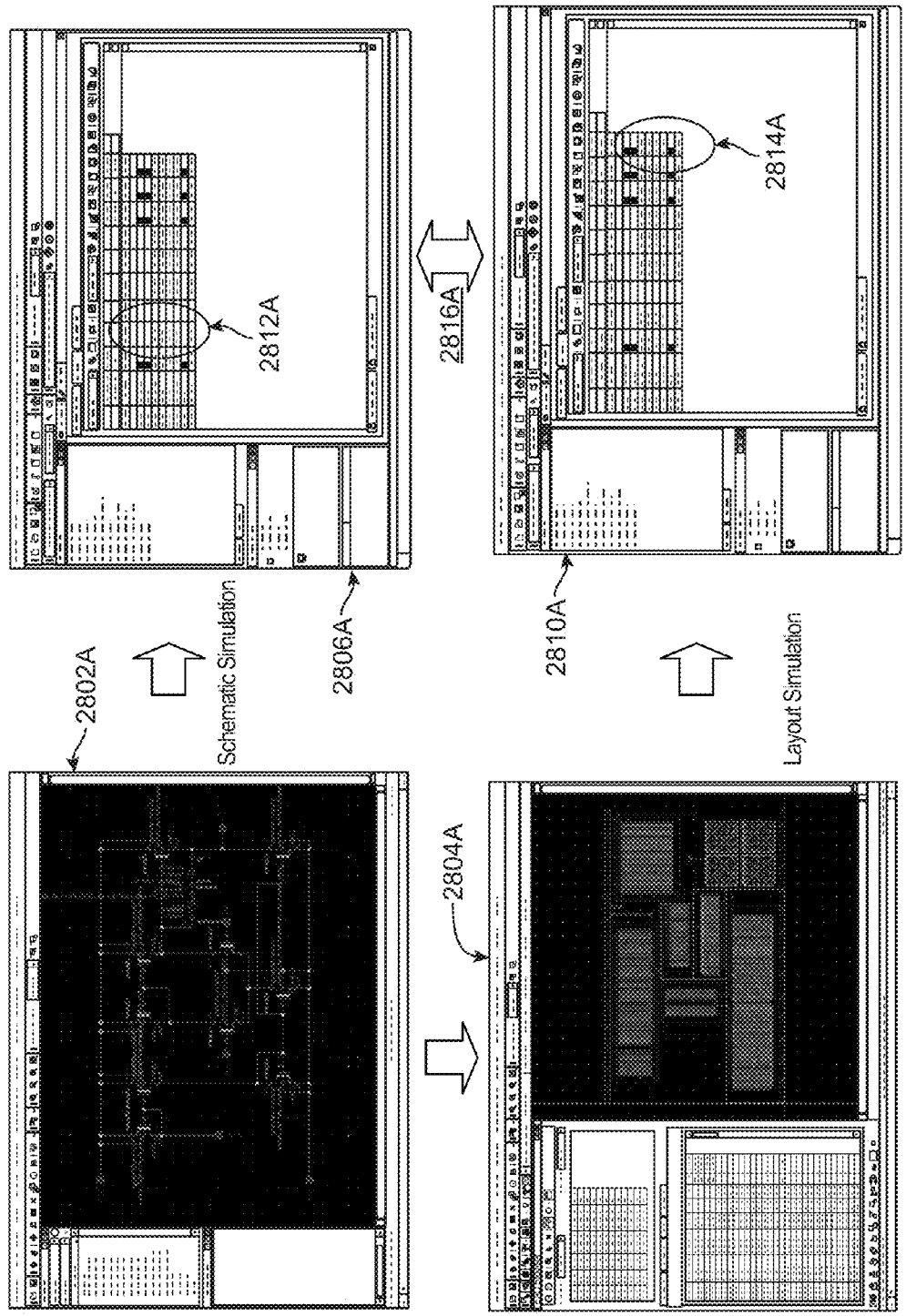
FIG. 28A illustrates a simplified, exemplary schematic flow diagram for the processes or modules illustrated in FIGS. 1A-C in some embodiments.

FIG. 28A illustrates a simplified, exemplary schematic flow diagram for the processes or modules illustrated in FIGS. 1A-C in some embodiments. The exemplary schematic flow diagram starts with identifying a schematic design of an electronic circuit design 2802A, and performs one or more schematic simulations to generate schematic simulation results as shown in 2806A. In some embodiments, the schematic simulation results 2806A may comprise the specification (2812A) includes the intended behavior or characteristics that are to be satisfied. The exemplary schematic flow diagram may then generate at least a partial physical design (2804A) based on the schematic design.

In some embodiments, the at least a partial physical design (2804A) includes only an incomplete physical design that does not pass a layout versus schematic (LVS) check or verification. The exemplary schematic flow diagram may then perform one or more simulations on the physical design to generate physical simulation results as illustrated in 2810A in some embodiments. The physical simulation results may comprise information or data indicating the failure of the physical design to satisfy one of the performance specifications as shown in the shaded (highlighted or color coded) field in 2814A. In some embodiments, the exemplary schematic flow further illustrates that various methods or system described herein may evaluate both the schematic simulation results and the physical simulation results to determine how the physical layout or a partial portion thereof impacts the intended design as specified in the schematic design (2816A).

In some embodiments where a portion of a layout is created, modified, or updated, various processes or modules described herein track such creation, modification, editing, or updating and then compute electrical parasitics that are impacted by such creation, modification, editing, or updating. Various processes or modules then update the GUI tables in the interactive browser or the interactive navigator, and presents relevant information or data according to a user's identification of a color coding or highlighting scheme or according to a default scheme. Various process or modules may then store or cause to store the computed data, such as but not limited to resistance(s), capacitance(s), current(s), current density (or densities) in one or more data structures such as one or more databases.

FIGS. 28-46B illustrates additional details for the various processes or modules described in the preceding paragraphs with references to FIG. 1-28A. More specifically, FIG. 28 illustrates an integrated user interface that comprises an interactive browser 2802, an interactive graphical display area 2806, and an interactive navigator 2804 in one or more embodiments. In some embodiments, the organization of the interactive regions (2802, 2804, 2806) may include: a graphical display of one or more layers of the layout in 2806, a summary of electrical parasitics and characterizations for all the nets resident in the layout 2802 and an interactive region that provides detailed analysis for a selected net or for one or more nets that have been selected for comparison. In some embodiments, the interactive browsers will be organized to show both summary information for a section of layout and detailed analysis for one or more selected nets. More details about the interactive browser 2802, an interactive graphical display area 2806, and an interactive navigator 2804 will be described in subsequent paragraphs with reference to various drawing figures.

Figure 29:
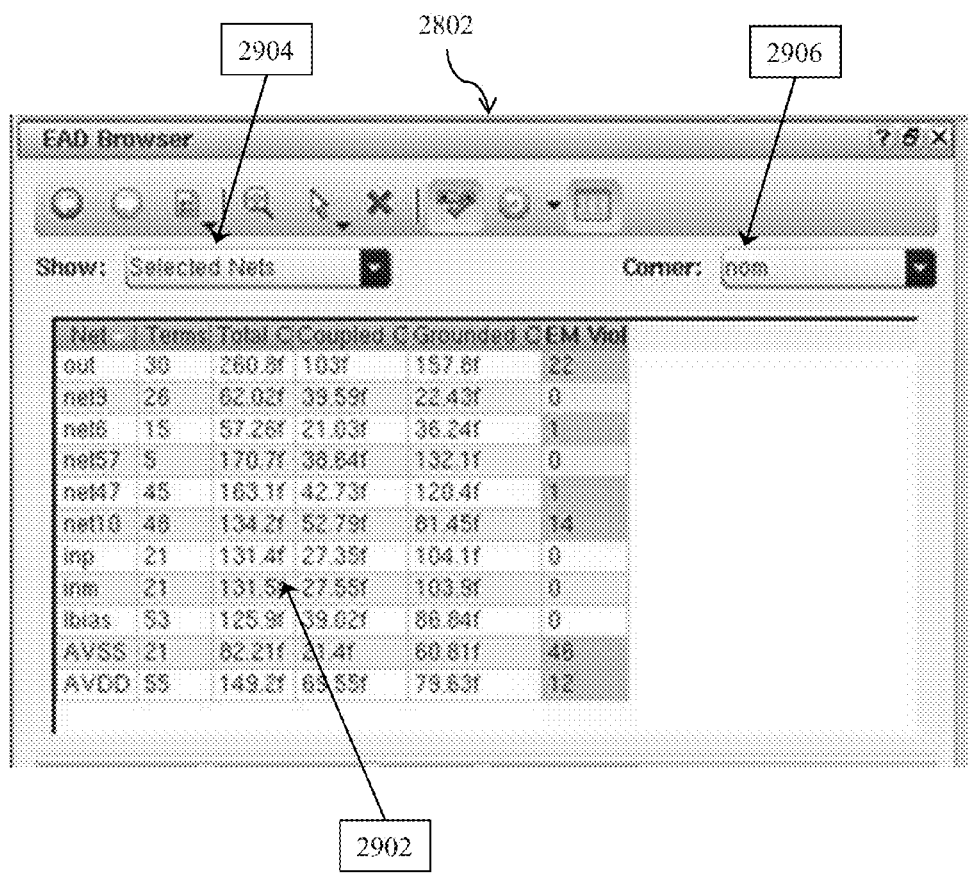
FIG. 29 illustrates more details about the interactive browser in one or more embodiments.

FIG. 29 illustrates more details about the interactive browser 2802 in one or more embodiments. In some embodiments, the interactive browser presents various information or data 2902 based at least in part on a user's identification or selection of components 2904 and one or more design corners 2906. In some embodiments, the interactive browser 2802 displays summary information at the net level for all the nets in the layout that have been loaded, created or modified and those nets may be sortable by clicking on the header tabs, such as the column "Net" has been selected here. In the example illustrated in FIG. 29, the summary tab may also include some global settings for EAD analysis and here the interactive browser has been selected by the user to show "Selected Nets" in 2904 that will appear in another browser. Moreover, each design corner as selected from 2906 brings up a new summary table of data or information in some embodiments. The customizable information or data displayed in this example include the names of the nets, the numbers of terminals for each net, the total capacitance, the grounded capacitance, and coupled capacitance of each net, and the number of EM (electro-migration) violations for each net. In addition, FIG. 29 illustrates that certain fields of display such as the EM violations may be color coded or highlighted (as indicated by the darker shade fields under EM Violation in FIG. 29). The user's identification of nominal design corner(s) is used to determine whether there exist some EM violations for each net shown. In this example, the interactive browser presents a summary of all coupling capacitances and EM violations for each of a plurality of nets.

Figure 30:
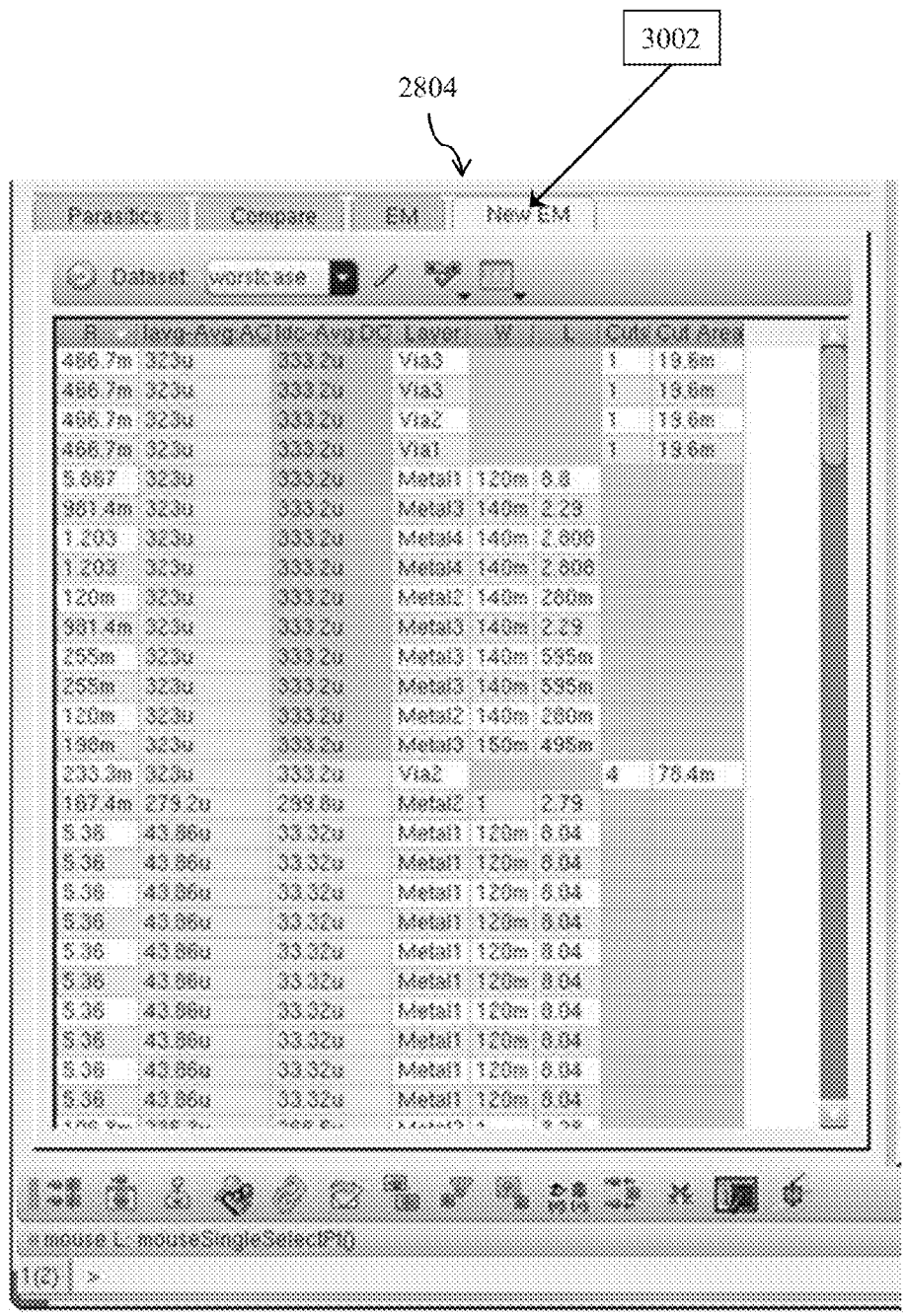
FIG. 30 illustrates more details about the interactive navigator that shows a "New EM" tab in an illustrated example.

FIG. 30 illustrates more details about the interactive navigator (2804) that shows a "New EM" tab 3002 in this illustrated example. In some embodiments, the interactive navigator 2804 presents various information data such as the resistance for each of a plurality of segments of a net or a plurality of nets (collectively "component"), average AC current for each component, average DC current for each component, which layer (e.g., Via 1, Metal 1, etc.) each component belongs to, geometric data for each component (e.g., width, length, cross-sectional area, etc.), and the number of cuts and the cut area for via(s).

In some embodiments, some types of data or information may be deleted from the interactive navigator, and some other types of data or information may be added to the interactive browser based on a user's input. The data or information in this example is presented in a tabulated format. The data or information presented in the interactive navigator may be sorted or arithmetically, mathematically, or statistically operated upon in some embodiments. FIG. 30 further illustrates the provision for a user to identify or select the dataset (in this example, the "worst case" dataset is identified) for display and analyses. Moreover, in the example illustrated in FIG. 30, the "New EM" tab 3002 presents each resistor and its associated data or information for a selected net is presented in a row. The interactive navigator presents EM related results in columns for each resistor of the selected net. In this example, the columns include current which is color coded to show when the current exceeds, for example, maximum current limits that are provided in one or more techfiles, The columns further include the layer that a particular resistor is on, geometric data or information for an interconnect, the total number of cuts and the cut area for vias. In some embodiments, columns that represent one or more current values such as average, peak and root mean square (RMS) are shown and color coding is used to indicate when a given value exceeds a constraint or limit associated with that resistor.

Figure 31:
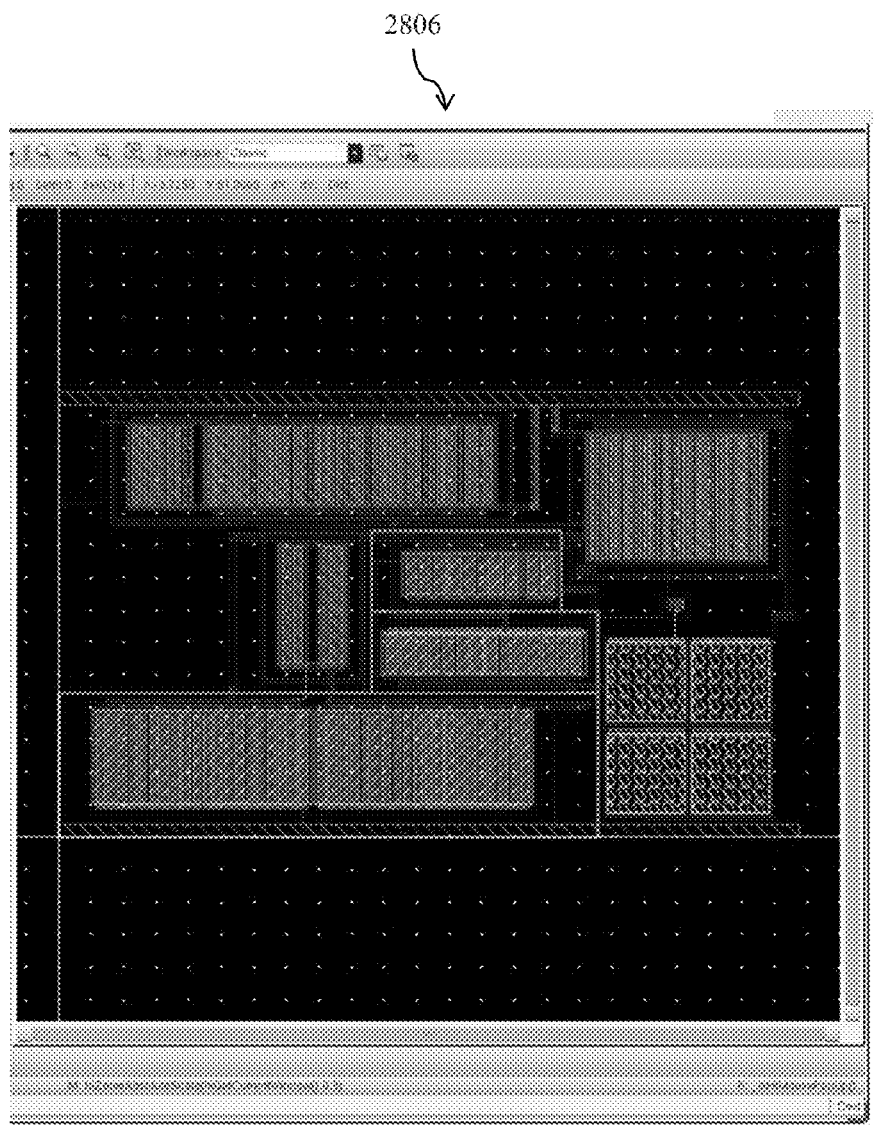
FIG. 31 illustrates a graphical display area (2806) of an exemplary user interface in which a part of a physical design as indicated by the various shapes is shown in some embodiments.

FIG. 31 illustrates a graphical display area (2806) of an exemplary user interface in which a part of a physical design as indicated by the various shapes is shown in some embodiments. In some embodiments, the user interface is integrated with various electronic circuit design platforms such as schematic editor or simulator, layout editor or simulator, and post-layout verification tools. In the example illustrated in FIG. 31, the GUI presents a portion of the physical design with overlays and highlight that allows for electrical characterization of the geometric representations of the portion of the physical design.

Figures 32A, 32B:
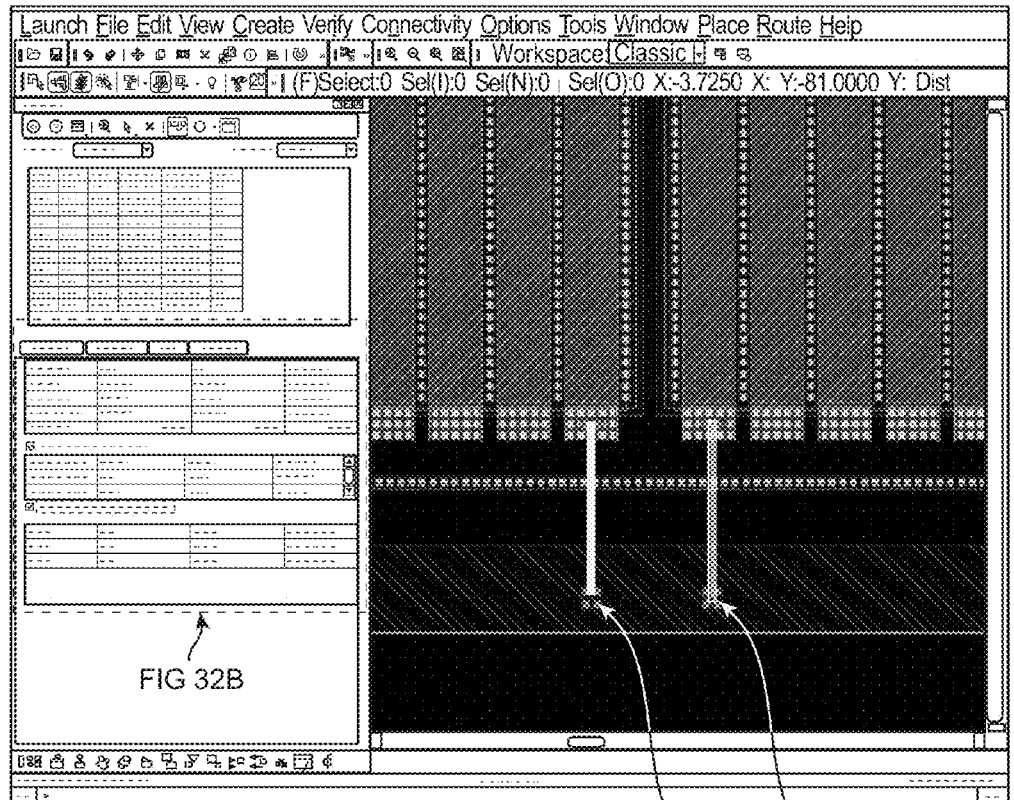
FIGS. 32A-B illustrate more details about the interactive navigator that interacts with the interactive GUI in some embodiments.

FIGS. 32A-B illustrate more details about the interactive navigator that interacts with the interactive GUI in some embodiments. More specifically, FIG. 32A illustrates a user interface that comprises an interactive GUI showing the identification or selection of two nets inm (3202) and inp (3204). For example, a user may select the two nets 3202 and 3204 by respectively clicking on a part of each net in the interactive GUI.

FIG. 32B illustrates an exemplary interactive navigator that has been placed in a "Compare Mode". More specifically, FIG. 32B shows the interactive navigator's automatic response to the user's identification of the two nets by showing the comparison results that includes, in this example, the total capacitance, the coupled capacitance, and the grounded capacitance for each of the two selected nets (3206 and 3208) as well as the differences between the respective values of the two nets. FIG. 32B further shows the representation of the capacitance by layer in response to a user's input to show such capacitances. In this example, the total capacitances for the polysilicon layer, the metal 1 layer, and the metal 2 layers are shown in a tabulated format. FIG. 32B also displays the coupled capacitances by net in response to a user's input to display such capacitances. In this example, the coupled capacitances for each of the two nets and the differences between the coupled capacitances are shown for net10, net6, and net9. In some embodiments, various processes or modules described herein may use the differences grouped by layer and by net to diagnose where the nets deviate or whether some nets are not exactly symmetric because the results show that they have different resistors, etc. In some embodiments, the user may select more than two nets for comparison.

Figure 33:
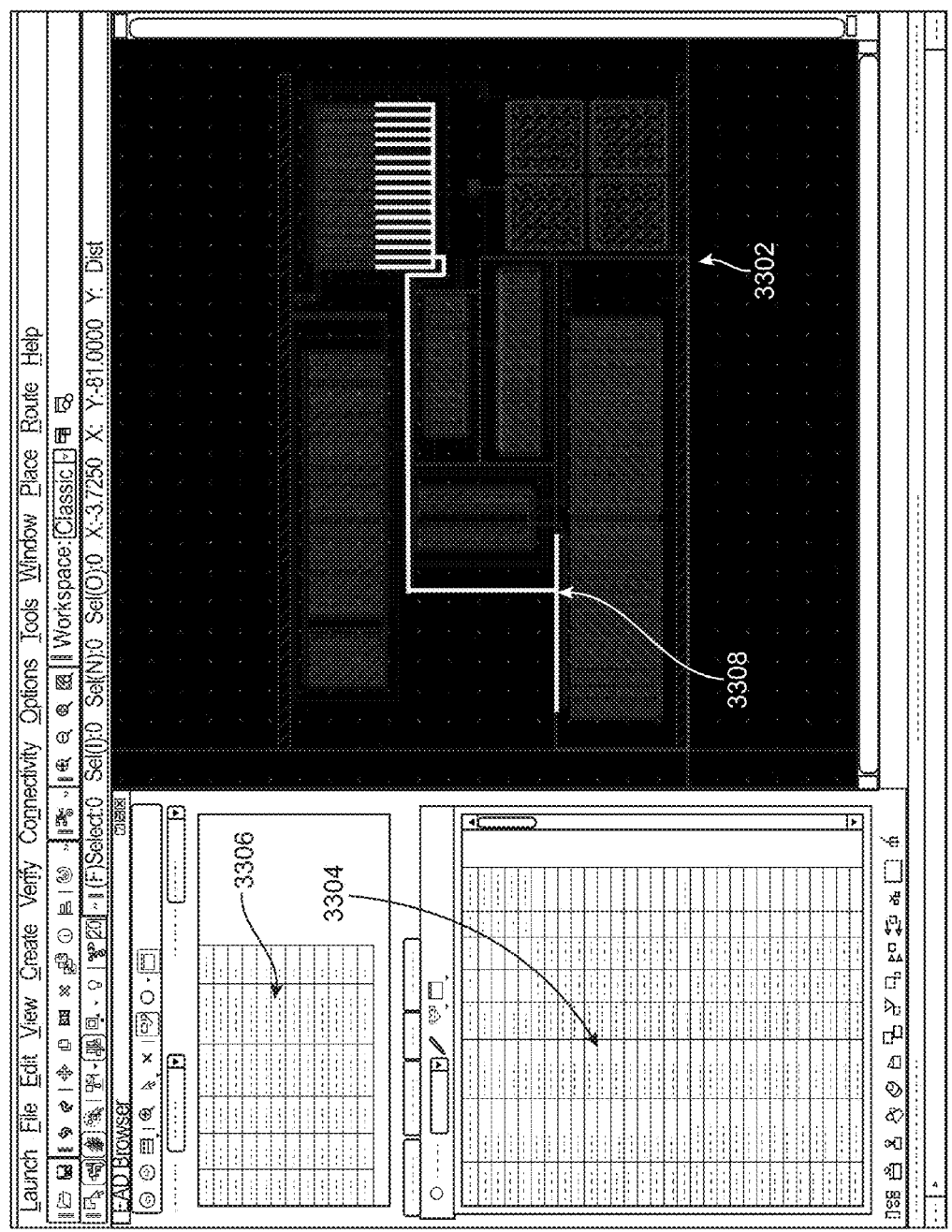
FIG. 33 illustrates the automatic interaction among various parts of a user interface in some embodiments.

FIG. 33 illustrates the automatic interaction among various parts of a user interface in some embodiments. The user interface comprises an interactive GUI 3302, an interactive browser 3306, and an interactive navigator 3304 that has been placed in an EM mode in some embodiments. In this example, the interactive GUI 3302 may display whether certain nets satisfy certain EM constraints by presenting the nets with different color codes or highlights. For example, the interactive GUI 3302 may present the net 3308 in red if the net fails to pass some EM limits or in blue if the net passes the EM limits.

The interactive browser 3306 presents EM violations for each of a plurality of nets. In some embodiments, the interactive browser 3306 presents the nets with EM violations with a color coding or highlighting scheme. In some embodiments, the color coding or highlighting scheme in the interactive browser is synchronized with that of the interactive GUI. In some other embodiments, the interactive browser and the interactive GUI have different color coding or highlighting schemes. Moreover, the interactive navigator 3304 presents all the resistors for the selected net with the current data. In some embodiments, the interactive navigator also adopts the same or different color coding or highlighting scheme to show whether the resistors meet or fail to meet corresponding EM limits.

Figure 34:
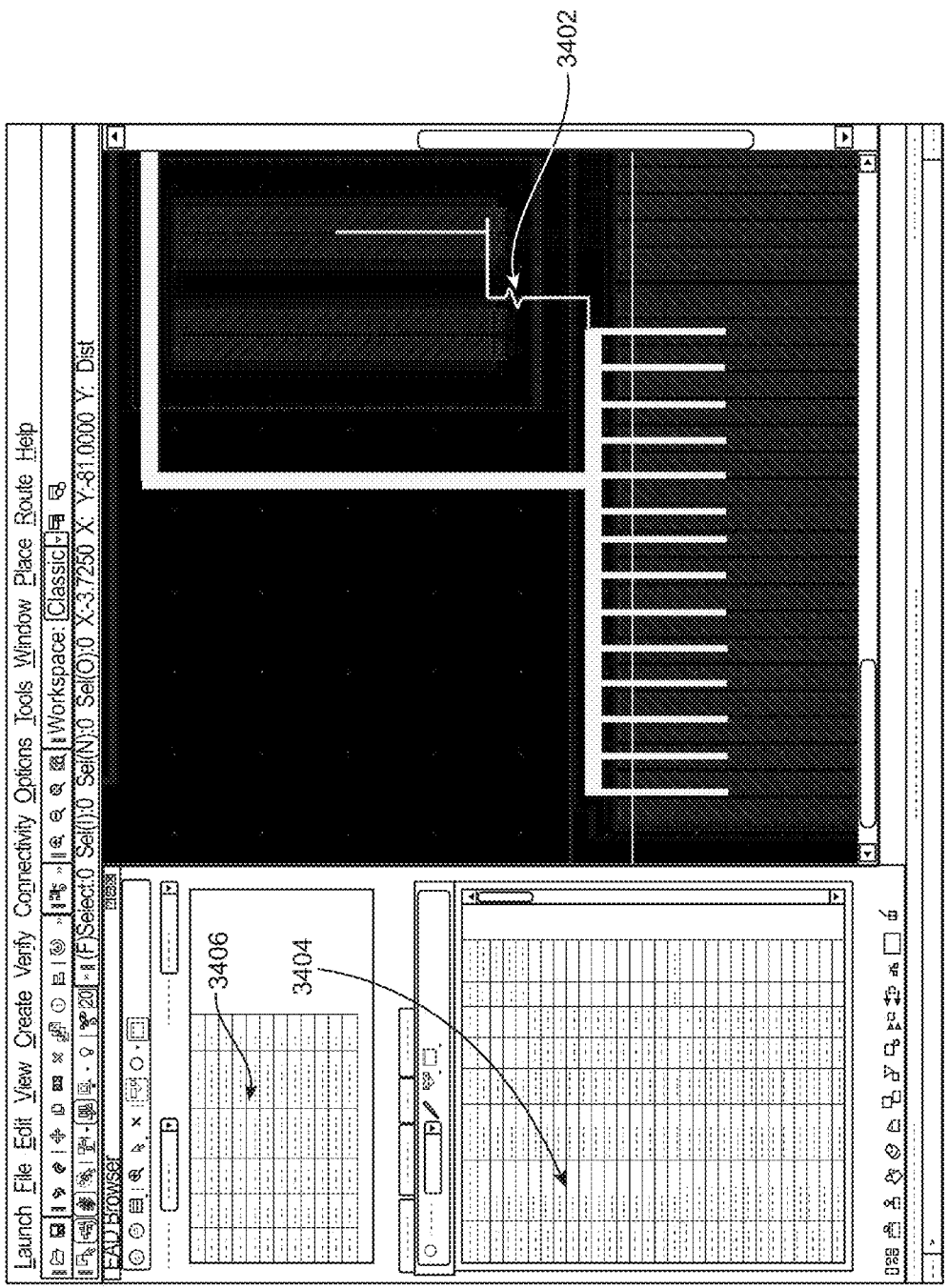
FIG. 34 illustrates the automatic interaction among various parts of a user interface in some embodiments.

FIG. 34 illustrates the automatic interaction among various parts of a user interface in some embodiments. In this example, a user identifies a particular resistor or via 3404 by clicking on the particular resistor or via in the interactive navigator. In response to the user's identification of the resistor or via 3404 in the interactive browser, various processes or modules described herein show or cause to show a resistor symbol or a bounding box (3402) at a location where the particular resistor or via is located in the interactive GUI. In some embodiments, the interactive GUI also highlights or color codes the net to which the particular resistor belongs. In some embodiments, the interactive browser also highlights or color codes the net to which the particular resistor belongs (3406).

Figure 35A:
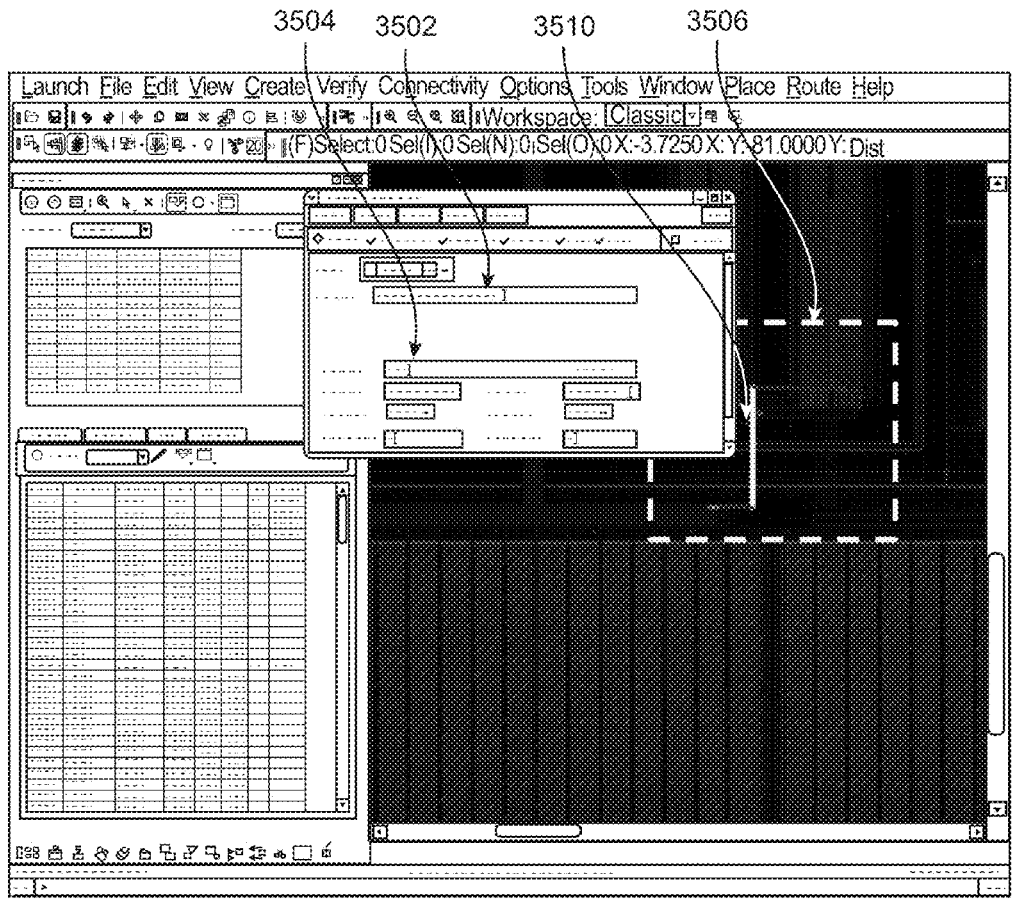
Figure 35B:
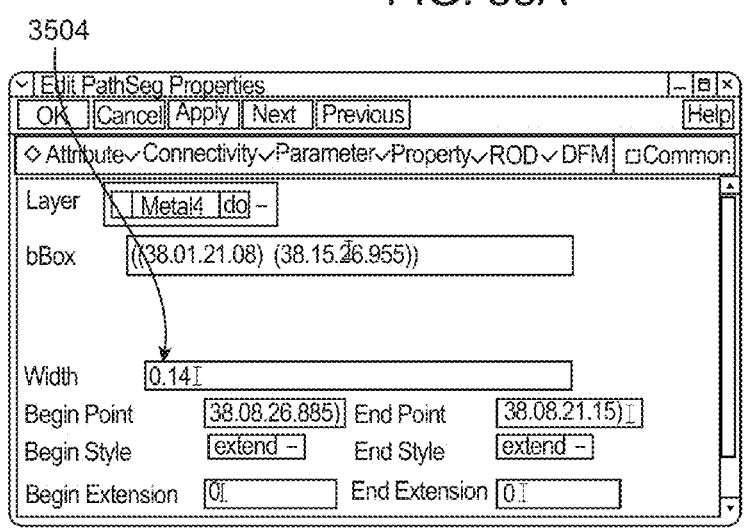

FIGS. 35A-C illustrates the automatic interaction among various parts of a user interface in some embodiments. In some embodiments, FIG. 35A shows a user interface that includes an interactive GUI showing a color coded or highlighted resistor element 3510 that violates certain EM limit(s). The user interface also includes a pop-up window 3502 that comprises an editable field for, for example, a width of the resistor that exhibits some EM violation(s). In some embodiments, the interactive browser may also color code or highlight the corresponding net to which the particular resistor belongs. In some embodiments, the interactive navigator may also color or highlight the resistor.

FIG. 35B illustrates more details about the pop-up window 3502 that comprises the layer on which the particular resistor element resides, the locations of the end points of the resistor element, and the beginning and ending style of the resistor element. The pop-up window 3502 may also comprise an editable field 3504 that a user may manually change the value for, for example, the width of the resistor element. In this example, the pop-up window shows that the width of this particular resistor element currently has a value of 0.14 μm and is causing some EM violations. The pop-up window may also comprise provisions for the user to apply, cancel, undo, or redo the change in the width of the resistor element.

Upon the application of the change in the width of the resistor element, various processes or modules described herein automatically performs certain functions or operations to determine whether this particular resistor element satisfies the EM limit(s), and if so automatically updates the interactive browser, the interactive navigator, or the interactive GUI to reflect that this resistor element has satisfied the EM limits in some embodiments. In some embodiments, various modules or processes described herein further check at least a portion of the electronic circuit design to determine whether other constraints or requirements are satisfied by this change in the width of the particular resistor element.

The pop-up window may further provide provisions for the user to navigate through a plurality of components that exhibit, for example, EM violations or violations of other constraints or requirements in some embodiments. In addition or in the alternative, the pop-up window or other part(s) of the user interface may also comprise recommended fix(es), such as the minimum width to fix the EM violation(s), or hint(s) (collectively "fix" or "fixes" herein) that may resolve the EM violation caused by this particular resistor element in some embodiments. In these embodiments, the pop-up window or other part(s) of the user interface may further present the impact or effect of the recommended fix(es) or hint(s) such that the user may know how the change in the width of this particular resistor element affects or impacts the electronic circuit design. In some embodiments, various processes or modules further provide the option for a user to automatically fix the EM violations while keeping other constraints, requirements, or the specification in check without human intervention.

FIG. 35C illustrates a portion of the interactive GUI which shows a color coded or highlighted resistor element 3508 that fails to satisfy some EM limit(s).

Figure 36A:
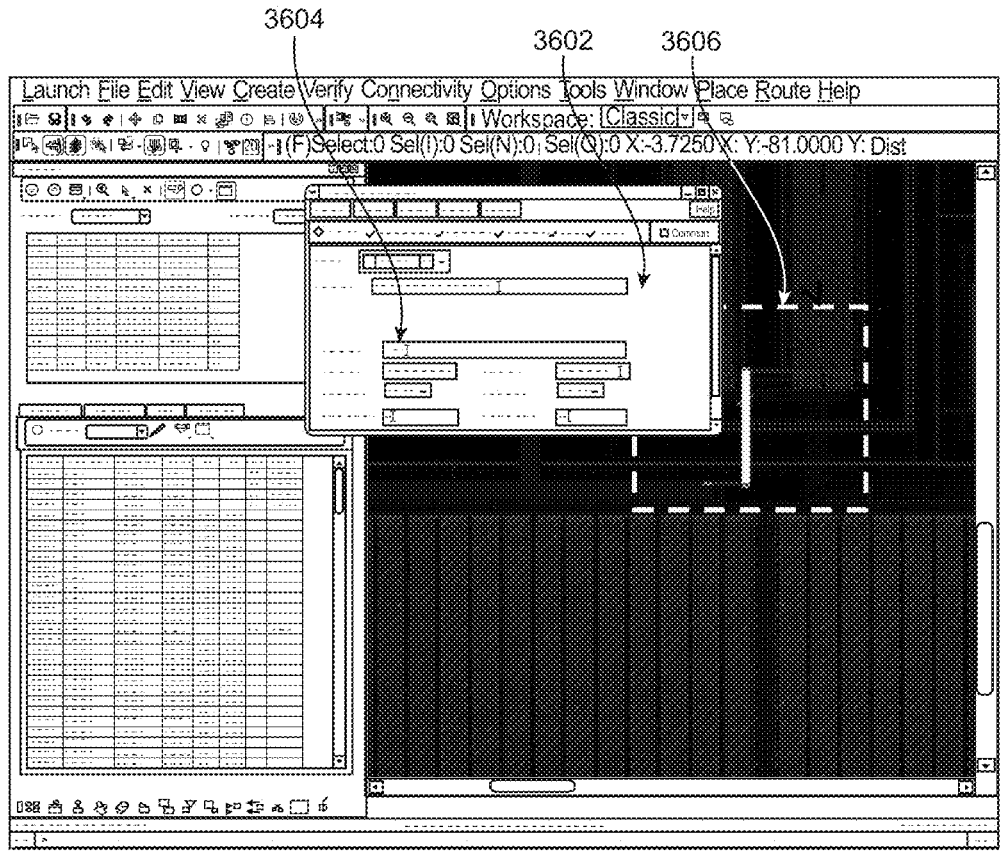
Figure 36B:
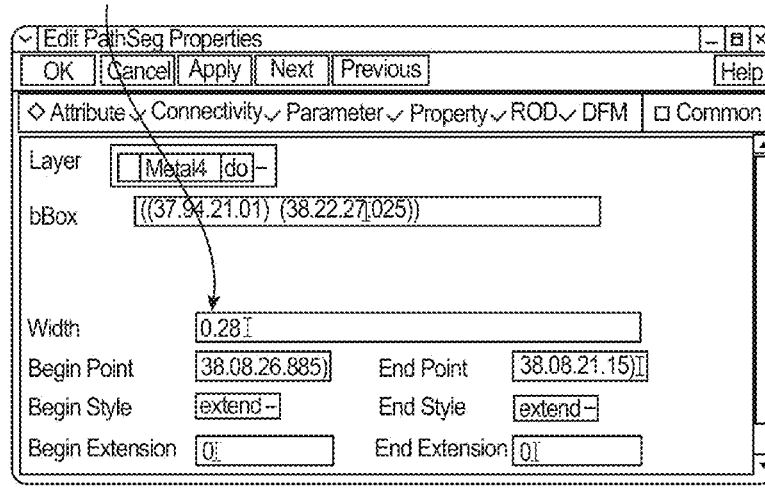

FIGS. 36A-C illustrate the automatic interaction among various parts of a user interface in some embodiments. More specifically, the example illustrated in FIGS. 36A-C continues from that illustrated in FIGS. 35A-C. FIG. 36A shows the same user interface that includes a pop-up window 3602 with an editable field 3604 and an interactive GUI showing a portion of the physical design with the particular resistor exhibiting some EM violations. In some embodiments where the user identifies the particular resistor element that fails to pass some EM limit(s) in the interactive browser, the interactive GUI automatically adjusts the display of the physical design such that the user may visually identify this particular resistor element in the interactive GUI.

FIG. 36B shows the pop-up window where the width has been changed from 0.14 μm as shown in FIG. 35B to 0.28 μm in 3604. FIG. 36C shows a zoomed in view of a part of the interactive GUI with the color coded or highlighted resistor element before the application of the fix for the width of the resistor element. Upon the application of the fix for the width of the resistor element, various processes or modules may then determine whether this particular resistor passes the associated EM limit(s) and update the display in the interactive GUI, the interactive browser, or the interactive navigator based on the color coding or highlighting scheme if necessary. In some embodiments, various processes or modules may also check other parts of the design or other constraints to determine whether this change in the width of the particular resistor element affects other part of the design or other constraints, requirements, or aspects of the specification.

Figure 37:
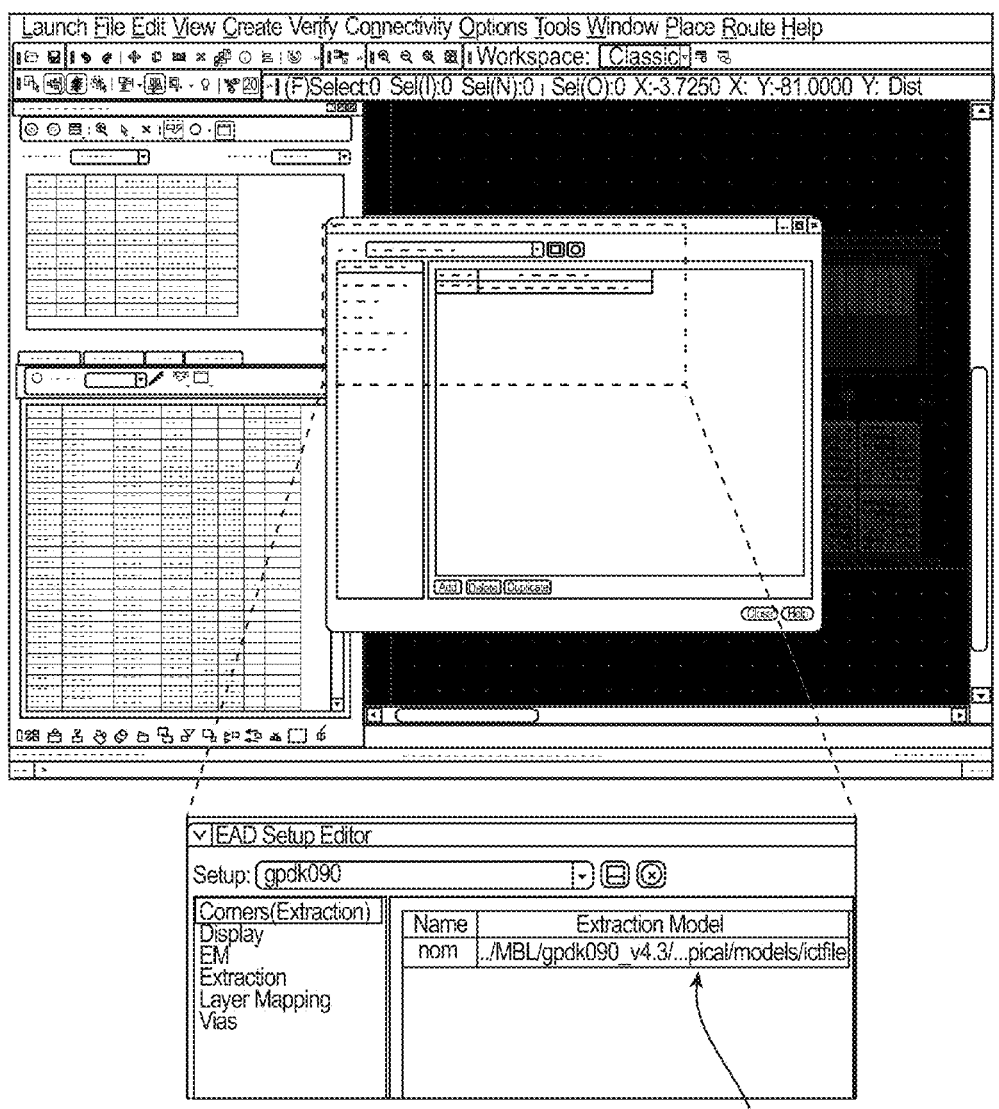
FIG. 37 illustrates a provision of the user interface to receive user's identification or selection of one or more techfiles in one or more embodiments.

FIG. 37 illustrates a provision of the user interface to receive user's identification or selection of one or more techfiles (or technology files, 3702) in one or more embodiments. A techfile comprises process specific parameters for one or more processes used in manufacturing the electronic circuit. Some exemplary process specific parameters include, for example but not limited to, layer thicknesses or sheet resistances for various layers, two-dimensional FFT (fast Fourier transform) sizes which describe a relation between the chip size and the FFT size that determines simulation accuracy, etc. Techfiles usually describe a generic CMOS process (complementary metal-oxide-semiconductor) and BiCMOS (or BiMOS or bipolar metal-oxide-semiconductor) process and is usually foundry specific. The provisioning of the capability for selecting more than one techfiles for the same electronic circuit design that may be fabricated by multiple manufacturers enables the user to compare the electrical characterization at one manufacturer with that at another.

Figure 38:
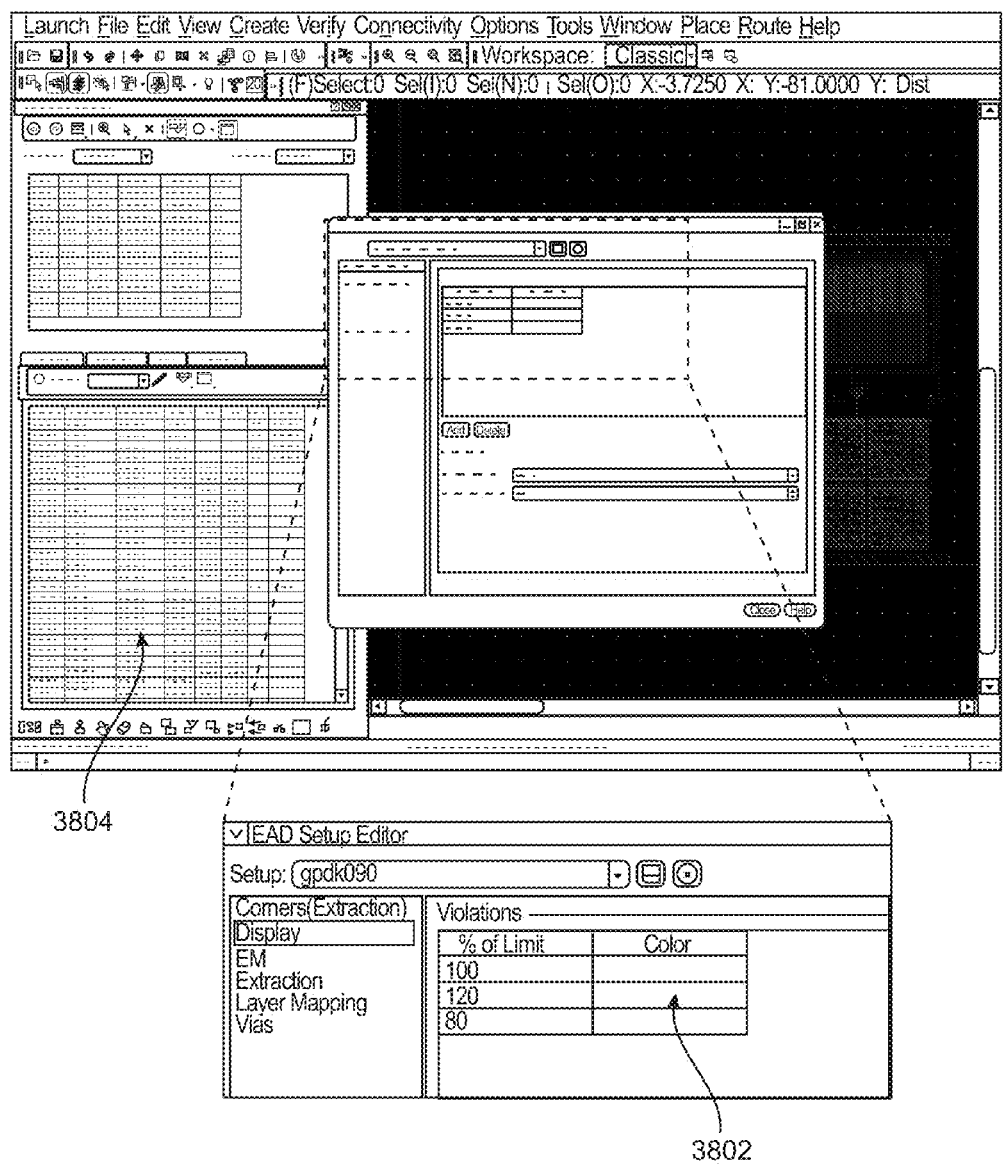
FIG. 38 illustrates the identification, selection, or customization of a color coding or highlighting scheme that may be used in one or more items in a user interface in one or more embodiments.

FIG. 38 illustrates the identification, selection, or customization of a color coding or highlighting scheme that may be used in one or more items in a user interface in one or more embodiments. In some embodiments, the color coding or highlighting scheme may be identified, determined, or customized in a way to indicate whether a particular component approaches, meets, or exceeds an associated limit. In some embodiments, the color coding or highlighting scheme may be identified, determined, or customized in a way to indicate how much a component approaches, meets, or exceeds an associated limit.

In the example illustrated in FIG. 38, a pop-up window provides an interface for a user to set up the color coding or highlighting scheme 3802 that controls how various components may be displayed in the interactive browser, the interactive navigator, or the interactive GUI. Upon the determination of the color-coding or highlight scheme, the textual or graphical display of various information or data is then updated in accordance with the color coding or highlighting scheme. In the example illustrated in FIG. 38, a first shade (or color) indicates that an electrical characteristic of a particular component is less than or equal to 80% of the associated limit; a second shade (or color) indicates that an electrical characteristic of a particular component is between 80% and 100% of the associated limit; and a third shade (or color) indicates that an electrical characteristic of a particular component is greater than or equal to 120% of the associated limit. In this example, the textual display of various data or information in the interactive navigator (3804) is updated in accordance with the color coding or highlighting scheme.

Figure 39:
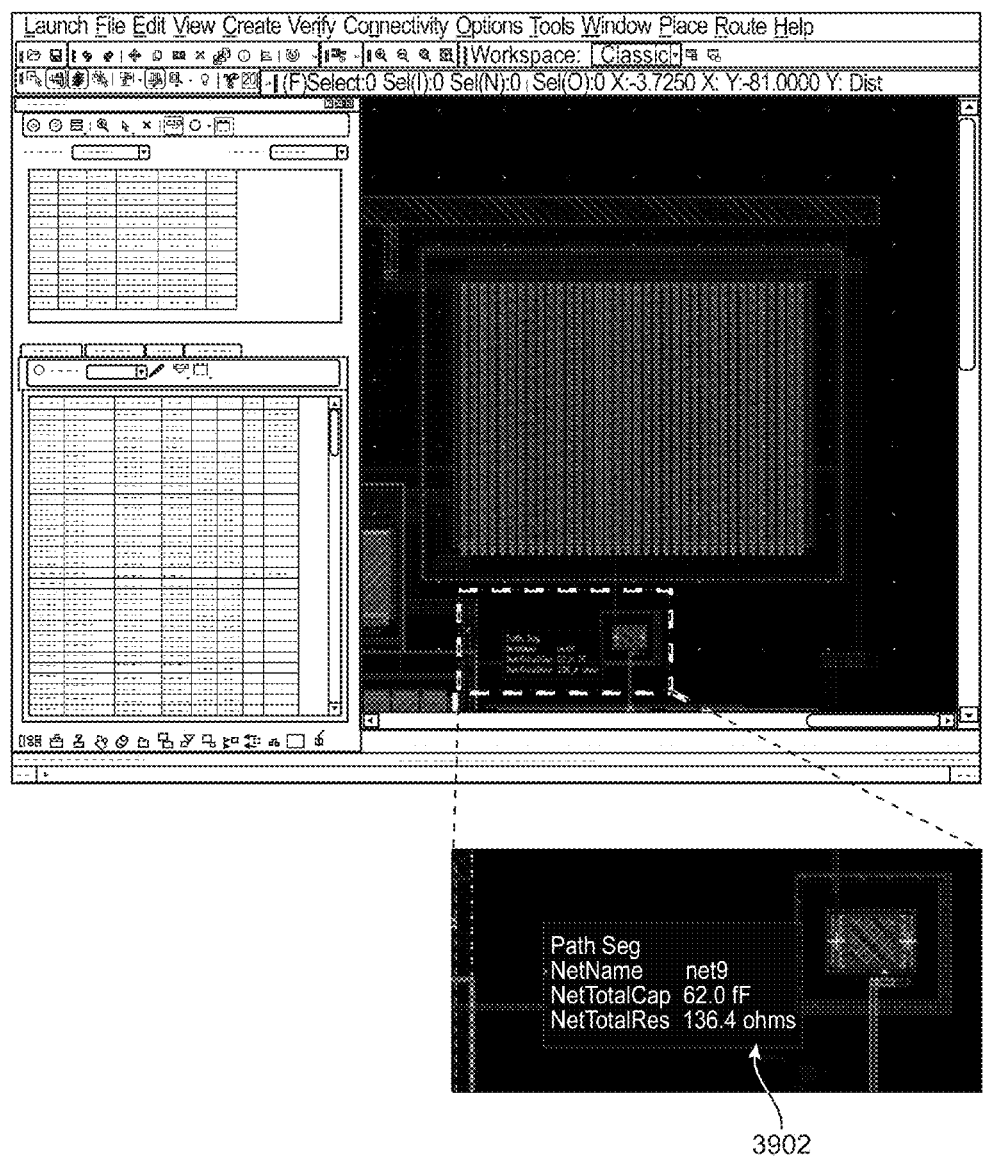
FIG. 39 illustrates an interaction of the system in response to an operation by displaying an information balloon that shows various characteristics or electrical parasitics of a component in one or more embodiments.

FIG. 39 illustrates an interaction of the system in response to an operation by displaying an information balloon that shows various characteristics or electrical parasitics of a component in one or more embodiments. In some embodiments, the method or the system interactively responds to an operation by displaying customizable information or data for various characteristics or electrical parasitics of a component in the form of an information balloon 3902. In some embodiments, a user first identifies an interconnect or a segment thereof by, for example, clicking on the interconnect or the segment in the interactive GUI or in the interactive navigator; in response to the user's identification of the interconnect or segment, the system automatically shows an information balloon that displays what the component is, which net the component belongs to, the total capacitance and the total resistance of the net of the net to which the component belongs in this example.

Figure 40:
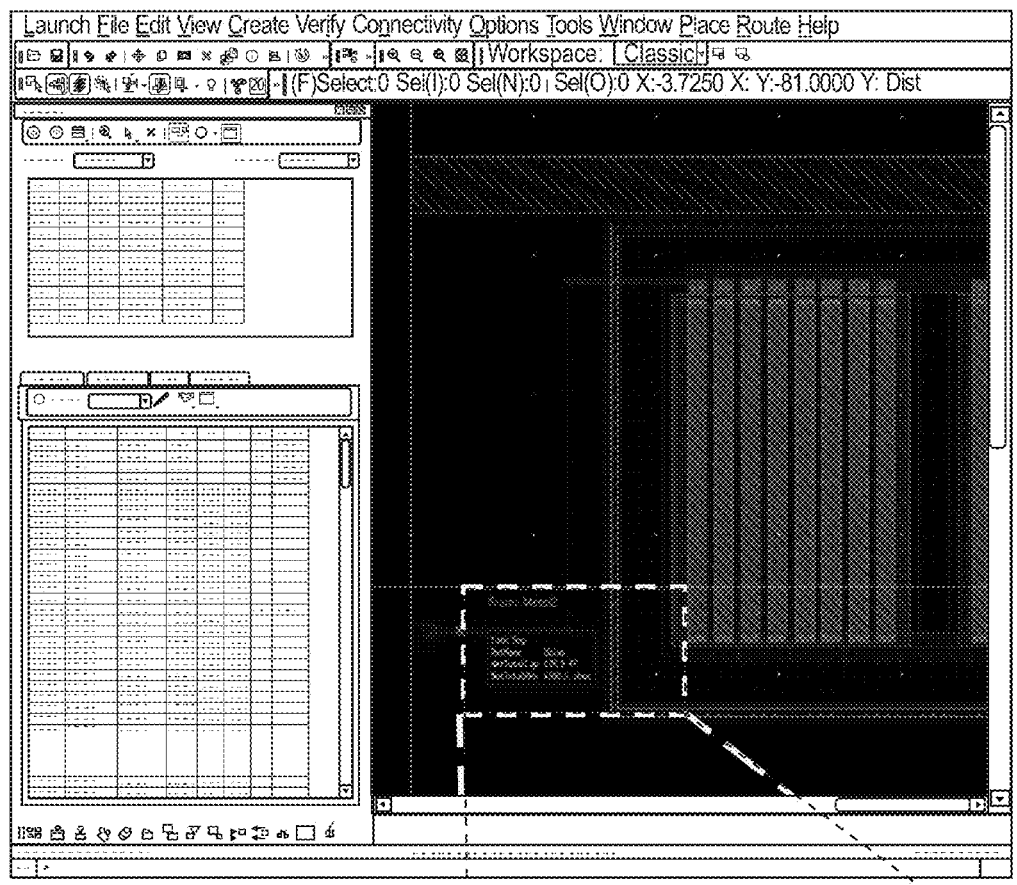
FIG. 40 illustrates the interactive response of the system to a measurement probe that is placed on a net in one or more embodiments.

FIG. 40 illustrates the interactive response of the system to a measurement probe that is placed on a net in one or more embodiments. In some embodiments, various method or system may receive one or more measurement probes on a net to perform one or more measurement processes. More specifically, FIG. 40 illustrates an identification of an initial point (as shown in "From: Metal2" in FIG. 40) of a measurement probe; in response to the identification of the initial point, the system interactively displays what the component to which the initial point is attached is, the name of the net to which the initial point belongs, and the total capacitance and total resistance of the net to which the initial point belongs as shown in 4002. In some embodiments, the interactive browser or the interactive navigator may also respectively identify the net or the component in response to the identification of the initial point by, for example, using the color coding or highlighting scheme.

Figure 41:
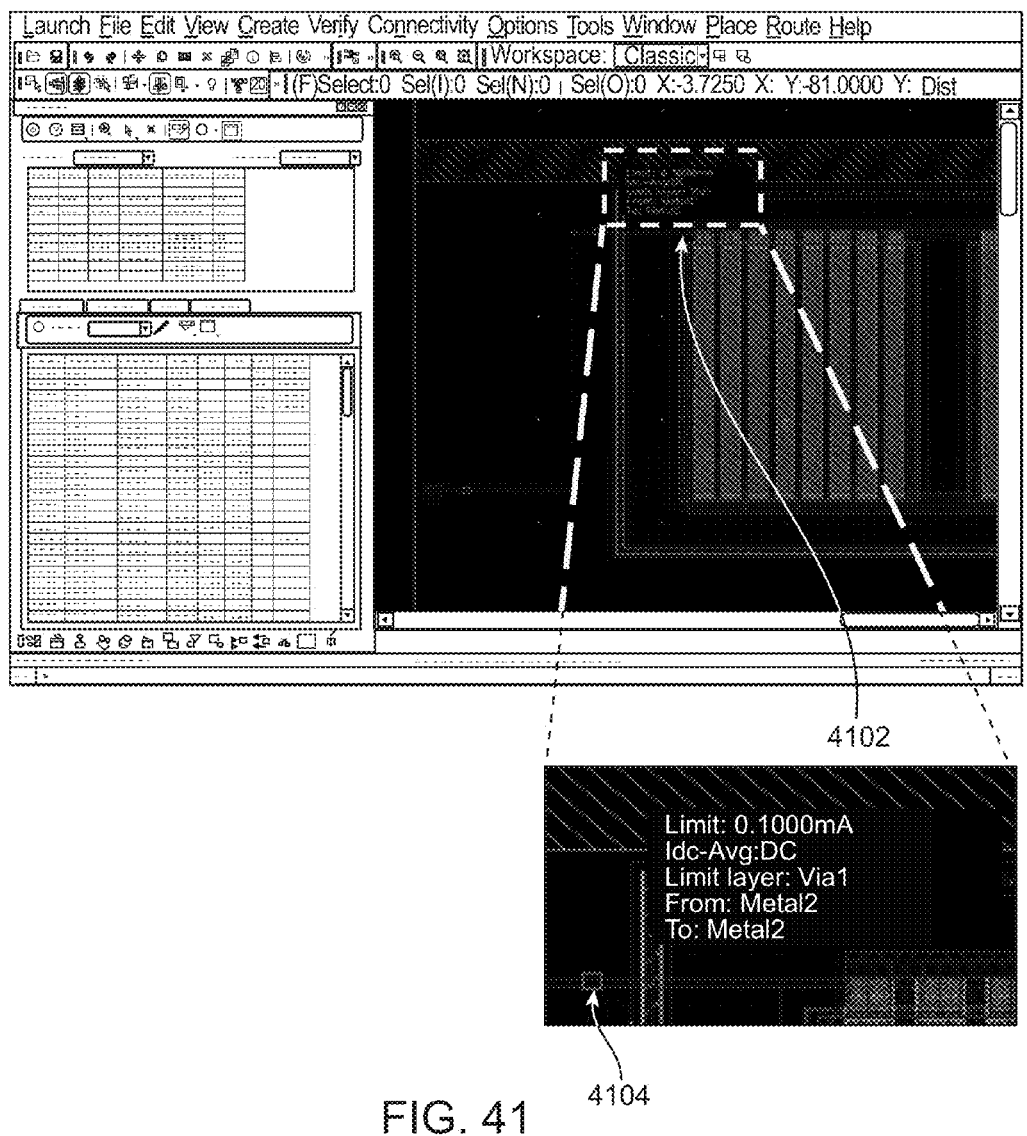
FIG. 41 illustrates the interactive response of the system to a measurement probe that is placed on a net in one or more embodiments.

FIG. 41 illustrates the interactive response of the system to a measurement probe that is placed on a net in one or more embodiments. In some embodiments, various method or system may receive one or more measurement probes on a net to perform one or more measurement processes. More specifically, FIG. 41 illustrates the example where the system or method interactively responds to a location (4104 or "To: Metal2" in FIG. 40) of the cursor of a pointing device in the interactive GUI and displays various information or data in a form of, for example, an information balloon.

In this example illustrated in FIG. 41, the user manipulates the cursor to hover over a given wire segment or a via segment and temporarily stops at the location (4104) in the interactive GUI without actually clicking on any particular point in the interactive GUI. In response to the current position of the cursor, the method or the system displays the current limit for the wire segment or the via segment, where the limiting current occurs (in vial in this example), and the beginning point and the end point of the segment in 4102. In some embodiments, this hover mode supports the ability to use, for example, a mouse wheel or other means to cycle through shapes that are on other layers if there exist some overlaps of shapes at the location around which the cursor hovers.

For example, if there exist four wires directly above the other on four layers, the user may use the mouse wheel or other means to scroll through these overlapping shapes, and the information balloon automatically updates the displayed information or data in the interactive GUI in some embodiments. In some embodiments, the method or the system may also update the contents of the interactive browser or the interactive navigator in response to this hover mode.

Figure 42:
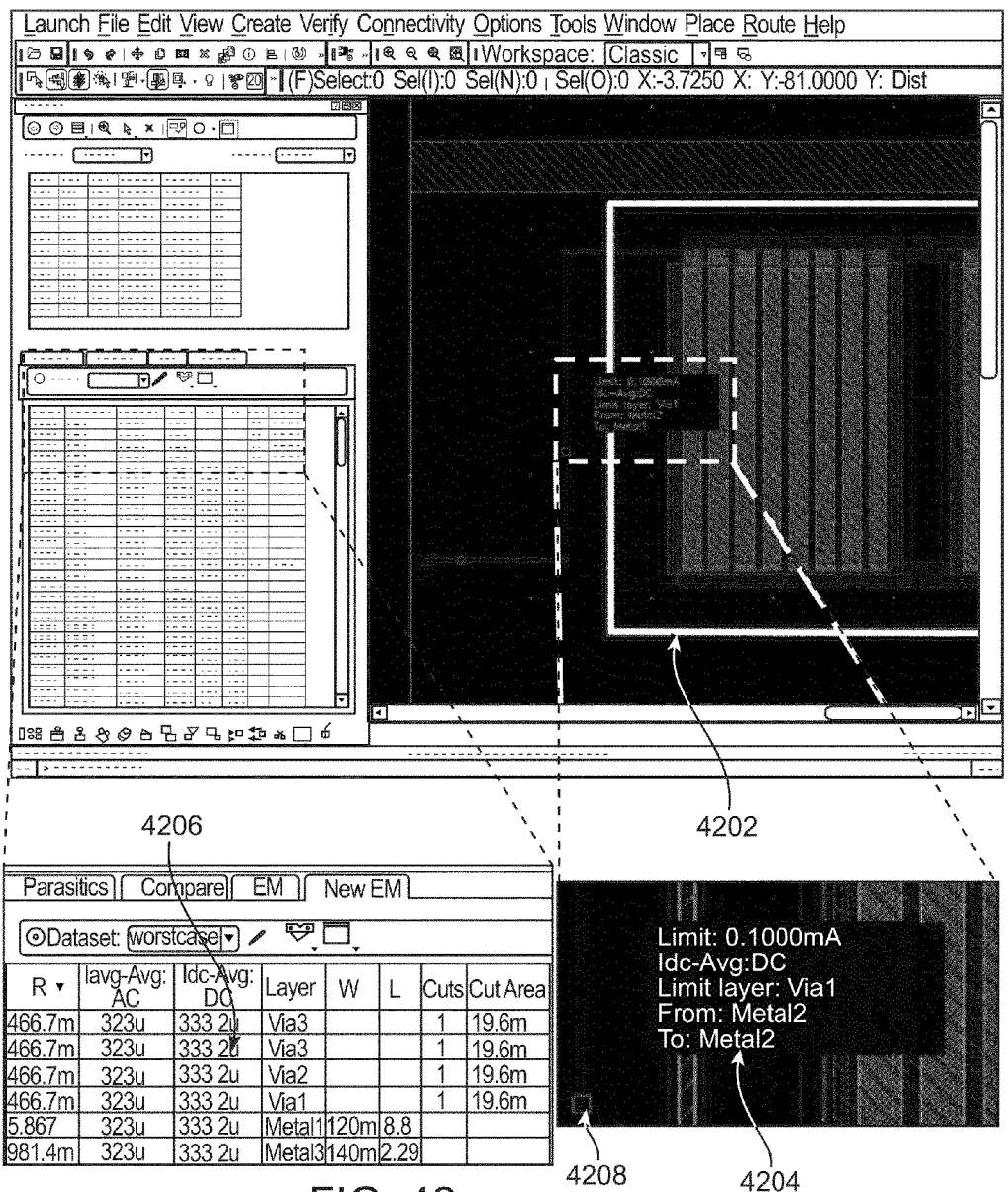
FIG. 42 illustrates the interactive response of the system to a measurement probe that is placed on a net in one or more embodiments.

FIG. 42 illustrates the interactive response of the system to a measurement probe that is placed on a net in one or more embodiments. In some embodiments, various method or system may receive one or more measurement probes on a net to perform one or more measurement processes. More specifically, FIG. 42 illustrates an identification of the next measurement point (as shown in "To: Metal1" in FIG. 42) of a measurement probe; in response to the identification of the next measurement point (4208), the system interactively displays the limiting current, where the limiting current occurs (in Via1, 4204), and the initial point of the measurement ("From: Metal2" in FIG. 42.) In some embodiments, the method or the system may further identify or emphasize this limiting location by using, for example, a bounding box or the color coding or highlighting scheme for this limiting location.

In some embodiments, the interactive browser or the interactive navigator may also respectively identify the net or the component (4202) by, for example, highlight or color-coding the net or showing a bounding box for the net, in response to the identification of the identification of the next measurement point and the results of the measurement probe in some embodiments. In some embodiments, the method or the system may also interactively respond to the identification of the next measurement point by updating the contents of the interactive navigator 4206 or the contents of the interactive browser.

Figure 43:
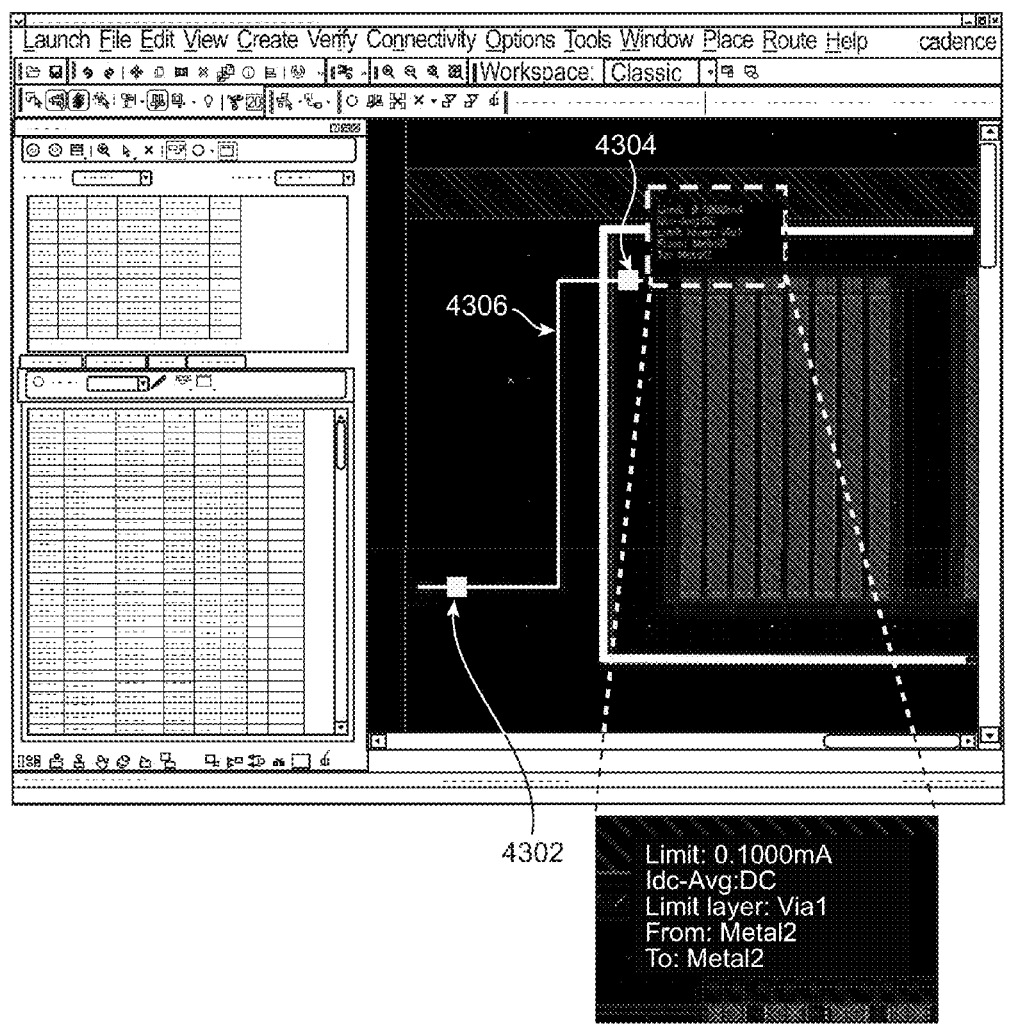
FIG. 43 illustrates an example in which a measurement probe is placed on a net to measure one or more electrical characteristics.

FIG. 43 illustrates an example in which a measurement probe is placed on a net to measure one or more electrical characteristics. In the example illustrated in FIG. 43, a measurement probe is placed on two points (4302 and 4304) of a net (4306). The method or the system then determines the resistance between the two locations 4302 and 4304 along the net 4306 and updates the contents of the interactive GUI, the interactive browser, or the interactive navigator in some embodiments. In some embodiments, one or more probes may be left behind in a physical design. In these embodiments, the method or the system automatically updates the one or more probes that are left behind after or at the time when the physical design is modified.

Figure 44:
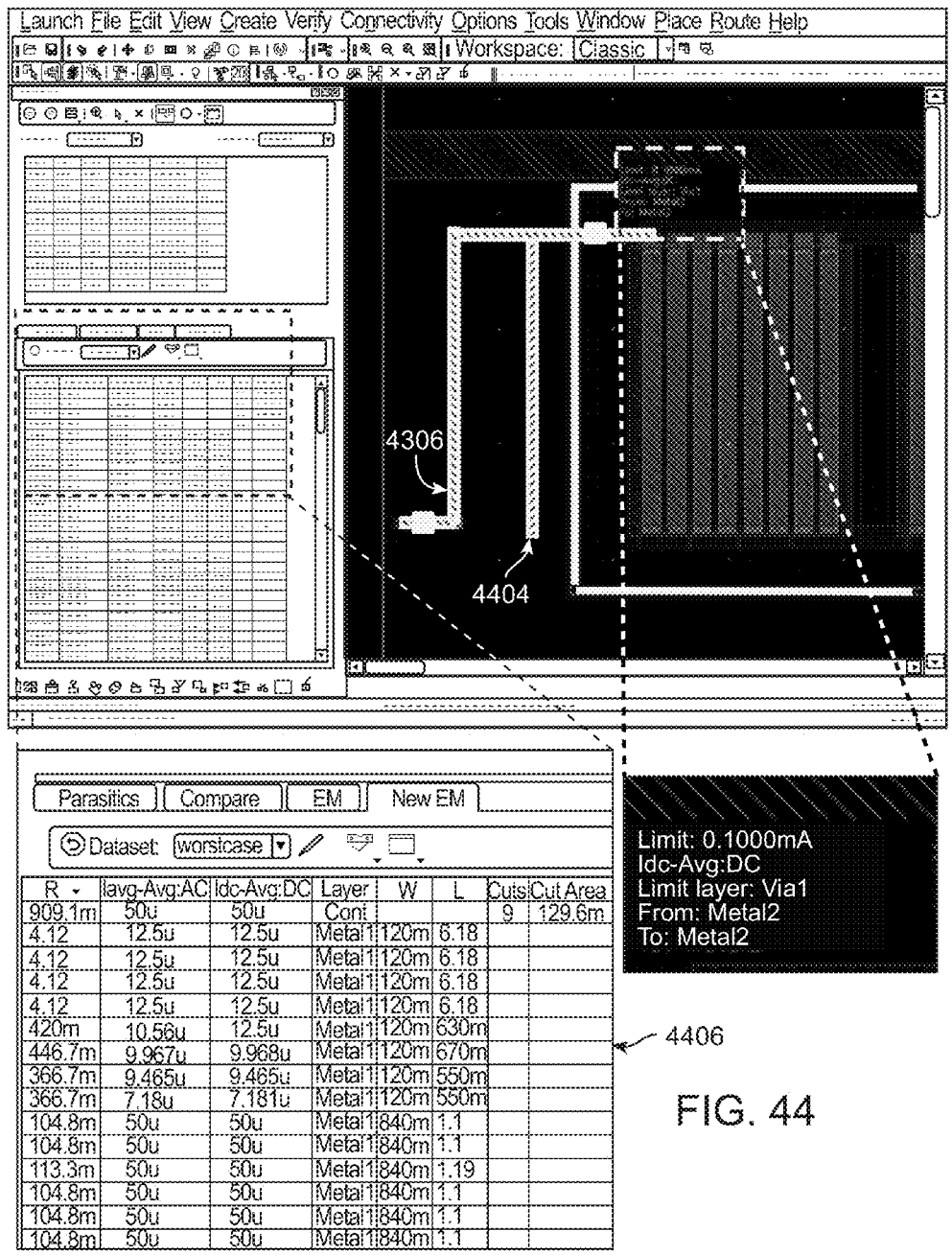
FIG. 44 illustrates the interactive characteristic of the method or the system in response to a modification of the physical design in one or more embodiments.

FIG. 44 illustrates the interactive characteristic of the method or the system in response to a modification of the physical design in one or more embodiments. In the particular example illustrated in FIG. 44, an interconnect segment 4402 is moved to a new location 4404. In response to this modification of the location of the interconnect segment, the method or the system automatically updates the information balloon and the contents of the interactive navigator as shown in 4406 or the contents of the interactive browser to reflect the changes to the net to which the interconnect segment belongs or to the other part of the electronic circuit design in some embodiments.

Figure 45A:
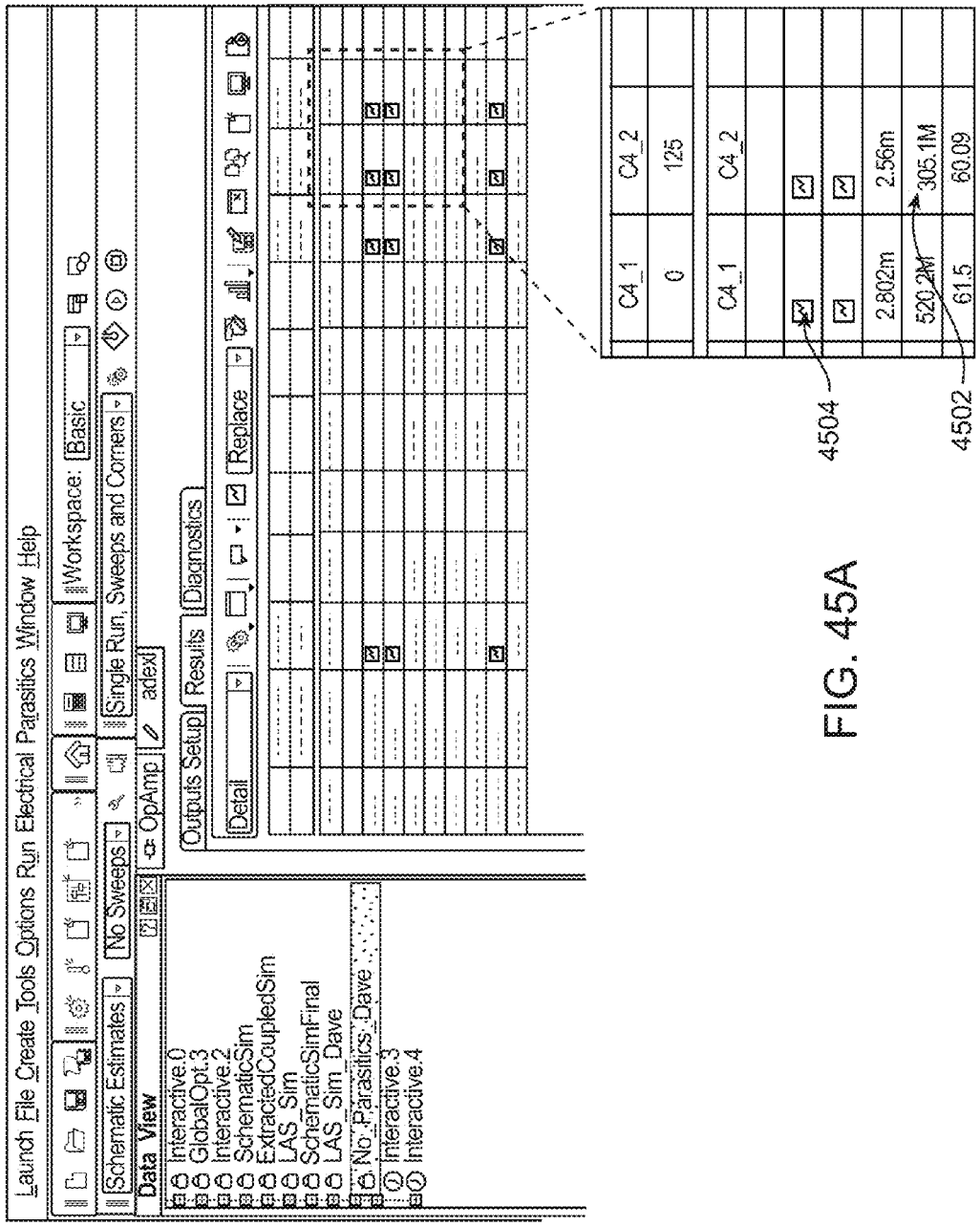
FIG. 45A illustrates an exemplary simulation result of a schematic simulation that is performed on an electronic circuit design with no physical design data or parasitics available in some embodiments.

FIG. 45A illustrates an exemplary simulation result of a schematic simulation that is performed on an electronic circuit design with no physical design data or parasitics available in some embodiments. In the example illustrated in FIG. 45A, the simulated value for the corner case C4_2 is 305.1M (4502) where the specification requires the value to be greater than 300 MHz for AC test. In this example, the corner case C4_2 of the schematic design meets the requirement of the specification. The method or the system may graphically indicates that the corner case C4_2 meets the specification requirements by using, for example, the color coding or highlighting scheme in some embodiments. Symbol 4504 represents an interactive link that brings up a waveform viewer for the particular signal associated with the symbol 4504 when the symbol is clicked upon.

Figure 45B:
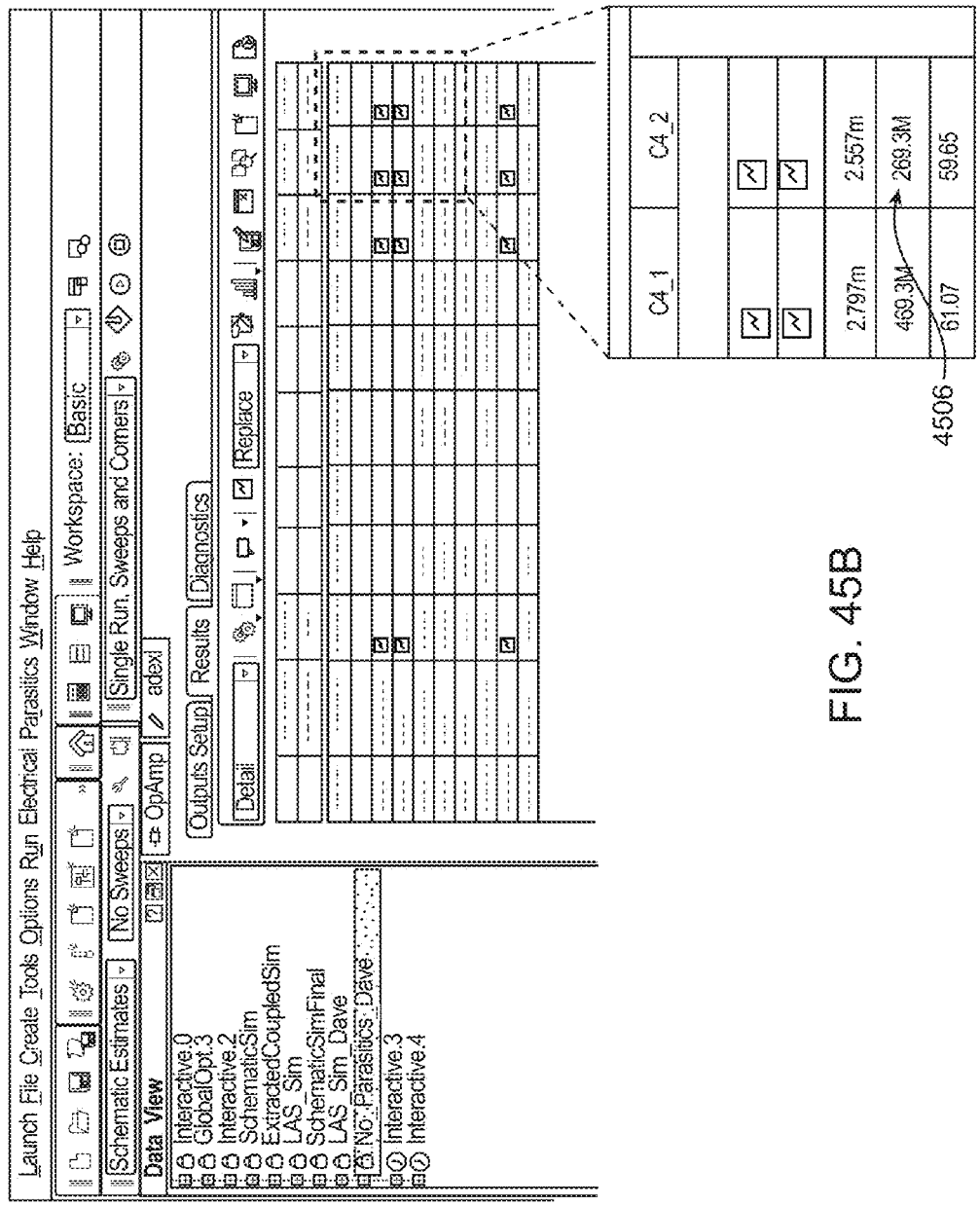
FIG. 45B illustrates a schematic simulation of the same electronic circuit design using some layout parasitics in some embodiments.

FIG. 45B illustrates a schematic simulation of the same electronic circuit design using some layout parasitics in some embodiments. After taking some electrical parasitics into consideration, FIG. 45B shows that the simulated value for the corner case C4_2 becomes 269.3 MHz (4506) where the specification still requires the value to be greater than 300 MHz. In other words, the physical design fails to meet the requirements of the specification after some electrical parasitics are taken into consideration during simulations. In some embodiments, the method or the system determines whether the physical design meets the specification after a net or a shape on a net is modified. In some embodiments, the method or the system determines whether the physical design meets the specification without performing a layout versus schematic (LVS) check or verification. In some embodiments, the physical design may include only a partial layout that does not pass an LVS check or verification. In some embodiments, the method or the system determines whether a physical design meets the intended behavior or characteristics as required by the schematic design without requiring the design to pass the LVS check or verification.

Figure 46A:
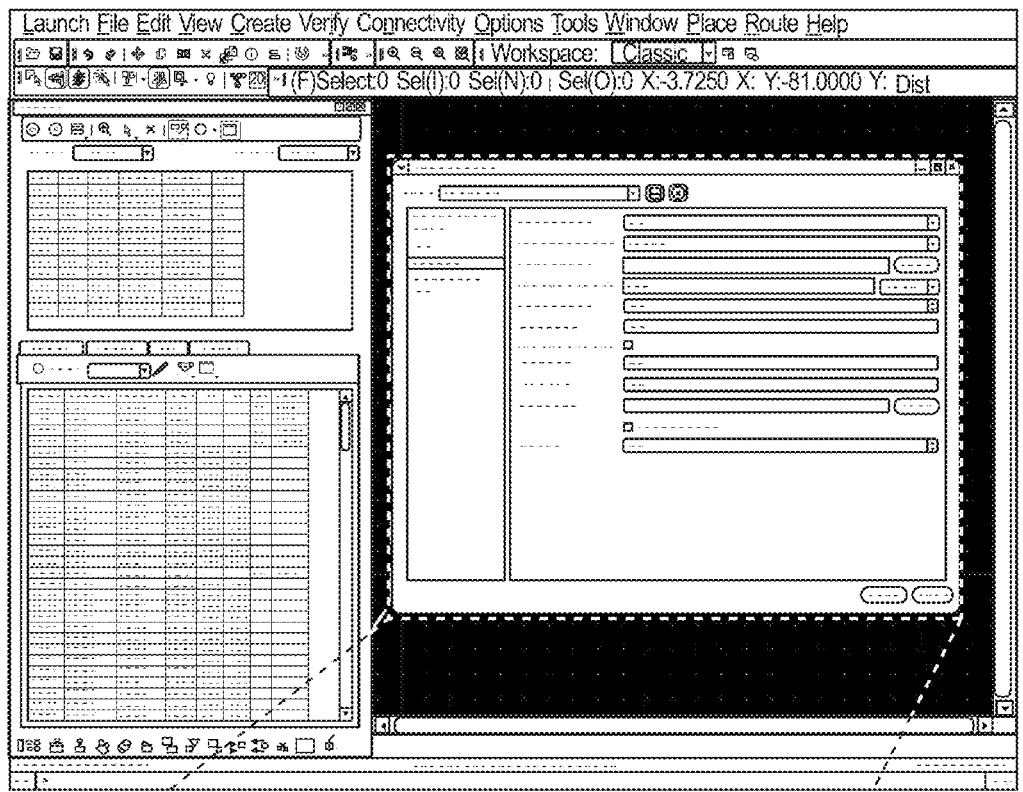
FIGS. 46A-B illustrate an exemplary setup editor for an extractor and various user-definable characteristics in one or more embodiments.
Figure 46B:
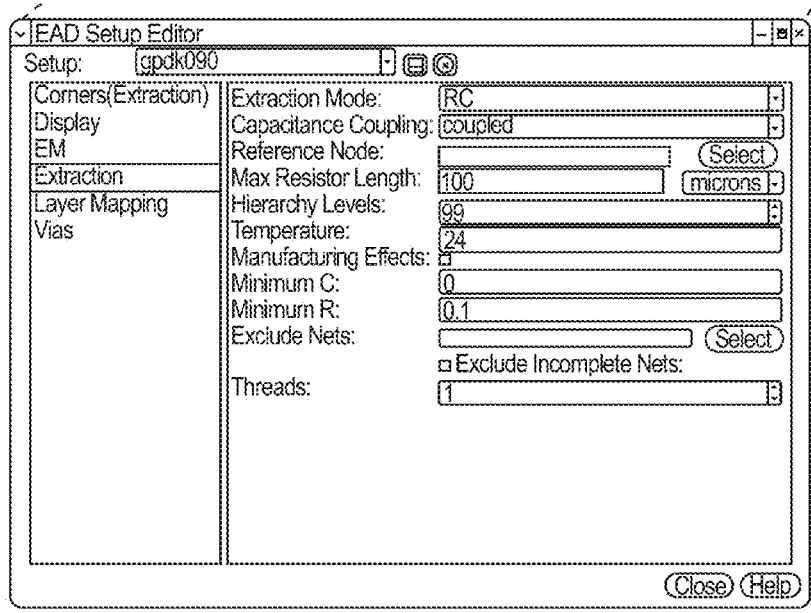

FIGS. 46A-B illustrate an exemplary setup editor for an extractor and various user-definable characteristics in one or more embodiments. In some embodiments, FIG. 46A illustrates a user interface that includes a setup editor in the form of a pop-up window as shown in FIG. 46B. FIG. 46B shows further details about the setup editor in some embodiments. In the exemplary setup editor for an extractor, the user may define the extraction mode (e.g., resistances only, capacitances only, or both resistances and capacitances), what capacitances to extract (e.g., coupling capacitances, decoupled capacitances, or lumped capacitances), the maximum resistor length, the maximum number of hierarchical levels, the operating temperature(s) (which may be used in thermal maps to determine resistances or capacitances and may further by synchronized with simulation temperature(s)), the minimum capacitance and the minimum resistance to filter out small resistance and capacitance values to speed up simulation(s), and which nets are to be excluded in the extraction to improve extraction performance in some embodiments. The setup editor may further provide the choice of the number of threads that the extractor may use for extraction in some embodiments.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for providing customizable information in designing an electronic circuit with electrical awareness, comprising:

using at least one processor that is programmed for performing a process comprising:

displaying a portion of a physical design of an electronic circuit design in a first display portion of an user interface on a display apparatus;

receiving or identifying an operation on a component in the portion of the physical design; and predicting an impact of the operation on the component or on the electronic circuit design to determine and display a response to the operation in the first display portion of the user interface and a first response to the operation in a second display portion of the user interface prior to completion of the operation, wherein the first display portion and the second display portion interact with each other to display different predictions of the operation on the component in the portion of the physical design during a performance of the operation.

2. The computer implemented method of claim 1, the operation comprising:
   identifying, creating, updating, or modifying physical data of a component in the physical design;
   identifying or determining an electrical parasitic associated with the component; and
   characterizing an electrical characteristic of the component using the electrical parasitic to generate a first set of results.

3. The computer implemented method of claim 2, the operation further comprising:
   identifying, creating, updating, or modifying a schematic design associated with the physical design; and
   characterizing a behavioral characteristic of the component using the schematic design to generate a second set of results.

4. The computer implemented method of claim 3, the operation further comprising:
   evaluating or reviewing the physical design based at least in part upon the first set of results and the second set of results.

5. The computer implemented method of claim 4, in which the act of evaluating or reviewing the design comprises:
   determining whether the physical design comply with requirements of a specification of the electronic circuit design without performing or requiring a performance of the LVS check.

6. The computer implemented method of claim 5, in which the act of determining whether the physical design comply with requirements of the specification comprises:
   comparing the first set of results with the second set of results.

7. The computer implemented method of claim 1, in which the physical design comprises a partial physical design that does not pass a layout versus schematic (LVS) check.

8. The computer implemented method of claim 1, the process further comprising:
   identifying a measurement probe that is placed in the physical design, in which the measurement probe determines a characteristic, parasitic, or geometric data of at least a part of the component; and
   performing the measurement probe to determine the characteristic, parasitic, or geometric data of the at least a part of the component.

9. The computer implemented method of claim 8, the act for identifying the measurement probe comprising:
   displaying the characteristic, parasitic, or geometric data of the at least a part of the component in an information balloon in the user interface.

10. The computer implemented method of claim 8, the act for identifying the measurement probe comprising:
    identifying one or more requirements for the measurement probe;
    identifying a first location in the physical design; and
    identifying a second location in the physical design.

11. The computer implemented method of claim 10, the act for identifying the first location or the action for identifying the second location comprising:
    determining the first location or the second location based at least on a cursor location of a cursor in the user interface; and
    identifying one or more components at the cursor location based at least in part upon a number of overlaps at the cursor location in the physical design.

12. The computer implemented method of claim 11, in which the act of determining the first location or the second location based at least on the cursor location is performed while the cursor is hovering at the cursor location in the user interface without requiring identification or selection of the cursor location from human intervention.

13. The computer implemented method of claim 1, further comprising:
    using a pop-up window programmed or configured for performing at least one of:
    responding to a user's operation in a part of the user interface;
    providing customizable or user definable data or information to a user; and
    receiving a user's input.

14. The computer implemented method of claim 1, in which the response is displayed in substantially real-time in the first display portion.

15. The computer implemented method of claim 2, the operation further comprising a manipulation of the physical design, wherein the manipulation comprises updating, editing, modifying, or creating a part of electronic circuit design in a physical domain.

16. The computer implemented method of claim 15, the process further comprising:
    automatically providing or updating a first in situ, customizable result in an interactive navigator of the user interface in response to the manipulation.

17. The computer implemented method of claim 16, the process further comprising:
    automatically providing or updating a second in situ, customizable result in an interactive browser of the user interface in response to the manipulation.

18. The computer implemented method of claim 17, the process further comprising:
    identifying or determining a customizable color coding or highlighting scheme for displaying information or data in at least one of the first display portion, the interactive navigator, and the interactive browser.

19. The computer implemented method of claim 18, the process further comprising:
    automatically updating display of at least one of the first display portion, the interactive navigator, and the interactive browser in response to the manipulation that is made in another one of the first display portion, the interactive navigator, and the interactive browser.

20. The computer implemented method of claim 16, the process further comprising:
    presenting the first in situ, customizable result in a tabulated form in the interactive navigator of the user interface; and
    providing one or more arithmetic, mathematical, or statistical function or one or more sorting operations to operate upon the first in situ, customizable result.

21. The computer implemented method of claim 16, the process further comprising:
    evaluating or comparing the component with a second component in the physical design; and
    presenting a result of the act of evaluating or comparing the component with the second component in the interactive navigator.

22. The computer implemented method of claim 16, the process further comprising:
    analyzing or characterizing at least a part of the physical design to determine whether the at least a part of the physical design satisfies an electro-migration limit; and
    presenting a result of the act of analyzing or characterizing the at least a part of the physical design in the interactive navigator.

23. The computer implemented method of claim 1, the process further comprising:
identifying one or more datasets for the act of characterizing the electrical characteristic of the component.

24. The computer implemented method of claim 1, the process further comprising:
identifying one or more datasets for the act of characterizing the electrical characteristic of the component; and
identifying a first technology file, wherein the first technology comprises one or more parameters for a first process of a first manufacturer.

25. The computer implemented method of claim 24, the process further comprising:
identifying a second technology file, wherein the second technology comprises one or more parameters for a second process of a second manufacturer.

26. The computer implemented method of claim 1, the process further comprising:
identifying or determining a fix to correct a violation in the physical design; and
receiving a determination of whether to apply the fix or automatically applying the fix to correct the violation in the physical design.

27. The computer implemented method of claim 26, wherein the fix comprises a manually identified fix to correct the violation.

28. The computer implemented method of claim 26, wherein the fix comprises a recommended fix to correct the violation.

29. The computer implemented method of claim 17, in which the first in situ, customizable result or the second in situ, customizable result is presented on a net-by-net or layer-by-layer basis.

30. The computer implemented method of claim 17, the process further comprising at least one of:
displaying a symbol or a bounding box for at least a part of the component in the first interactive display portion when a counter-part of the at least a part of the component is identified in the interactive browser or the interactive navigator; and
emphasizing the counter-part of the at least a part of the component in the interactive browser or the interactive navigator when the at least a part of the component is identified in the first interactive display portion.

31. The computer implemented method of claim 2, the process further comprising:
incrementally identifying, creating, updating, or modifying next physical data of a next component in the physical design;
identifying or determining a next electrical parasitic associated with the next component; and
characterizing a next electrical characteristic of the next component using the next electrical parasitic to generate a next set of results on a component by component basis.

32. A system for providing customizable information in designing an electronic circuit with electrical awareness, comprising:
at least one processor that is at least to:
display a portion of a physical design of an electronic circuit design in a first display portion of an user interface on a display apparatus;
receive or identifying an operation on the portion of the physical design; and
predict an impact of the operation on the component or on the electronic circuit design to determine and display a response to the operation in the first display portion of the user interface and a first response to the operation in a second display portion of the user interface prior to completion of the operation, wherein
the first display portion and the second display portion interact with each other to display different predictions of the operation on the component in the portion of the physical design during a performance of the operation.

33. The system of claim 32, the operation comprising:
identifying, creating, updating, or modifying physical data of a component in the physical design;
identifying or determining an electrical parasitic associated with the component;
characterizing an electrical characteristic of the component using the electrical parasitic to generate a first set of results;
identifying, creating, updating, or modifying a schematic design associated with the physical design;
characterizing a behavioral characteristic of the component using the schematic design to generate a second set of results; and
evaluating or reviewing the physical design based at least in part upon the first set of results and the second set of results.

34. The system of claim 32, the at least one processor is further to:
identify a measurement probe that is placed in the physical design, in which the measurement probe is to determine a characteristic, parasitic, or geometric data of at least a part of the component, wherein the at least one processor that is to identify the measurement probe is further to:
display the characteristic, parasitic, or geometric data of the at least a part of the component in an information balloon in the user interface; and
perform the measurement probe to determine the characteristic, parasitic, or geometric data of the at least a part of the component.

35. The system of claim 34, in which the at least one processor that is to identify the measurement probe is further to:
identify one or more requirements for the measurement probe;
identify a first location in the physical design; and
identify a second location in the physical design, wherein the at least one processor that is to identify the first location or to identify the second location is further to:
determine the first location or the second location based at least on a cursor location of a cursor in the user interface; and
identify one or more components at the cursor location based at least in part upon a number of overlaps at the cursor location in the physical design.

36. The system of claim 33, the operation further comprising a manipulation of the physical design, wherein the manipulation comprises updating, editing, modifying, or creating a part of electronic circuit design in a physical domain.

37. The system of claim 35, the at least one processor is further to:
automatically provide or update a first in situ, customizable result in an interactive navigator of the user interface in response to the manipulation;
automatically provide or update a second in situ, customizable result in an interactive browser of the user interface in response to the manipulation; and
identify or determine a customizable color coding or highlighting scheme for displaying information or data in at least one of the first display portion, the interactive navigator, and the interactive browser.

38. An article of manufacture comprising a non-transitory computer readable storage medium having stored thereupon a sequence of instructions which, when executed by at least one processor, causes the at least one processor to perform a process for providing customizable information in designing an electronic circuit with electrical awareness, the process comprising:

using the at least one processor that is programmed for performing the process that comprises:

displaying a portion of a physical design in a first display portion of an user interface on a display apparatus;

receiving a manipulation of the portion of the physical design; and predicting an impact of the operation on the component or on the electronic circuit design to determine and display a response to the manipulation in the first display portion of the user interface and a first response to the operation in a second display portion of the user interface prior to completion of the operation, wherein the first display portion and the second display portion interact with each other to display different predictions of the operation on the component in the portion of the physical design during a performance of the operation.

39. The article of manufacture of claim 38, the operation comprising:

identifying, creating, updating, or modifying physical data of a component in the physical design;

identifying or determining an electrical parasitic associated with the component;

characterizing an electrical characteristic of the component using the electrical parasitic to generate a first set of results;

identifying, creating, updating, or modifying a schematic design associated with the physical design;

characterizing a behavioral characteristic of the component using the schematic design to generate a second set of results; and evaluating or reviewing the physical design based at least in part upon the first set of results and the second set of results.

40. The article of manufacture of claim 38, the process further comprising:

identifying a measurement probe that is placed in the physical design, in which the measurement probe determines a characteristic, parasitic, or geometric data of at least a part of the component, wherein the act of identifying the measurement probe comprises:

displaying the characteristic, parasitic, or geometric data of the at least a part of the component in an information balloon in the user interface; and performing the measurement probe to determine the characteristic, parasitic, or geometric data of the at least a part of the component.

41. The article of manufacture of claim 40, the act of identifying the measurement probe further comprising:

identifying one or more requirements for the measurement probe;

identifying a first location in the physical design; and identifying a second location in the physical design, wherein the act for identifying the first location or the action for identifying the second location comprises:

determining the first location or the second location based at least on a cursor location of a cursor in the user interface; and identifying one or more components at the cursor location based at least in part upon a number of overlaps at the cursor location in the physical design.

42. The system of claim 39, the operation further comprising a manipulation of the physical design, wherein the manipulation comprises updating, editing, modifying, or creating a part of electronic circuit design in a physical domain.

43. The article of manufacture of claim 42, the process further comprising:

automatically providing or updating a first in situ, customizable result in an interactive navigator of the user interface in response to the manipulation;

automatically providing or updating a second in situ, customizable result in an interactive browser of the user interface in response to the manipulation; and identifying or determining a customizable color coding or highlighting scheme for displaying information or data in at least one of the first display portion, the interactive navigator, and the interactive browser.

* * * * *